(12) United States Patent
Bowman et al.

(10) Patent No.: US 11,532,457 B2
(45) Date of Patent: Dec. 20, 2022

(54) PRECISE PLASMA CONTROL SYSTEM

(71) Applicant: Eagle Harbor Technologies, Inc., Seattle, WA (US)

(72) Inventors: Christopher Bowman, Seattle, WA (US); Timothy Ziemba, Bainbridge Island, WA (US); Kenneth Miller, Seattle, WA (US); Kevin Muggli, Seattle, WA (US); Eric Hanson, Seattle, WA (US); James Prager, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 87 days.

(21) Appl. No.: 17/234,773

(22) Filed: Apr. 19, 2021

(65) Prior Publication Data
US 2021/0249227 A1    Aug. 12, 2021

Related U.S. Application Data

(63) Continuation-in-part of application No. 16/937,948, filed on Jul. 24, 2020, now Pat. No. 11,430,635.
(Continued)

(51) Int. Cl.
  *H01J 37/32*  (2006.01)
  *H02M 3/33*  (2006.01)
  (Continued)

(52) U.S. Cl.
  CPC ........ *H01J 37/32174* (2013.01); *H01F 19/08* (2013.01); *H01J 37/241* (2013.01);
  (Continued)

(58) Field of Classification Search
  CPC .......... H01J 37/32174; H01J 37/32146; H01J 37/32697; H01F 19/08; H01F 38/00; H02M 3/33592; H02M 3/01; H02M 3/33573
  See application file for complete search history.

(56) References Cited

U.S. PATENT DOCUMENTS 3,339,108 A  8/1967 Holtje
4,070,589 A  1/1978 Martinkovic
(Continued)

FOREIGN PATENT DOCUMENTS

CA  2292526 A1  5/1999
EP  174164 A2  3/1986
(Continued)

OTHER PUBLICATIONS

International Search Report and Written Opinion as issued in connection with International Patent Application No. PCT/US2020/040579, dated Sep. 30, 2020, 10 pages.
(Continued)

*Primary Examiner* — Vibol Tan

(57) ABSTRACT

Some embodiments include a pulsing power supply comprising a power supply and a transformer comprising: a transformer core; a primary winding wrapped around a portion of the transformer core, the primary winding having a first lead and a second lead; and a secondary winding wrapped around a portion of the transformer core. The pulsing power supply may also include a first switch electrically connected with the first lead of the primary winding and the power supply; and a second switch electrically connected with the second lead of the primary winding and the power supply, wherein the first switch and the second switch are opened and closed at different time intervals. The pulsing power supply may also include a pulsing output electrically coupled with the secondary winding of the
(Continued)

transformer that outputs pulses having a voltage greater than about 2 kV and with pulse frequencies greater than 1 kHz.

23 Claims, 42 Drawing Sheets

Related U.S. Application Data which is a continuation-in-part of application No. 16/779,270, filed on Jan. 31, 2020, now Pat. No. 10,903,047, which is a continuation-in-part of application No. 16/697,173, filed on Nov. 26, 2019, now Pat. No. 11,004,660, and a continuation-in-part of application No. 16/525,357, filed on Jul. 29, 2019, now Pat. No. 10,659,019, which is a continuation-in-part of application No. 16/523,840, filed on Jul. 26, 2019, now Pat. No. 10,892,140, application No. 17/234,773, which is a continuation-in-part of application No. PCT/US2020/016253, filed on Jan. 31, 2020.

(60) Provisional application No. 62/799,738, filed on Jan. 31, 2019, provisional application No. 62/869,999, filed on Jul. 2, 2019, provisional application No. 62/774,078, filed on Nov. 30, 2018, provisional application No. 62/789,523, filed on Jan. 8, 2019, provisional application No. 62/789,526, filed on Jan. 8, 2019, provisional application No. 62/717,523, filed on Aug. 10, 2018, provisional application No. 62/711,457, filed on Jul. 27, 2018, provisional application No. 62/711,468, filed on Jul. 27, 2018, provisional application No. 62/711,406, filed on Jul. 27, 2018, provisional application No. 62/711,347, filed on Jul. 27, 2018, provisional application No. 62/711,334, filed on Jul. 27, 2018, provisional application No. 62/711,464, filed on Jul. 27, 2018, provisional application No. 62/711,467, filed on Jul. 27, 2018.

(51) Int. Cl.
*H01F 19/08* (2006.01)
*H02M 3/335* (2006.01)
*H01J 37/24* (2006.01)
*H02M 3/338* (2006.01)

(52) U.S. Cl.
CPC ....... *H01J 37/32348* (2013.01); *H02M 3/338* (2013.01); *H02M 3/33592* (2013.01)

(56) References Cited

U.S. PATENT DOCUMENTS

| | | |
|---|---|---|
| 4,076,996 A | 2/1978 | Maehara et al. |
| 4,438,331 A | 3/1984 | Davis |
| 4,504,895 A | 3/1985 | Steigerwald |
| 4,692,851 A | 9/1987 | Attwood |
| 4,885,074 A | 12/1989 | Susko et al. |
| 4,924,191 A | 5/1990 | Erb et al. |
| 4,992,919 A | 2/1991 | Lee et al. |
| 5,140,510 A | 8/1992 | Myers |
| 5,313,481 A | 5/1994 | Cook et al. |
| 5,321,597 A | 6/1994 | Macoque |
| 5,325,021 A | 6/1994 | Duckworth et al. |
| 5,392,043 A | 2/1995 | Ribner |
| 5,451,846 A | 9/1995 | Peterson et al. |
| 5,488,552 A | 1/1996 | Sakamoto et al. |
| 5,610,452 A | 3/1997 | Shimer et al. |
| 5,623,171 A | 4/1997 | Nakajima |
| 5,656,123 A | 8/1997 | Salimian et al. |
| 5,729,562 A | 3/1998 | Birx et al. |
| 5,796,598 A | 8/1998 | Nowak et al. |
| 5,808,504 A | 9/1998 | Chikai et al. |
| 5,905,646 A | 5/1999 | Crewson et al. |
| 5,930,125 A | 7/1999 | Hitchcock et al. |
| 5,933,335 A | 8/1999 | Hitchcock et al. |
| 5,968,377 A | 10/1999 | Yuasa et al. |
| 6,059,935 A | 5/2000 | Spence |
| 6,066,901 A | 5/2000 | Burkhart et al. |
| 6,087,871 A | 7/2000 | Kardo-Syssoev et al. |
| 6,205,074 B1 | 3/2001 | Van Buskirk et al. |
| 6,222,321 B1 | 4/2001 | Scholl et al. |
| 6,238,387 B1 | 5/2001 | Miller, III |
| 6,239,403 B1 | 5/2001 | Dible et al. |
| 6,253,704 B1 | 7/2001 | Savas |
| 6,300,720 B1 | 10/2001 | Birx |
| 6,359,542 B1 | 3/2002 | Widmayer et al. |
| 6,362,604 B1 | 3/2002 | Cravey |
| 6,392,187 B1 | 5/2002 | Johnson |
| 6,483,731 B1 | 11/2002 | Isurin et al. |
| 6,496,047 B1 | 12/2002 | Iskander et al. |
| 6,518,195 B1 | 2/2003 | Collins et al. |
| 6,577,135 B1 | 6/2003 | Matthews et al. |
| 6,741,120 B1 | 5/2004 | Tan |
| 6,741,484 B2 | 5/2004 | Crewson et al. |
| 6,831,377 B2 | 12/2004 | Yampolsky et al. |
| 6,897,574 B2 | 5/2005 | Vaysse |
| 6,947,300 B2 | 9/2005 | Pai et al. |
| 7,061,230 B2 | 6/2006 | Kleine et al. |
| 7,180,082 B1 | 2/2007 | Hassanein et al. |
| 7,256,637 B2 | 8/2007 | Iskander et al. |
| 7,291,545 B2 | 11/2007 | Collins et al. |
| 7,307,375 B2 | 12/2007 | Smith et al. |
| 7,319,579 B2 | 1/2008 | Inoue et al. |
| 7,354,501 B2 | 4/2008 | Gondhalekar et al. |
| 7,393,765 B2 | 7/2008 | Hanawa et al. |
| 7,396,746 B2 | 7/2008 | Walther et al. |
| 7,492,138 B2 | 2/2009 | Zhang et al. |
| 7,512,433 B2 | 3/2009 | Bernhart et al. |
| 7,521,370 B2 | 4/2009 | Hoffman |
| 7,549,461 B2 | 6/2009 | Kroliczek et al. |
| 7,601,619 B2 | 10/2009 | Okumura et al. |
| 7,605,385 B2 | 10/2009 | Bauer |
| 7,615,931 B2 | 11/2009 | Hooke et al. |
| 7,767,433 B2 | 8/2010 | Kuthi et al. |
| 7,901,930 B2 | 3/2011 | Kuthi et al. |
| 7,936,544 B2 | 5/2011 | Beland |
| 7,943,006 B2 | 5/2011 | Hoffman |
| 7,948,185 B2 | 5/2011 | Smith et al. |
| 8,093,797 B2 | 1/2012 | Tyldesley |
| 8,093,979 B2 | 1/2012 | Wilson |
| 8,115,343 B2 | 2/2012 | Sanders et al. |
| 8,120,207 B2 | 2/2012 | Sanders et al. |
| 8,129,653 B2 | 3/2012 | Kirchmeier et al. |
| 8,143,790 B2 | 3/2012 | Smith et al. |
| 8,222,936 B2 | 7/2012 | Friedman et al. |
| 8,259,476 B2 | 9/2012 | Ben-Yaakov et al. |
| 8,436,602 B2 | 5/2013 | Sykes |
| 8,450,985 B2 | 5/2013 | Gray et al. |
| 8,471,642 B2 | 6/2013 | Hill |
| 8,575,843 B2 | 11/2013 | Moore et al. |
| 8,723,591 B2 | 5/2014 | Lee et al. |
| 8,773,184 B1 | 7/2014 | Petrov et al. |
| 8,847,433 B2 | 9/2014 | Vandermey |
| 8,963,377 B2 | 2/2015 | Ziemba et al. |
| 9,067,788 B1 | 6/2015 | Spielman et al. |
| 9,070,396 B1 | 6/2015 | Katchmart et al. |
| 9,122,350 B2 | 9/2015 | Kao et al. |
| 9,122,360 B2 | 9/2015 | Xu et al. |
| 9,287,086 B2 | 3/2016 | Brouk et al. |
| 9,287,092 B2 | 3/2016 | Brouk et al. |
| 9,306,533 B1 | 4/2016 | Mavretic |
| 9,329,256 B2 | 5/2016 | Dolce |
| 9,417,739 B2 | 8/2016 | Cordeiro et al. |
| 9,435,029 B2 | 9/2016 | Brouk et al. |
| 9,493,765 B2 | 11/2016 | Krishnaswamy et al. |
| 9,515,633 B1 * | 12/2016 | Long .................. H03H 7/48 |
| 9,601,283 B2 | 3/2017 | Ziemba et al. |
| 9,655,221 B2 | 5/2017 | Ziemba et al. |

(56) References Cited

U.S. PATENT DOCUMENTS

| | | | |
|---|---|---|---|
| 9,706,630 B2 | 7/2017 | Miller et al. |
| 9,729,122 B2 | 8/2017 | Mavretic |
| 9,767,988 B2 | 9/2017 | Brouk et al. |
| 9,881,772 B2 | 1/2018 | Marakhatanov et al. |
| 9,960,763 B2 | 5/2018 | Miller et al. |
| 9,966,231 B2 | 5/2018 | Boswell et al. |
| 10,009,024 B2 | 6/2018 | Gan et al. |
| 10,020,800 B2 | 7/2018 | Prager et al. |
| 10,027,314 B2 | 7/2018 | Prager et al. |
| 10,217,608 B2 | 2/2019 | Mavretic |
| 10,224,822 B2 | 3/2019 | Miller et al. |
| 10,301,587 B2 | 5/2019 | Krishnaswamy et al. |
| 10,304,661 B2 | 5/2019 | Ziemba et al. |
| 10,373,755 B2 | 8/2019 | Prager et al. |
| 10,373,804 B2 | 8/2019 | Koh et al. |
| 10,382,022 B2 | 8/2019 | Prager et al. |
| 10,448,494 B1 * | 10/2019 | Dorf ............... C23C 14/54 |
| 10,460,910 B2 | 10/2019 | Ziemba et al. |
| 10,460,911 B2 | 10/2019 | Ziemba et al. |
| 10,483,089 B2 | 11/2019 | Ziemba et al. |
| 10,483,090 B2 | 11/2019 | Bhutta et al. |
| 10,510,575 B2 | 12/2019 | Kraus et al. |
| 10,555,412 B2 | 2/2020 | Dorf et al. |
| 10,607,814 B2 | 3/2020 | Ziemba et al. |
| 10,631,395 B2 | 4/2020 | Sanders et al. |
| 10,659,019 B2 | 5/2020 | Slobodov et al. |
| 10,777,388 B2 | 9/2020 | Ziemba et al. |
| 10,796,887 B2 | 10/2020 | Prager et al. |
| 10,876,241 B2 | 12/2020 | Hu et al. |
| 10,892,140 B2 | 1/2021 | Ziemba et al. |
| 10,896,809 B2 | 1/2021 | Ziemba et al. |
| 10,903,047 B2 | 1/2021 | Ziemba et al. |
| 2001/0008552 A1 | 7/2001 | Harada et al. |
| 2001/0023822 A1 | 9/2001 | Koizumi et al. |
| 2002/0186577 A1 | 12/2002 | Kirbie |
| 2003/0021125 A1 | 1/2003 | Rufer et al. |
| 2003/0054647 A1 | 3/2003 | Suemasa et al. |
| 2003/0071035 A1 | 4/2003 | Brailove |
| 2003/0137791 A1 | 7/2003 | Arnet et al. |
| 2003/0169107 A1 | 9/2003 | LeChevalier |
| 2004/0085784 A1 | 5/2004 | Salama et al. |
| 2004/0149217 A1 | 8/2004 | Collins et al. |
| 2004/0263412 A1 | 12/2004 | Pribyl |
| 2005/0152159 A1 | 7/2005 | Isurin et al. |
| 2005/0270096 A1 | 12/2005 | Coleman |
| 2006/0048894 A1 | 3/2006 | Yamazaki et al. |
| 2006/0192774 A1 | 8/2006 | Yasumura |
| 2006/0210020 A1 | 9/2006 | Takahashi et al. |
| 2006/0274887 A1 | 12/2006 | Sakamoto et al. |
| 2007/0018504 A1 | 1/2007 | Wiener et al. |
| 2007/0114981 A1 | 5/2007 | Vasquez et al. |
| 2007/0115705 A1 | 5/2007 | Gotzenberger et al. |
| 2007/0212811 A1 | 9/2007 | Hanawa et al. |
| 2007/0235412 A1 | 10/2007 | Fischer |
| 2008/0062733 A1 | 3/2008 | Gay |
| 2008/0106151 A1 | 5/2008 | Ryoo et al. |
| 2008/0143260 A1 | 6/2008 | Tuymer et al. |
| 2008/0198634 A1 | 8/2008 | Scheel et al. |
| 2008/0231337 A1 | 9/2008 | Krishnaswamy et al. |
| 2008/0252225 A1 | 10/2008 | Kurachi et al. |
| 2008/0272706 A1 | 11/2008 | Kwon et al. |
| 2009/0016549 A1 | 1/2009 | French et al. |
| 2009/0255800 A1 | 10/2009 | Koshimizu |
| 2009/0298287 A1 | 12/2009 | Shannon et al. |
| 2010/0007358 A1 | 1/2010 | Schaerrer et al. |
| 2010/0148847 A1 | 6/2010 | Schurack et al. |
| 2010/0284208 A1 | 11/2010 | Nguyen et al. |
| 2011/0001438 A1 | 1/2011 | Chemel et al. |
| 2011/0140607 A1 | 6/2011 | Moore et al. |
| 2011/0309748 A1 | 12/2011 | Xia |
| 2012/0016282 A1 | 1/2012 | Van Brunt et al. |
| 2012/0081350 A1 | 4/2012 | Sano et al. |
| 2012/0155613 A1 | 6/2012 | Caiafa et al. |
| 2013/0024784 A1 | 1/2013 | Litton |
| 2013/0027848 A1 | 1/2013 | Said |
| 2013/0059448 A1 | 3/2013 | Marakhtanov et al. |
| 2013/0075390 A1 | 3/2013 | Ashida |
| 2013/0092529 A1 | 4/2013 | Singh et al. |
| 2013/0113650 A1 | 5/2013 | Behbahani et al. |
| 2013/0174105 A1 | 7/2013 | Nishio et al. |
| 2013/0175575 A1 | 7/2013 | Ziemba et al. |
| 2014/0009969 A1 | 1/2014 | Yuzurihara et al. |
| 2014/0021180 A1 | 1/2014 | Vogel |
| 2014/0077611 A1 | 3/2014 | Young et al. |
| 2014/0109886 A1 | 4/2014 | Singleton et al. |
| 2014/0118414 A1 | 5/2014 | Seo et al. |
| 2014/0146571 A1 | 5/2014 | Ryoo et al. |
| 2014/0268968 A1 | 9/2014 | Richardson |
| 2014/0354343 A1 | 12/2014 | Ziemba et al. |
| 2015/0028932 A1 | 1/2015 | Ziemba et al. |
| 2015/0076372 A1 | 3/2015 | Ziemba et al. |
| 2015/0084509 A1 | 3/2015 | Yuzurihara et al. |
| 2015/0130525 A1 | 5/2015 | Miller et al. |
| 2015/0206716 A1 | 7/2015 | Kim et al. |
| 2015/0256086 A1 | 9/2015 | Miller et al. |
| 2015/0303914 A1 | 10/2015 | Ziemba et al. |
| 2015/0311680 A1 | 10/2015 | Burrows et al. |
| 2015/0318846 A1 | 11/2015 | Prager et al. |
| 2016/0020070 A1 | 1/2016 | Kim et al. |
| 2016/0020072 A1 | 1/2016 | Brouk et al. |
| 2016/0020672 A1 | 1/2016 | Shuck et al. |
| 2016/0182001 A1 | 6/2016 | Zeng et al. |
| 2016/0241234 A1 | 8/2016 | Mavretic |
| 2016/0327029 A1 | 11/2016 | Ziemba et al. |
| 2016/0327089 A1 | 11/2016 | Adam et al. |
| 2016/0358755 A1 | 12/2016 | Long et al. |
| 2017/0104469 A1 | 4/2017 | Mavretic |
| 2017/0154726 A1 | 6/2017 | Prager et al. |
| 2017/0243731 A1 | 8/2017 | Ziemba et al. |
| 2017/0294842 A1 | 10/2017 | Miller et al. |
| 2017/0311431 A1 | 10/2017 | Park |
| 2017/0330729 A1 | 11/2017 | Mavretic |
| 2017/0359886 A1 | 12/2017 | Binderbauer et al. |
| 2017/0366173 A1 | 12/2017 | Miller et al. |
| 2018/0041183 A1 | 2/2018 | Mavretic et al. |
| 2018/0226896 A1 | 8/2018 | Miller et al. |
| 2018/0286636 A1 | 10/2018 | Ziemba et al. |
| 2018/0315583 A1 | 11/2018 | Luere et al. |
| 2018/0374689 A1 | 12/2018 | Abraham et al. |
| 2019/0074806 A1 | 3/2019 | Scott et al. |
| 2019/0080884 A1 | 3/2019 | Ziemba et al. |
| 2019/0131110 A1 | 5/2019 | Ziemba et al. |
| 2019/0157044 A1 | 5/2019 | Ziemba et al. |
| 2019/0157980 A1 | 5/2019 | Ji et al. |
| 2019/0172683 A1 | 6/2019 | Mavretic et al. |
| 2019/0172685 A1 | 6/2019 | Van Zyl et al. |
| 2019/0180982 A1 | 6/2019 | Brouk et al. |
| 2019/0228952 A1 | 7/2019 | Dorf et al. |
| 2019/0236426 A1 | 8/2019 | Zhang et al. |
| 2019/0295821 A1 | 9/2019 | Shoeb et al. |
| 2019/0326092 A1 | 10/2019 | Ogasawara et al. |
| 2019/0348258 A1 | 11/2019 | Koh et al. |
| 2019/0350072 A1 | 11/2019 | Dorf et al. |
| 2019/0393791 A1 | 12/2019 | Ziemba et al. |
| 2020/0035457 A1 | 1/2020 | Ziemba et al. |
| 2020/0035458 A1 | 1/2020 | Ziemba et al. |
| 2020/0037468 A1 | 1/2020 | Ziemba et al. |
| 2020/0043702 A1 | 2/2020 | Ziemba et al. |
| 2020/0051786 A1 | 2/2020 | Ziemba et al. |
| 2020/0144030 A1 | 5/2020 | Prager et al. |
| 2020/0168437 A1 | 5/2020 | Ziemba et al. |
| 2020/0176221 A1 | 6/2020 | Prager et al. |
| 2022/0020566 A1 * | 1/2022 | Slobodov .......... H01J 37/32174 |

FOREIGN PATENT DOCUMENTS

| | | |
|---|---|---|
| EP | 0947048 A1 | 10/1999 |
| EP | 1128557 A2 | 8/2001 |
| EP | 1515430 A1 | 3/2005 |
| FR | 2771563 A1 | 5/1999 |
| JP | 2000268996 A | 9/2000 |
| JP | 2009263778 A | 11/2009 |
| TW | 200739723 A | 10/2007 |
| TW | 201515525 A | 4/2015 |

(56) References Cited

FOREIGN PATENT DOCUMENTS

| WO | 9738479 | A1 | 10/1997 |
| WO | 0193419 | A1 | 12/2001 |
| WO | 2017126662 | A1 | 7/2017 |
| WO | 2018186901 | A1 | 10/2018 |

OTHER PUBLICATIONS

U.S. Notice of Allowance in U.S. Appl. No. 16/523,840, dated Sep. 30, 2020, 11 pages.
U.S. Notice of Allowance in U.S. Appl. No. 16/779,270, dated Oct. 8, 2020, 5 pages.
International Search Report and Written Opinion as issued in connection with International Patent Application No. PCT/US2020/034427, dated Oct. 16, 2020, 9 pages.
U.S. Final Office Action in U.S. Appl. No. 16/537,513, dated Jan. 7, 2021, 12 pages.
International Search Report and written opinion received for PCT Patent Application No. PCT/US2020/60799, dated Feb. 5, 2021, 11 pages.
U.S. Notice of Allowance in U.S. Appl. No. 16/697,173, dated Feb. 9, 2021, 13 pages.
U.S. Advisory Action in U.S. Appl. No. 16/537,513, dated Apr. 22, 2021, 5 pages.
International Search Report and Written Opinion as issued in connection with International Patent Application No. PCT/US2020/066990, dated May 5, 2021, 9 pages.
Non-Final Office Action in U.S. Appl. No. 17/133,612 dated Feb. 1, 2022, 7 pages.
U.S. Non-Final Office Action in U.S. Appl. No. 14/542,487 dated Nov. 23, 2015, 11 pages.
U.S. Non-Final Office Action in U.S. Appl. No. 14/798,154 dated Jan. 5, 2016, 13 pages.
U.S. Final Office Action in U.S. Appl. No. 14/542,487 dated Feb. 12, 2016, 11 pages.
U.S. Non-Final Office Action in U.S. Appl. No. 14/542,487 dated Apr. 8, 2016, 12 pages.
U.S. Final Office Action in U.S. Appl. No. 14/798,154 dated Oct. 6, 2016, 14 pages.
U.S. Final Office Action in U.S. Appl. No. 14/542,487 dated Dec. 12, 2016, 13 pages.
U.S. Non-Final Office Action in U.S. Appl. No. 14/798,154 dated May 26, 2017, 16 pages.
U.S. Non-Final Office Action in U.S. Appl. No. 14/542,487 dated Jun. 5, 2017, 12 pages.
Partial Supplementary European Search Report in related foreign application No. 14861818.4, 12 Pages.
U.S. Final Office Action in U.S. Appl. No. 14/542,487 dated Dec. 19, 2017, 7 pages.
U.S. Final Office Action in U.S. Appl. No. 14/798,154 dated Dec. 28, 2017, 6 pages.
U.S. Notice of Allowance in U.S. Appl. No. 14/542,487 dated Mar. 21, 2018, 5 pages.
U.S. Notice of Allowance in U.S. Appl. No. 14/798,154 dated Jun. 1, 2018, 5 pages.
U.S. Non-Final Office Action in U.S. Appl. No. 15/921,650 dated Nov. 28, 2018, 11 pages.
U.S. Notice of Allowance in U.S. Appl. No. 15/921,650 dated Apr. 4, 2019, 7 pages.
U.S. Non Final Office Action in U.S. Appl. No. 16/178,565, dated Apr. 4, 2019, 10 pages.
U.S. Final Office Action in U.S. Appl. No. 16/178,565, dated Jul. 12, 2019, 11 pages.
U.S. Notice of Allowance in U.S. Appl. No. 16/178,565, dated Nov. 14, 2019, 5 pages.
U.S. Notice of Allowance in U.S. Appl. No. 16/525,357, dated Jan. 14, 2020, 8 pages.
U.S. Non-Final Office Action in U.S. Appl. No. 16/523,840, dated Mar. 19, 2020, 6 pages.
International Search Report and Written Opinion as issued in connection with International Patent Application No. PCT/US2019/013988, dated Apr. 9, 2020, 4 pages.
U.S. Notice of Allowance in U.S. Appl. No. 16/250,157 dated Apr. 13, 2020, 8 pages.
U.S. Non-Final Office Action in U.S. Appl. No. 16/524,950, dated Apr. 16, 2020, 8 pages.
U.S. Restriction Requirement in U.S. Appl. No. 16/524,967, dated Apr. 29, 2020, 6 pages.
U.S. Non-Final Office Action in U.S. Appl. No. 16/722,115, dated May 14, 2020, 6 pages.
U.S. Final Office Action in U.S. Appl. No. 16/523,840, dated Jun. 26, 2020, 5 pages.
U.S. Notice of Allowance in U.S. Appl. No. 16/524,967, dated Jul. 17, 2020, 11 pages.
U.S. Notice of Allowance in U.S. Appl. No. 16/524,950, dated Oct. 19, 2020, 9 pages.
U.S. Notice of Allowance in U.S. Appl. No. 16/524,950, dated Nov. 16, 2020, 9 pages.
U.S. Final Office Action in U.S. Appl. No. 16/722,115, dated Dec. 2, 2020, 7 pages.
U.S. Notice of Allowance in U.S. Appl. No. 16/523,840, dated Dec. 4, 2020, 11 pages.
U.S. Notice of Allowance in U.S. Appl. No. 16/524,926, dated Jan. 15, 2021, 9 pages.
U.S. Notice of Allowance in U.S. Appl. No. 16/848,830, dated Feb. 19, 2021, 8 pages.
U.S. Notice of Allowance in U.S. Appl. No. 16/722,115, dated Apr. 1, 2021, 9 pages.
U.S. Notice of Allowance in U.S. Appl. No. 16/721,396, dated Apr. 23, 2021,10 pages.
U.S. Non-Final Office Action in U.S. Appl. No. 16/722,115, dated May 3, 2021, 9 pages.
U.S. Notice of Allowance in U.S. Appl. No. 16/848,830, dated May 13, 2021, 6 pages.
Bland, M.J., et al., "A High Power RF Power Supply for High Energy Physics Applications," Proceedings of 2005 the Particle Accelerator Conference, IEEE pp. 4018-4020 (May 16-20, 2005).
Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).
Garwin, R., "Pulsed Power Peer Review Committee Report," Sandia National Laboratories Report, SAND2000-2515, pp. 3-38 (Oct. 2000).
Gaudet, J.A., et al., "Research issues in Developing Compact Pulsed Power for High Peak Power Applications on Mobile Platforms," Proceedings of the IEEE, vol. 92, No. 7, pp. 1144-1165 (Jul. 2004).
In, Y., et al., "On the roles of direct feedback and error field correction in stabilizing resistive-wall modes," Nuclear 2 Fusion, vol. 50, No. 4, pp. 1-5 (2010).
Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).
Locher, R., "Introduction to Power MOSFETs and their Applications (Application Note 558)," Fairchild Semiconductor, 15 pages (Oct. 1998).
Locher, R.E., and Pathak, A.D., "Use of BiMOSFETs in Modern Radar Transmitters," IEEE International Conference on Power Electronics and Drive Systems, pp. 776-782 (2001).
Pokryvailo, A., et al., "A 1KW Pulsed Corona System for Pollution Control Applications," 14th IEEE International Pulsed Power Conference, Dallas, TX, USA (Jun. 15-18, 2003).
Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).
Pustylnik, M., et al., "High-voltage nanosecond pulses in a low-pressure radiofrequency discharge", Physical Review E, vol. 87, No. 6, pp. 1-9 (2013).
Quinley, M., et al., "High Voltage Nanosecond Pulser Operating at 30 kW and 400 kHz" APS-GEC-2018, 1 page (2018).

(56) References Cited

OTHER PUBLICATIONS

Rao, X., et al., "Combustion Dynamics of Plasma-Enhanced Premixed and Nonpremixed Flames," IEEE Transactions an Plasma Science, vol. 38, No. 12, pp. 3265-3271 (Dec. 2010).
Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).
Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).
Schamiloglu, E., et al., "Scanning the Technology: Modern Pulsed Power: Charlie Martin and Beyond," Proceedings of the IEEE, vol. 92, No. 7 , pp. 1014-1020 (Jul. 2004).
Scoville, J.T., et al., "The Resistive Wall Mode Feedback Control System on DIII-D," IEEE/NPSS 18th Symposium on fusion Engineering, Albuquerque, NM, Oct. 25-29, 1999, General Atomics Report GAA23256, 7 pages (Nov. 1999).
Singleton, D.R., et al., "Compact Pulsed-Power System for Transient Plasma Ignition," IEEE Transactions on Plasma Science, vol. 37, No. 12, pp. 2275-2279 (2009) (Abstract).
Singleton, D.R., et al., "Low Energy Compact Power Modulators for Transient Plasma Ignition," IEEE Transactions on Dielectrics and Electrical Insulation, vol. 18, No. 4, pp. 1084-1090 (Aug. 2011) (Abstract).
Starikovskiy, A. and Aleksandrov, N., "Plasma-assisted ignition and combustion," Progress in Energy and Combustion Science, vol. 39, No. 1, pp. 61-110 (Feb. 2013).
Wang, F., et al., "Compact High Repetition Rate Pseudospark Pulse Generator," IEEE Transactions on Plasma Science, vol. 33, No. 4, pp. 1177-1181 (Aug. 2005) (Abstract).
Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).
Zhu, Z., et al., "High Voltage pulser with a fast fall-time for plasma immersion ion implantation," Review of Scientific Instruments, vol. 82, No. 4, pp. 045102-1-45102-4 (Apr. 2011).
International Search Report and Written Opinion as issued in connection with International Patent Application No. PCT/US2014/040929, dated Sep. 15, 2014, 10 pages.
International Search Report and Written Opinion as issued in connection with International Patent Application No. PCT/US2014/065832, dated Feb. 20, 2015, 13 pages.
International Search Report and Written Opinion as issued in connection with International Patent Application No. PCT/US2015/018349, dated Jul. 14, 2015, 15 pages.
International Search Report and Written Opinion as issued in connection with International Patent Application No. PCT/US2015/040204, dated Oct. 6, 2015, 12 pages.
U.S. Non Final Office Action in U.S. Appl. No. 14/635,991, dated Jul. 29, 2016, 17 pages.
U.S. Final Office Action in U.S. Appl. No. 14/635,991, dated Jan. 23, 2017, 22 pages.
U.S. Notice of Allowance in U.S. Appl. No. 14/635,991, dated May 4, 2017, 7 pages.
U.S. Non Final Office Action in U.S. Appl. No. 15/623,464, dated Nov. 7, 2017, 18 pages.
U.S. Final Office Action in U.S. Appl. No. 15/623,464, dated Mar. 27, 2018, 18 pages.
International Search Report and Written Opinion as issued in connection with International Patent Application No. PCT/US2018/016993, dated Apr. 18, 2018, 11 pages.
International Search Report and Written Opinion as issued in connection with International Patent Application No. PCT/US2018/025440, dated Jun. 25, 2018, 25 pages.
U.S. Notice of Allowance in U.S. Appl. No. 15/623,464, dated Oct. 17, 2018, 7 pages.
U.S. Non Final Office Action in U.S. Appl. No. 15/941,731, dated Nov. 16, 2018, 17 pages.
U.S. Non Final Office Action in U.S. Appl. No. 16/178,538, dated Jan. 11, 2019, 27 pages.
U.S. Non Final Office Action in U.S. Appl. No. 16/250,765, dated Mar. 29, 2019, 11 pages.
International Search Report and Written Opinion as issued in connection with International Patent Application No. PCT/US2019/043933, dated Oct. 25, 2019, 9 pages.
International Search Report and Written Opinion as issued in connection with International Patent Application No. PCT/US2019/043932, dated Dec. 5, 2019, 16 pages.
International Search Report and Written Opinion as issued in connection with International Patent Application No. PCT/US2019/043988, dated Dec. 10, 2019, 13 pages.
U.S. Non Final Office Action in U.S. Appl. No. 16/250,157 dated Dec. 19, 2019, 6 pages.
International Search Report and Written Opinion as issued in connection with International Patent Application No. PCT/US2019/046067, dated Jan. 3, 2020, 13 pages.
U.S. Restriction Requirement in U.S. Appl. No. 16/537,513, dated Apr. 1, 2020, 7 pages.
International Search Report and Written Opinion as issued in connection with International Patent Application No. PCT/US2020/016253, dated Apr. 29, 2020, 7 pages.
International Search Report and Written Opinion as issued in connection with International Patent Application No. PCT/US2020/012641, dated May 28, 2020,15 pages.
U.S. Non Final Office Action in U.S. Appl. No. 16/697,173, dated Jun. 26, 2020, 19 pages.
U.S. Non Final Office Action in U.S. Appl. No. 16/779,270, dated Jul. 16, 2020, 9 pages.
U.S. Notice of Allowance in U.S. Appl. No. 16/779,270, dated Aug. 10, 2020, 6 pages.
U.S. Non Final Office Action in U.S. Appl. No. 16/537,513, dated Sep. 3, 2020, 13 pages.
Notice of Reason for Refusal for JP Patent Application No. 2021-504454, dated Jul. 20, 2021, 8 pages.
Non-Final Office Action in U.S. Appl. No. 16/937,948, dated Aug. 24, 2021, 10 pages.
Restriction Requirement in U.S. Appl. No. 17/133,612, dated Aug. 26, 2021, 5 pages.
International Preliminary Report On Patentability dated Aug. 12, 2021 in PCT Application No. PCT/US2020/016253, 7 pages.

* cited by examiner

PRECISE PLASMA CONTROL SYSTEM

BACKGROUND

The application of RF-excited gaseous discharges in thin film fabrication technology has become standard. The simplest geometry most commonly used is that of two planar electrodes between which a voltage is applied.

Positive ions produced in the plasma volume are accelerated across the plasma sheaths and arrive at the electrodes or wafer with an Ion Energy Distribution Function (IEDF) which is determined by the magnitude and the waveform of the time dependent potential difference across the sheaths, the gas pressure, the physical geometry of the reactor, and/or other factors. This ion bombardment energy distribution may determine the degree of anisotropy in thin-film etching, amount of ion impact induced damage to surfaces, etc.

SUMMARY

Some embodiments include a pulsing power supply comprising a power supply and a transformer comprising: a transformer core; a primary winding wrapped around a portion of the transformer core, the primary winding having a first lead and a second lead; and a secondary winding wrapped around a portion of the transformer core. The pulsing power supply may also include a first switch electrically connected with the first lead of the primary winding and the power supply; and a second switch electrically connected with the second lead of the primary winding and the power supply, wherein the first switch and the second switch are opened and closed at different time intervals. The pulsing power supply may also include a pulsing output electrically coupled with the secondary winding of the transformer that outputs pulses having a voltage greater than about 2 kV and with pulse frequencies greater than 1 kHz.

In some embodiments, a pulsing power supply may include a dampening circuit electrically disposed between the first switch and/or the second switch and the transformer.

In some embodiments, the dampening circuit comprises one or more resistors. In some embodiments, the one or more resistors have a resistance less than about 100 ohms. In some embodiments, the dampening circuit comprises one or more diodes electrically coupled with the one or more resistors.

Some embodiments include a plasma system comprising a plasma chamber; and a pulsing power supply where the pulsing output is electrically coupled with the plasma chamber.

In some embodiments, the transformer includes a material comprising FeMnZn.

In some embodiments, the period of time between the first switch being opened and the second switch being closed is less than about 1,000 nanoseconds.

In some embodiments, the power supply comprises a first power supply and a second power supply; the first switch is electrically connected with the first power supply; and the second switch is electrically connected with the second power supply.

In some embodiments, the first power supply provides a first voltage and the second power supply provides a second voltage, the first voltage being different than the second voltage; and the time-integral of a voltage pulse measured between the first lead of the transformer and the second lead of the transformer over integral multiples of a period is zero, wherein the period comprises the time for the first switch to close and open and the second switch to close and open.

In some embodiments, the first power supply provides a first voltage and the second power supply provides a second voltage, the first voltage being different than the second voltage; a first pulse width is the period of time when the first switch is closed; a second pulse width is the period of time when the second switch is closed; and the product of the first voltage and the first pulse width is substantially equal to the product of the second voltage and the second pulse width.

In some embodiments, a pulse power supply includes a third switch electrically connected with the first lead of the primary winding and the power supply; and a fourth switch electrically connected with the second lead of the primary winding and the power supply.

In some embodiments, the power supply provides voltage greater than 1 kV.

In some embodiments, the power supply comprises an energy storage capacitor.

Some embodiments include a method. The method may include closing a first switch for a first period of time for a pre-pulse, the first switch being electrically coupled with a power supply and a transformer; opening the first switch after the first period of time, wherein the first period of time is less than about 100 ns; closing the first switch for a second period of time, the second period of time being about 1,000% greater than the first period of time; opening the first switch after the second period of time; closing a second switch for a third period of time, the second switch being electrically coupled with the power supply and the transformer; and closing the second switch after the third period of time.

In some embodiments, the power supply comprises a first power supply and a second power supply; the first switch is coupled with the first power supply producing a first voltage; the second switch is coupled with the second power supply producing a second voltage; and/or the product of the first voltage and the first period of time is substantially equal to the product of the second voltage and the second period of time.

In some embodiments, the second switch is closed for less than about 60 nanoseconds after the first switch is opened.

Some embodiments include a pulsing power supply that includes a DC power supply providing voltage greater than 2 kV; a transformer comprising: a transformer core; a primary winding wrapped around at least a portion of the transformer core, the primary winding having a first lead and a second lead, and a secondary winding wrapped around at least a portion of the transformer core; a plurality of switches arranged in a full-bridge arrangement; a dampening circuit electrically disposed between the first portion of the plurality of switches and/or the second portion of the plurality of switches and the transformer; and a pulsing output electrically coupled with the secondary winding of the transformer that outputs pulses having a voltage greater than about 2 kV and with pulse frequencies greater than 1 kHz. In some embodiments, a first portion of the plurality of switches electrically connected with the first lead of the primary winding and the power supply; a second portion of the plurality of switches electrically connected with the second lead of the primary winding and the power supply, wherein the first portion of the plurality of switches and the second portion of the plurality of switches are opened and closed at different time intervals;

In some embodiments, the one or more resistors have a resistance less than about 100 ohms.

In some embodiments, the dampening circuit comprises one or more diodes electrically coupled with the one or more resistors.

Some embodiments include a plasma system that includes: a plasma chamber; and a pulsing power supply where the pulsing output is electrically coupled with the plasma chamber.

In some embodiments, the transformer includes a material comprising FeMnZn.

Some embodiments include a plasma system comprising: a plasma chamber; an RF plasma generator electrically coupled with the plasma chamber; a bias generator electrically coupled with the plasma chamber; and/or a controller electrically coupled with the plasma chamber and in communication with the RF plasma generator and/or the bias generator.

Some embodiments include a plasma system comprising: a plasma chamber, an RF plasma generator, a bias generator, and a controller. The RF plasma generator may be electrically coupled with the plasma chamber and may produce a plurality of RF bursts, each of the plurality of RF bursts including RF waveforms, each of the plurality of RF bursts having an RF burst turn on time and an RF burst turn off time. The bias generator may be electrically coupled with the plasma chamber and may produce a plurality of bias bursts, each of the plurality of bias bursts including bias pulses, each of the plurality of bias bursts having an bias burst turn on time and an bias burst turn off time. In some embodiments the controller is in communication with the RF plasma generator and the bias generator that controls the timing of various bursts or waveforms.

In some embodiments, the plurality of RF bursts produce and/or drive a plasma within the plasma chamber and the plurality of bias bursts accelerate ions within the plasma.

In some embodiments, the plasma system includes an electrode disposed within the plasma chamber, the electrode coupled with the bias generator. In some embodiments, the plasma system includes an electrode disposed within the plasma chamber, the electrode coupled with the RF generator. In some embodiments, the plasma system includes an inductive antenna disposed within the plasma chamber, the antenna coupled with the RF plasma generator.

In some embodiments, the plasma system includes a wafer disposed within the plasma chamber, the wafer coupled with the bias generator. In some embodiments, the plasma system includes an wafer disposed within the plasma chamber, the wafer coupled with the RF generator.

In some embodiments, the RF burst turn on time precedes the bias burst turn on time by less than 10 ms. In some embodiments, the bias burst turn on time precedes the RF burst turn off time by less than 10 ms. In some embodiments, the difference between the RF burst turn on time and the RF burst turn off time is less than about 1 ms. In some embodiments, the difference between the bias burst turn on time and the bias burst turn off time is less than about 1 ms.

In some embodiments, the bias pulses have a pulse repetition frequency greater than 1 kHz. In some embodiments, the bias pulses have a voltage greater than 1 kilovolt. In some embodiments, the RF waveforms has a frequency greater than 10 MHz.

The plasma system according to claim 1, wherein the plurality of RF bursts produce and/or drive a plasma within the plasma chamber and the plurality of bias bursts accelerate ions within the plasma.

In some embodiments, the controller controls the timing of the RF burst turn on time, the RF burst turn off time, the bias turn on time, and the bias turn off time based on feedback from the plasma chamber.

In some embodiments, the bias generator includes a nanosecond pulser. In some embodiments, the bias generator includes a bias compensation circuit. In some embodiments, the bias generator includes an energy recovery circuit. In some embodiments, the bias generator includes an RF generator.

In some embodiments, the RF plasma generator comprises either a full bridge circuit or a half bridge circuit and a resonant circuit.

Some embodiments include a method that includes driving on an RF plasma generator; pausing for a first period of time; pulsing with a nanosecond pulser with pulses having a first voltage; pausing for a second period of time; stop driving of the RF plasma generator; pausing for a third period of time; and stopping the pulsing of the nanosecond pulser.

In some embodiments, the method may further include pausing for a fourth period of time; stop driving of the RF plasma generator; pausing for the first period of time; pulsing the nanosecond pulser with pulses having a second voltage; pausing for the second period of time; stopping driving of the RF plasma generator; pausing for the third period of time; and stopping the pulsing of the nanosecond pulser.

In some embodiments, the second voltage is greater than the first voltage.

In some embodiments, the method may further include pausing for a fourth period of time; stopping driving of the RF plasma generator; pausing for a fifth period of time that is different than the first period of time; pulsing the nanosecond pulser with pulses having a second voltage; pausing for the sixth period of time that is different than the first period of time; stop driving of the RF plasma generator; pausing for the seventh period of time that is different than the first period of time; and turning off the nanosecond pulser.

In some embodiments, the first period of time may be less than about 10 ms; the second period of time may be less than about 10 ms; and/or the third period of time may be less than about 10 ms. In some embodiments, the first period of time is less than the second period of time. In some embodiments, the first period of time is less than the second period of time.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

DETAILED DESCRIPTION

Some embodiments include a plasma system that includes a plasma chamber, an RF plasma generator, a bias generator, and a controller. The RF plasma generator may be electrically coupled with the plasma chamber and may produce a plurality of RF bursts, each of the plurality of RF bursts including RF waveforms, each of the plurality of RF bursts having an RF burst turn on time and an RF burst turn off time. The bias generator may be electrically coupled with the plasma chamber and may produce a plurality of bias bursts, each of the plurality of bias bursts including bias pulses, each of the plurality of bias bursts having an bias burst turn on time and an bias burst turn off time. In some embodiments the controller is in communication with the RF plasma generator and the bias generator that controls the timing of various bursts or waveforms.

As used throughout this disclosure, the term "high voltage" may include a voltage greater than 500 V, 1 kV, 10 kV, 20 kV, 50 kV, 100 kV, etc.; the term "high frequency" may be a frequency greater than 1 kHz, 10 kHz, 100 kHz, 200 kHz, 500 kHz, 1 MHz, etc., the term "fast rise time" may include a rise time less than about 1 ns, 10 ns, 50 ns, 100 ns, 250 ns, 500 ns, 1,000 ns, etc.; the term "fast fall time" may include a fall time less than about 1 ns, 10 ns, 50 ns, 100 ns, 250 ns, 500 ns, 1,000 ns, etc.); and the term short pulse width may include pulse widths less than about 1 ns, 10 ns, 50 ns, 100 ns, 250 ns, 500 ns, 1,000 ns, etc.).

Figure 1:
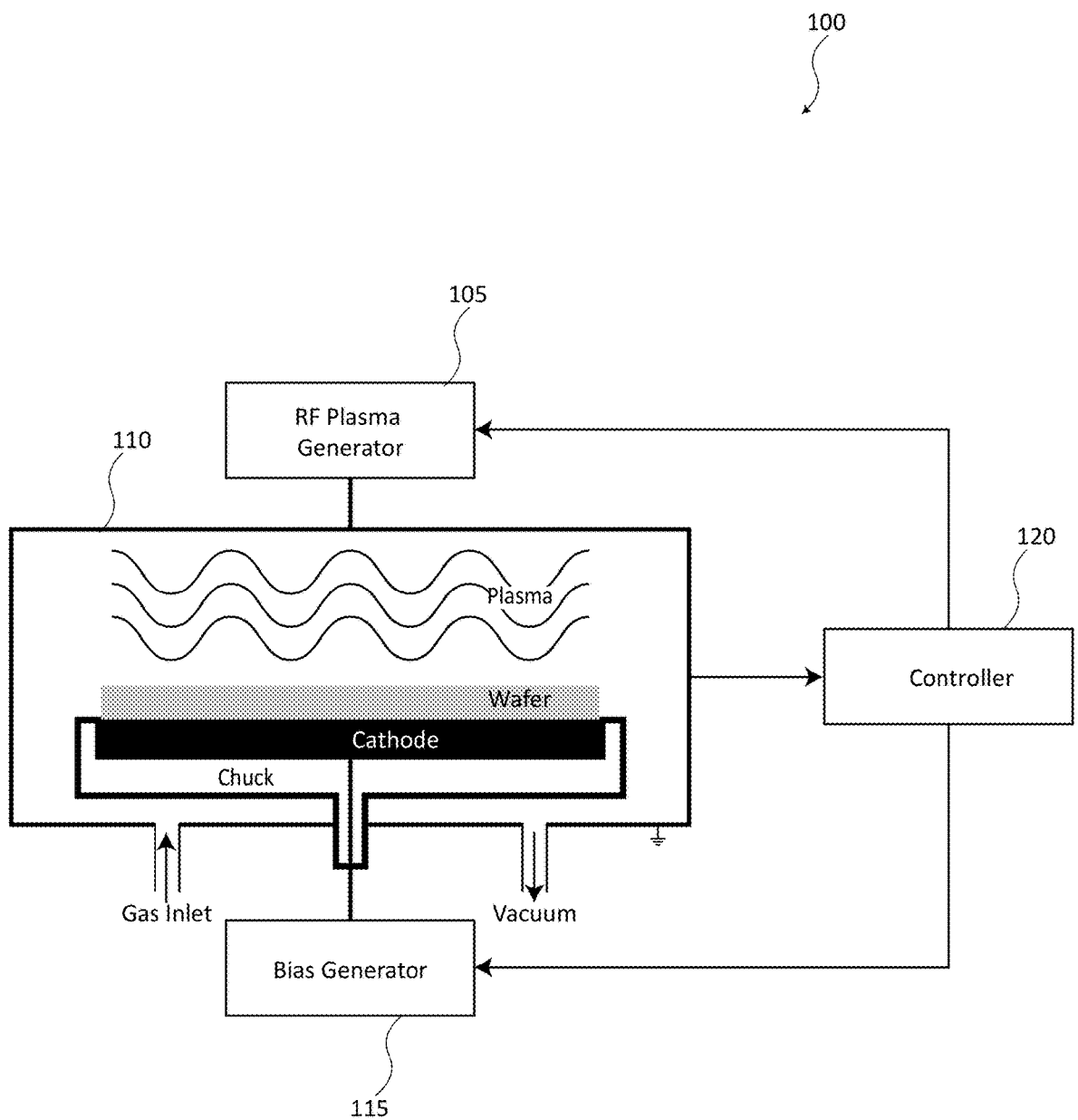
FIG. 1 is a block diagram of a plasma system according to some embodiments.

FIG. 1 is a block diagram of a plasma system 100 according to some embodiments. In some embodiments, the plasma system 100 includes a plasma chamber 110, an RF plasma generator 105, a bias generator 115, and/or a controller 120. In some embodiments, the RF plasma generator 105 may be used to create a plasma within the plasma chamber. In some embodiments, the bias generator 115 may provide pulses that can be used to accelerate ions within the plasma created within the plasma chamber 110.

In some embodiments, the controller 120 may include any type of controller such as, for example, an FPGA, microcontroller, etc. In some embodiments, the controller 120 may receive signals from the plasma chamber 110 (or elsewhere) and change or adapt the timing, duration, frequency, amplitude, etc. of bursts or pulses provided be either the RF plasma generator 105 and/or the bias generator 115.

In some embodiments, the controller 120 may comprise any type of controller such as, for example, an FPGA, ASIC, complex programmable logic device, microcontroller, system on a chip (SoC), supervisory control, data acquisition (SCADA) and programmable logic controller (PLC), or any combination thereof. In some embodiments, the controller 120 may include any or all the components of the computational system 2600. In some embodiments, the controller 120 may include a standard microcontroller such as, for example, Broadcom Arm Cortex, Intel ARM Cortex, PI132, etc.

In some embodiments, the RF plasma generator 105 may produce plasma within the plasma chamber on microsecond timescales (e.g., 1 to 1000 microseconds). In some embodiments, the RF plasma generator 105 may allow for plasma sustainment and/or plasma drive on microsecond timescales to DC, adjustable in microsecond increments. In some embodiments, the RF plasma generator 105 may deliver very high peak powers (e.g., 1 to 10000 kW). In some embodiments, the RF plasma generator 105 may produce a variable CW power delivered (e.g., 0.1 to 100 kW).

In some embodiments, the RF plasma generator 105 may include RF plasma generator 1200 or RF plasma generator 1300. Any RF power supply may be used.

In some embodiments, the RF plasma generator 105 may induce plasma formation in the plasma chamber 110 on small timescales such as, for example, on timescales from about 1 μs to about 1,000 μs. In some embodiments, the RF plasma generator 105 may produce waveforms with arbitrary and/or controllable pulse widths, pulse repetition frequencies, pulse durations, maximum voltages, etc. In some embodiments, the RF plasma generator 105 may produce waveforms with high peak power such as, for example, from about 1 kW to about 10,000 kW. In some embodiments, the RF plasma generator 105 may produce waveforms with variable and/or continuous wave (CW) power such as, for example, from about 1 kW to about 100 kW.

In some embodiments, the bias generator 115 may control a wafer bias voltage on small timescales such as, for example, from about 1 μs to about 1,000 μs. In some embodiments, the bias generator 115 may produce waveforms with arbitrary and/or controllable pulse widths, pulse repetition frequencies, pulse durations, maximum voltages, etc. In some embodiments, the bias generator 115 may produce waveforms with high peak power such as, for example, from about 1 kW to about 100,000 kW. In some embodiments, the bias generator 115 may produce waveforms with variable continuous power such as, for example, from about 1 kW to about 100 kW.

In some embodiments, the bias generator 115 may include bias generator 600, bias generator 900, bias generator 1000, bias generator 1100, bias generator 1600, bias generator 1700, bias generator 1800, bias generator 1900, bias generator 2000, bias generator 2100, bias generator 2200, bias generator 2400, and bias generator 2500. In some embodiments, the bias generator 115 may include RF plasma generator 1200 or RF plasma generator 1300.

In some embodiments, the controller 120 may provide timing control of pulses from both the RF plasma generator 105 and the bias generator 115. The RF waveform 305 is an example output from the RF plasma generator 105 and the bias burst 310 is an example output from the bias generator 115.

In some embodiments, the timing from the controller 120 may contribute, for example, to faster plasma etch within the plasma chamber 110, allow for less/more erosion of various masks; straighter deeper holes/trenches, control of specific plasma properties such as temperature and density while etch voltage is present, different chemistry/reactions driven, varying speed of reactions, control of some etching parameters, and/or control some plasma generation.

Figure 2:
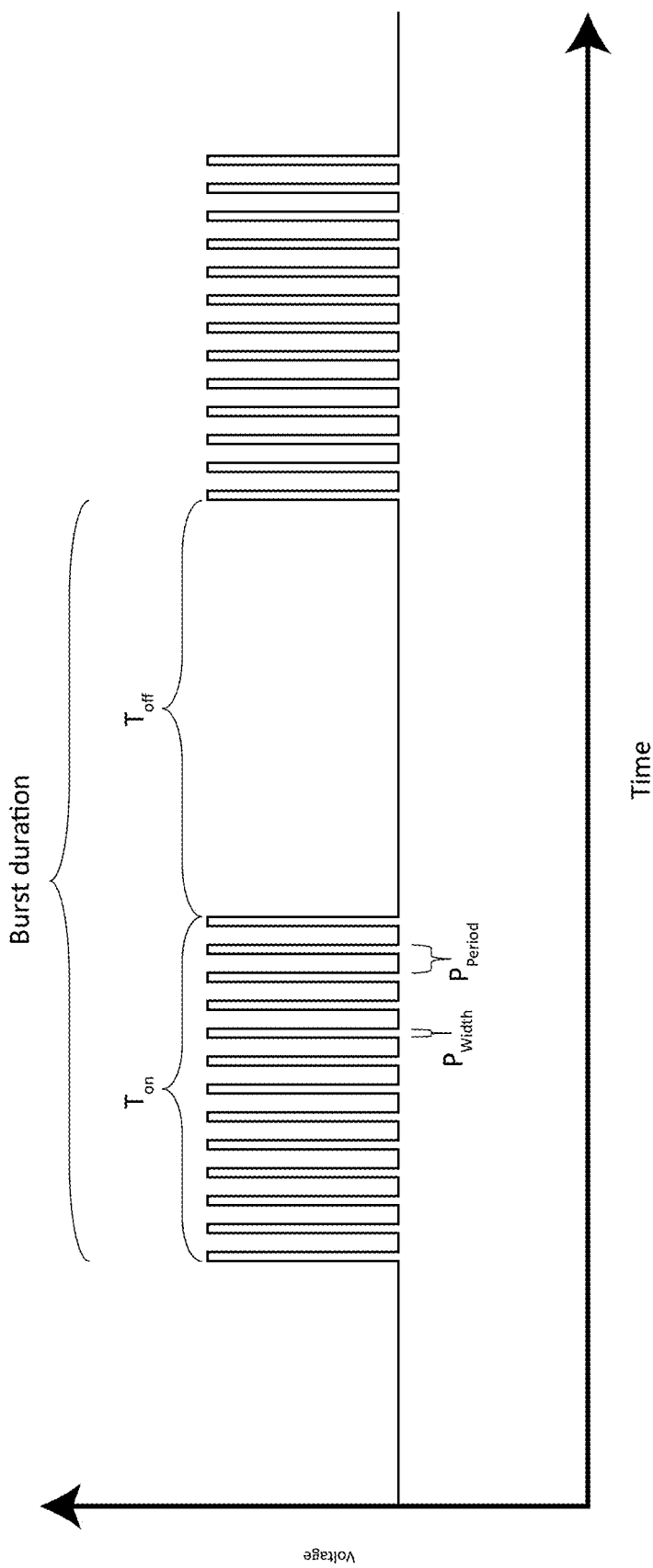
FIG. 2 is an illustration of an example waveform showing two bursts of pulses according to some embodiments.

FIG. 2 is an illustration of an example waveform showing two bursts of pulses according to some embodiments. A single burst may include a plurality of pulses. A burst duration is the time period when a burst is on, $T_{on}$, and the burst is off, $T_{off}$. A pulse width, $P_{width}$, is the period of time that the pulse is on. The pulse period, $P_{period}$, is the time period when the pulse is on and off. The duty cycle may be represented by the on time, $T_{on}$, divided by the burst duration:

$$DC = \frac{T_{on}}{T_{on} + T_{off}}.$$

The burst repetition frequency can be represented by the reciprocal of the burst period: $f_{burst}=1/(T_{on}+T_{off})$. The pulse repetition frequency can be represented by the reciprocal of the pulse period: $f_{pulse}=1/P_{period}$.

In some embodiments, the burst repetition frequency may be between about 10 Hz and about 1,000 Hz. In some embodiments, the pulse repetition frequency may be greater than about 10 kHz.

Figure 3:
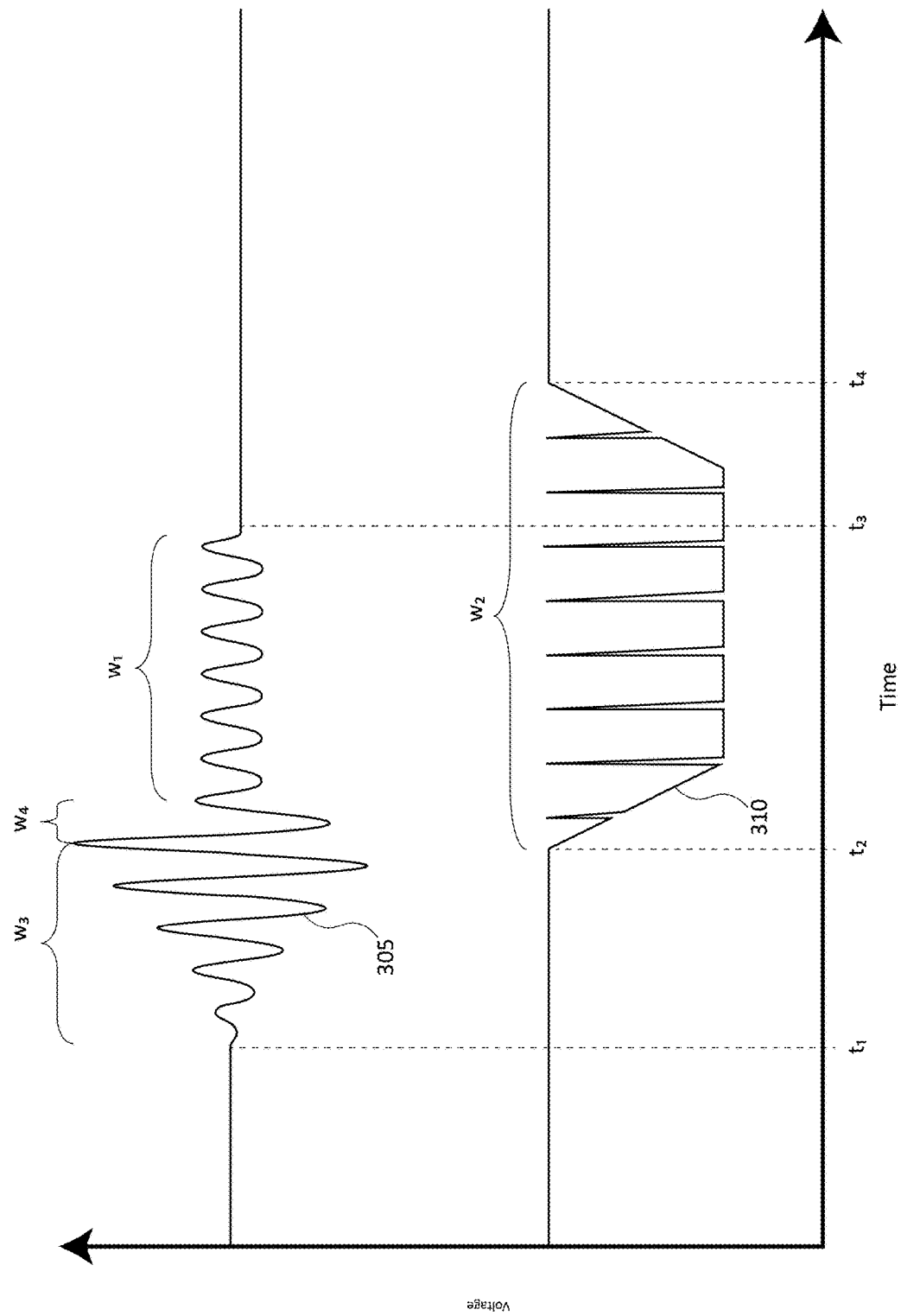
FIG. 3 is an illustration of an example RF burst and example bias burst according to some embodiments.

FIG. 3 is an illustration of an example RF burst and an example bias burst according to some embodiments.

The time $t_1$ represents the beginning of the RF waveform 305 (e.g., the RF burst turn on time). The time $t_3$ represents the end of the RF waveform 305 (e.g., the RF burst turn off time). The time period $w_1$ may represent the period of the portion of the RF waveform 305 when the RF waveform is driving the plasma. The time $t_2$ represents the beginning of the bias burst 310 (e.g., the bias burst turn on time). The time $t_4$ represents the end of the bias burst 310 (e.g., the bias burst turn off time). The time period $w_2$ may represent the period of the bias burst 310.

The RF waveform 305 may create and drive a plasma within the plasma chamber 110. For example, time period $w_3$ may include a period of time with an initial ring up. The time period $w_4$ may be the time period when the plasma forms. The period of time $w_1$ may be when the plasma is driven by the RF signal within the chamber.

In some embodiments, $t_3$ may begin when a plasma has formed in the chamber 110 such as, for example, at the end of either or both $w_3$ or $w_4$. In some embodiments, the controller 120 may sense the formation of the plasma such as, for example, by sensing the amplitude of the initial ring up in the RF waveform 305 or via sensors disposed within the chamber 110 or by sensing the number of cycles of the RF waveform 305. The controller 120 may, for example, begin the burst 310 based on the controller sensing the formation of the plasma or anticipating the formation of the plasma within the chamber 110.

In some embodiments, $t_1$ may precede $t_2$ be less than about 10 ms. In some embodiments, $t_3$ may precede $t_4$ by less than about 10 ms.

In some embodiments, the difference between $t_2$ and $t_1$ may be between about 10 μs and about 10 ms. In some embodiments, the difference between $t_2$ and $t_1$ may be less than about 1 μs. In some embodiments, the difference between $t_2$ and $t_1$ may be less than about 740 ns. In some embodiments, the difference between $t_2$ and $t_1$ may be about 10 cycles or periods or greater than about 10 cycles or periods of the RF waveform 305.

In some embodiments, $t_2$ and $t_1$ may occur at substantially the same time. In some embodiments, $t_2$ may trigger based on when the controller 120 detects that plasma formation has occurred within the plasma chamber 110.

In some embodiments, the difference between $t_4$ and $t_2$ (or $w_2$) may be between about 10 μs and about 10 ms. In some embodiments, $w_1$ may be between about 10 μs and about 10 ms. In some embodiments, $w_2$ may be continuous.

In some embodiments, the frequency of the RF waveform 305 may have a frequency of between about 10 kHz and about 10 MHz. In some embodiments, the RF waveform 305 may have a frequency of 13.56 MHz or any multiples thereof (e.g., 27.12 MHz, 40.68 MHz, etc.). In some embodiments, the frequency of the RF waveform 305 may have a frequency greater than 10 MHz.

In some embodiments, $w_1$ may be continuous such as, for example, greater than 10 ms, 1 ms, 1 second, 10 seconds, etc. In some embodiments, the frequency of the of the pulses in the bias burst 310 may be between about 10 Hz and about 10 kHz. In some embodiments, the frequency of the pulses in the bias burst 310 may be greater than 1 kHz. In some embodiments, the frequency of the of the pulses in the bias burst 310 may be greater than 10 kHz. In some embodiments, the frequency of the of the pulses in the bias burst 310 may be between 10 kHz and 20 MHz. In some embodiments, the frequency of the pulses in the bias burst 310 may be greater than about 400 kHz.

In some embodiments, $w_3$ (e.g., $t_3-w_1-t_1-w_4$) may be less than about 10 ms.

In some embodiments, a flat or ramped or other segment of the bias burst 310 may be between 10 μs and 10 ms in duration.

In some embodiments, a flat or ramped or other segment of the RF waveform 305 may be between 10 μs and 10 ms in duration.

In some embodiments, $t_2$ may precede $t_3$ by less than about 10 ms.

In some embodiments, $t_3$ may precede $t_2$ by less than about 10 ms.

In some embodiments, $t_2$ may occur any time during $w_4$. In some embodiments, $t_2$ may occur any time before the start of $w_1$. In some embodiments, $t_2$ may occur during plasma formation. In some embodiments, $t_2$ may occur during or after or during the initial ring up of the of the RF waveform 305.

In some embodiments, $t_2$ may precede $t_4$ by less than about 10 ms.

In some embodiments, the controller 120 may control the RF plasma generator 105 and/or the bias generator 115 to produce multiple bursts of pulses with arbitrary or selectable pulse widths (e.g., $w_1+w_3+w_4$ or $w_2$), duty cycles, pulse repetition frequencies, and/or burst frequencies.

In some embodiments, the controller 120 may control the RF plasma generator 105 and/or the bias generator 115 to include slow start and/or slow DC stop abilities as well.

In some embodiments, the controller 120 may send and/or receive external commands from an external controller (e.g., an industrial controller). These external commands may control the pulse widths, duty cycles, pulse repetition frequencies, and/or burst frequencies of either or both the RF plasma generator 105 and/or the bias generator 115.

In some embodiments, the controller 120 may automate control of high voltage DC power supplies including turning them on/off, changing the voltage and amperage settings, and/or making the units safe in case of an emergency.

In some embodiments, the controller 120 may have a feedback circuit from the output of the RF plasma generator 105 thus allowing it to analyze the waveforms going into the plasma chamber. This allows the controller 120 to self-adjust for different loads and load conditions In some embodiments, the controller 120 may control the bias generator 115 based on the settings going to the RF plasma generator 105.

In some embodiments, the controller 120 may control the bias generator 115 to produce pulses having pulse widths of 40 ns-200 ns.

In some embodiments, the controller 120 may produce bursts having a duty cycle of 1%-100%.

In some embodiments, the controller 120 may control the bias generator 115 to produce pulses having a burst repetition frequency of 200-1000 Hz.

In some embodiments, the controller 120 may control the bias generator 115 to begin producing pulses at a minimum pulse width (e.g., ~40 ns) and ramp up to longer pulse widths in 4 ns increments (e.g., 40 ns, 44 ns, 48 ns, 52 ns, etc.)

In some embodiments, the controller 120 may control the bias generator 115 to produce pulses that ramp DC voltage down from max voltage to 0 V in selectable steps.

In some embodiments, the controller 120 may control the bias generator 115 to produce arbitrary pulses at low jitter such as, for example, jitter less than about 10 nanoseconds.

In some embodiments, the controller 120 may self-correct for load condition.

In some embodiments, the plasma chamber 110 may include any type of plasma chamber.

In some embodiments, the plasma chamber 110 can have a load capacitance of less than 20 nF. In some embodiments, a potential can be established in the plasma chamber 110 to accelerate ions into a surface through the action of the bias generator 115. In some embodiments, the plasma in the plasma chamber 110 may be largely capacitive in nature. In some embodiments, the plasma in the plasma chamber 110 can include a dielectric barrier discharge In some embodiments, the plasma chamber 110 may be modeled as a capacitor, a capacitor in series with a resistor, a capacitor in series with an inductor, a dielectric barrier discharge, a plasma load, a semiconductor wafer processing load, and any arbitrary arrangement of capacitors, inductors, resistors, and/or other active and/or passive components, etc. In some embodiments, the load within the chamber may include any load that when voltage is applied, and charge is delivered, the charge/voltage may remain present for longer than desired (e.g., longer than the designed or desired fall time). For instance, this may often occur in high voltage switching applications.

In some embodiments, the plasma chamber 110 may include a capacitive load, one or more electrodes, a plasma load, one or more dielectric barriers, semiconductor fabrication plasmas, semiconductor loads, grids, medical loads, etc. In some embodiments, the plasma chamber 110 may include a plasma deposition system, a plasma etch system, or a plasma sputtering system.

In some embodiments, the RF plasma generator 105 may include circuits and/or processes for driving switching power to a plasma chamber without a matching network. In some embodiments, the RF plasma generator 105 may include a full (or half) bridge circuit topology that may be used to drive a resonant circuit at or near its resonant frequency. Because the resonant circuit is being driven at its resonant frequency, the output voltage of the resonant circuit may be higher than the input voltage. In some embodiments, this resonant condition may allow for a drive voltage of a few hundred volts to generate about 4 kV or more.

Figure 4:
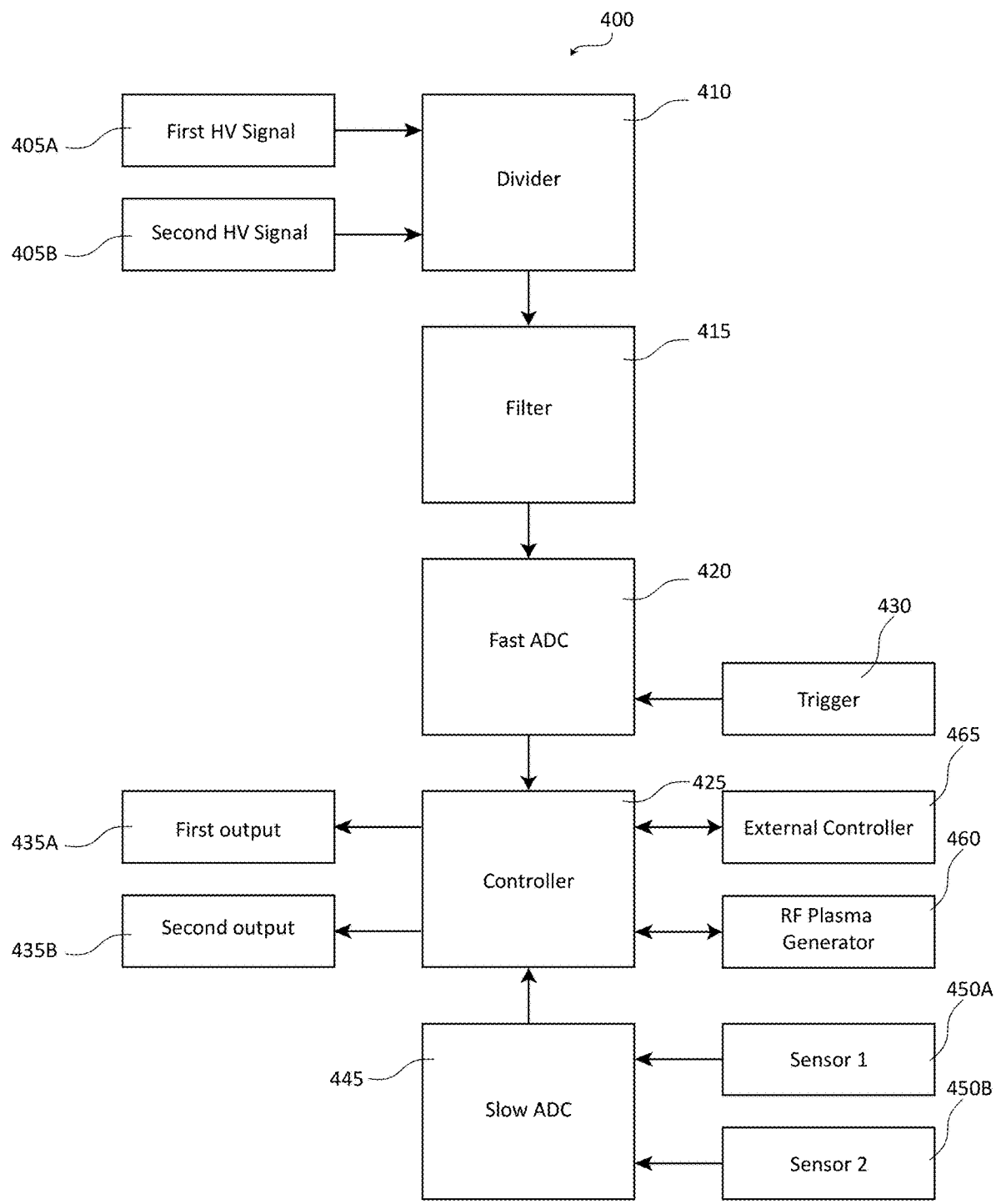
FIG. 4 is a block diagram of a plasma control system according to some embodiments.

FIG. 4 is a block diagram of a plasma control system 400 with a bias generator and an RF plasma generator according to some embodiments. In some embodiments, the plasma control system 400 may be electrically coupled with the bias generator 115 at one or more locations and/or the RF plasma generator 105 at one or more locations. For example, a first HV signal 405A (or a second HV signal 405B) may include the voltage signal at a point of the bias generator 115 between a pulser and a transformer stage and a bias compensation circuit. As another example, a first HV signal 405A (or a second HV signal 405B) may include the voltage signal at a point between a load stage and a bias compensation circuit. As another example, a first HV signal 405A (or a second HV signal 405B) may include the voltage at a point prior to a resistive output stage or an energy recovery state. As another example, a first HV signal 405A (or a second HV signal 405B) may include the voltage on the wafer, chuck, or electrode. While two signals are shown, any number of signals may be received. As another example, a first HV signal 405A (or a second HV signal 405B) may include the voltage across a resistor in a resistive output stage or an energy recovery circuit, which may be representative of the ion current in the chamber. As another example, a first HV signal 405A (or a second HV signal 405B) may include the voltage in an energy recovery circuit, such as, for example, the voltage across an energy recovery inductor, which may be representative of the ion current in the chamber.

In some embodiments, the first HV signal 405A and the second HV signal 405B may include the voltage or current signals on each side of a capacitor of a bias compensation circuit (e.g., blocking capacitor 20 of bias compensation circuit 104 or bias compensation circuit 134). Any number or type of other signals may be received.

In some embodiments, the first HV signal 405A or the second HV signal 405B may include the voltage signals provided to the load. In some embodiments, the first HV signal 405A or the second HV signal 405B may include the voltage signals provided to a bias compensation circuit. In some embodiments, the first HV signal 405A or the second HV signal 405B may include the voltage signals provided to the pulser and a transformer stage may be measured. In some embodiments, the first HV signal 405A or the second HV signal 405B may include the voltage signals provided to the resistive output stage or an energy recovery circuit.

The first HV signal 405A and the second HV signal 405B collectively or individually may be referred to as the HV input signal 405. The HV signal 405 may provide waveforms from the bias generator 115 and/or the RF plasma generator 105.

In some embodiments, the HV input signal 405 may be divided at voltage divider 410. The voltage divider 410, for example, may include high value resistors or low value capacitors to divide the high voltage HV input signal (e.g., greater than 1 KV) to a low voltage signal (e.g., less than 50 V). The voltage divider 410, for example, may divide the voltage with a 500:1 ratio, 1,000:1 ratio, a 10,000:1 ratio, a 100,000:1 ratio, etc. The voltage divider 410, for example, may divide the HV input signal 405 voltage of 0-10 kV to a voltage of 0-20 V. The voltage divider 410, for example, may divide the voltage with minimal power loss such as, for example, less than about 5 W of power loss.

In some embodiments, the voltage divider 410 may include a low value capacitor, a large value capacitor, a low value resistor, and a large value resistor. The low value capacitor, for example, may comprise a capacitor that has a capacitance value of about 0.1 pF, 0.5 pF, 1.0 pF, 2.5 pF, 5.0 pF, 10.0 pF, 100 pF, 1 nF, 10 nF, etc. The large value capacitor, for example, may comprise a capacitor that has a capacitance value of about 500 pF. In some embodiments, the large value capacitor may have a capacitance value that is about 50, 100, 250, 500, 1,000, 2,500, 5,000 pF, etc. greater than the capacitance value of the low value capacitor.

The low value resistor may have a resistance value of about 1.0 kΩ, 2.5 kΩ, 5.0 kΩ, 10 kΩ, 25 kΩ, 50 kΩ, 100 kΩ, etc. The large value resistor may have a resistance value of about 0.5 MΩ, 1.0 MΩ, 2.5 MΩ, 5.0 MΩ, 10 MΩ, 25 MΩ, 50 MΩ, 100 MΩ, etc. In some embodiments, the large value resistor may have a resistance value that is about 50 Ω, 100 Ω, 250 Ω, 500 Ω, 1,000 Ω, 2,500 Ω, 5,000Ω, etc. greater than the resistance value of the low value resistor. In some embodiments, the ratio of the low value capacitor to the large value capacitor may be substantially the same as the ratio of the low value resistor to the large value resistor.

In some embodiments, the voltage divider 410 may receive the HV input signal and output a divided voltage signal. The divided voltage signal, for example, may be 100, 250, 500, 750, 1,000, etc. times smaller than the HV input signal.

In some embodiments, a filter 415 may be included such as, for example, to filter out any noise from the divided voltage signal. The filter, for example, may include any type of low pass filter, a band pass filter, a band stop filter, or a high pass filter.

In some embodiments, the divided voltage signal may be digitized by the first ADC 420. The first ADC 420 may include an analog to digital converter. Any type of analog to digital converter may be used. The first ADC 420 may produce a digitized waveform signal. In some embodiments, the first ADC 420 may capture data at 100, 250, 500, 1,000, 2,000, 5,000 MSPS (megasamples per second or millions of samples per second). In some embodiments, the digitized waveform signal may be communicated to the controller 120 using any type of communication protocol such as, for example, SPI, UART, RS-232, USB, I2C, etc.

In some embodiments, any of the voltage divider 410, the filter 415, or the first ADC 420 may be isolated from the bias generator 115 via galvanic isolation or via fiber optic link.

In some embodiments, the controller 120 may send and/or receive signals or data to or from the RF plasma generator 105. For example, the controller 120 may send timing signals to the RF plasma generator 105 that instruct the RF plasma generator regarding burst repetition frequency, burst voltage, burst frequency, burst duty cycle, burst duration, etc.

In some embodiments, the controller 120 may send and/or receive signals or data to or from the bias generator 115 via the output 435. For example, the controller 120 may send timing signals to the bias generator 115 that instruct the bias generator regarding burst repetition frequency, burst voltage, burst frequency, burst duty cycle, burst duration, etc.

In some embodiments, the controller 120 may receive a trigger signal from trigger 430. In other embodiments, the first ADC 420 may receive the trigger signal from trigger 430. The trigger signal may provide the timing of data acquisition at the first ADC 420. The trigger signal, for example, may be a 5V TTL trigger. The trigger signal, for example, may, have a 50 ohm termination.

The digitized signal may then be output from the controller 120 via one or more output ports such as, for example, a first output 435A or a second output 435B (individually or collectively output 435). These outputs may be coupled with one or more nanosecond pulsers (e.g., bias generator 115). Either or both the output 435 may include an electrical connecter such as, for example, an LVDS, TTL, LVTTL connector. Either or both the output 435 may provide data to the nanosecond pulser controller using any type of communication protocol such as, for example, SPI, UART, RS-232, USB, I2C, EtherCat, Ethernet, Profibus, PROFINET.

In some embodiments, the plasma control system 400 may couple with the bias generator 115 via a 4 mm Multilam receptacles on the plasma control system 400.

In some embodiments, the plasma control system 400 may include a second ADC 445, which may receive inputs from a first sensor 450A and a second sensor 450B (individually or collectively sensor 450) (or any number of sensors). The second ADC 445 may include an analog to digital converter. In some embodiments, the second ADC 445 may digitize analog signals from the sensors 450. The sensors 450 may include, for example, a sensor that senses inlet water temperature, dielectric fluid temperature, dielectric fluid pressure, chassis air temperature, voltage, fluid flow, fluid leak sensor, etc. In some embodiments, the second ADC 445 may include ARM, PI132, AVR, PSOC, or PI132.

In some embodiments, the second ADC 445 and the first ADC 420 may comprise a single ADC device. In some embodiments, either or both the second ADC 445 or the first ADC 420 may be part of the controller 120. In some embodiments, the first ADC 420 may operate at a higher acquisition rate than the second ADC.

In some embodiments, the control system may measure the full-width half-max, peak voltage, DC bias, rise time, fall time, etc. of pulses in the bias generator 115.

In some embodiments, the plasma control system 400 may monitor the voltage, frequency, pulse width, etc. of pulses and, in response, may adjust the voltage, pulse repetition frequency, pulse width, burst repetition frequency (where a burst includes a plurality of pulses), RF burst turn on time, RF burst turn off time, bias burst turn on time, bias burst turn off time, etc. provided to the input of the bias generator 115 and/or the RF plasma generator 105. For example, the first ADC 420 may monitor the voltage amplitude of a waveform. This voltage data may be provided to the controller 120, which may communicate to the nanosecond pulser or the RF plasma generator to adjust the amplitude or frequency of the signal.

In some embodiments, the plasma control system 400 may output arbitrary pulse signals via output 435 to one or more bias generator 115. The output 435, for example, may include either fiber or electric connections. In some embodiments, plasma control system 400 can include a plurality of output pulse channels (e.g., 1, 2, 5, 8, 20, 50, 100, etc.) that may, for example, be independent from each other. The plurality of output pulse channels may, for example, output pulses with sub-nanosecond resolution.

For example, if a pulse voltage is less than a predetermined voltage, the controller 120 may send a signal to the bias generator 115 or the RF plasma generator 105 to produce pulses with a higher voltage. If the pulse voltage is greater than a predetermined voltage, the first ADC 420 may send a signal to the bias generator 115 or the RF plasma generator 105 to produce pulses with a lower voltage. In some embodiments, the signal to the nanosecond pulser to increase the pulse voltage may comprise a low voltage pulse that has a longer pulse width than the previously sent signal, and the signal to the nanosecond pulser to decrease the pulse voltage may comprise a low voltage pulse that has a shorter pulse width than the previously sent signal.

As another example, if the pulse repetition frequency is greater than an desired pulse repetition frequency, the controller 120 may send a signal to the bias generator 115 or the RF plasma generator 105 to produce pulses with a lower frequency. If the burst repetition frequency is less than an desired burst repetition frequency, the controller 120 may send a signal to the bias generator 115 or the RF plasma generator 105 to produce burst with a higher burst repetition frequency. If the full width half max of the measured pulse is different than an desired burst repetition frequency, the controller 120 may send a signal to the bias generator 115 or the RF plasma generator 105 to produce a pulses with an adjusted pulse width or pulse repetition frequency.

As another example, if the waveform pulse width is longer than an desired pulse width, the first ADC 420 may send a signal to the bias generator 115 or the RF plasma generator 105 to produce a waveform with a shorter or longer pulse width. If the waveform duty cycle is shorter or longer than an desired duty cycle, the first ADC 420 may send a signal to the bias generator 115 or the RF plasma generator 105 to produce a pulses with the appropriate duty cycle.

The plasma control system 400 may monitor other waveform characteristics and/or adjust these other characteristics.

In some embodiments, the plasma control system 400 may output arbitrary pulse signals via output 435 to one or more bias generator 115 or the RF plasma generator 105. For example, the control system may comprise an arbitrary RF plasma generator. The output 435, for example, may include either fiber or electric connections. In some embodiments, plasma control system 400 can include a plurality of output pulse channels (e.g., 1, 2, 5, 8, 20, 50, 100, etc.) that may, for example, be independent from each other. The plurality of output pulse channels may, for example, output pulses with sub-nanosecond resolution. In some embodiments, the plasma control system 400 may output pulses with resolution less than about 0.1 ns. In some embodiments, the plasma control system 400 may output pulses with jitter less than about 100 ps.

In some embodiments, each output pulse channel of the plasma control system 400 may output pulses to a bias generator 115 that triggers the bias generator 115. The plasma control system 400 may, for example, adjust parameters of the output pulses in real-time or between pulses. These parameters may include pulse width, pulse repetition frequency, duty cycle, burst repetition frequency, voltage, number of pulses in a burst, the number of burst, etc. In some embodiments, one or more parameters may be adjusted or changed based on input to the plasma control system 400 or based on a recipe or a program.

For example, a recipe may include alternating high bursts and low bursts from the bias generator 115. A high burst, for example, may include a plurality of high voltage pulses. A low burst, for example, may include a plurality of lower voltage pulses. The high burst and the low burst may, for example, include the same number of pulses or a different number of pulses within each burst. A low burst, for example, may have a voltage that is 10%, 20%, 30%, 40%, 50%, etc. lower than the voltage of the high burst voltage.

The alternating high bursts and low bursts from the bias generator 115 may include 5%, 20%, 50%, 100%, 125%, 150%, etc. ratio of low bursts to high bursts (low-high ratio). For example, a 20% low-high ratio may include a train of 10 bursts, where each burst includes about 500 pulses (or any number of pulses from 1 to 10,000 pulses. In a train of 10 bursts with a 10% low-high ratio, 2 bursts may be low voltage bursts and 8 bursts may be high voltage bursts.

In some embodiments, the controller 120 may communicate pulses with longer low voltage pulses to produce the high bursts and communicate pulses with shorter low voltage pulses to produce the low bursts to the nanosecond pulser to produce alternating high bursts and low bursts as described in U.S. patent application Ser. No. 16/114,195, titled "ARBITRARY WAVEFORM GENERATION USING NANOSECOND PULSES," which is incorporated herein for all purposes.

In some embodiments, one of the sensors 450 may include a DC voltage sensor that may be coupled with a DC power supply in the bias generator 115. For example, if multiple DC power supply systems are used in bias generator 115 and during operation the voltage varies by more than a set percentage (e.g., 1%, 5%, 10%, 20%, etc.) or more than an absolute voltage (e.g., 5V, 10V, 50V, 100V, etc.) then the controller 120 may turn off the bias generator 115. As another example, if power supply systems are used and during operation the voltage output differs by more than a percentage from a set voltage (e.g., 1%, 5%, 10%, 20%, etc.) or more than an absolute voltage from the set voltage (e.g., 5V, 10V, 50V, 100V, etc.) then the controller 120 may turn off pulsing.

In some embodiments, the controller 120 may send and/or receive communication and/or commands from an external controller 465 such as, for example, an industrial controller. In some embodiments, the external controller 465 may communicate with the controller 120 via an EtherCat module. In some embodiments, the EtherCat module may comprise any type of communication module. In some embodiments, the EtherCat may include one or more components of the computational system 2600.

In some embodiments, the control system may control the operation of a pulsing system such as, for example, pulse width, duty cycle, high voltage set point, on/off, returns current output voltage, high voltage current set point, returns current output current, enable high voltage output, returns high voltage enable state, emergency shutdown, etc.

Figure 5:
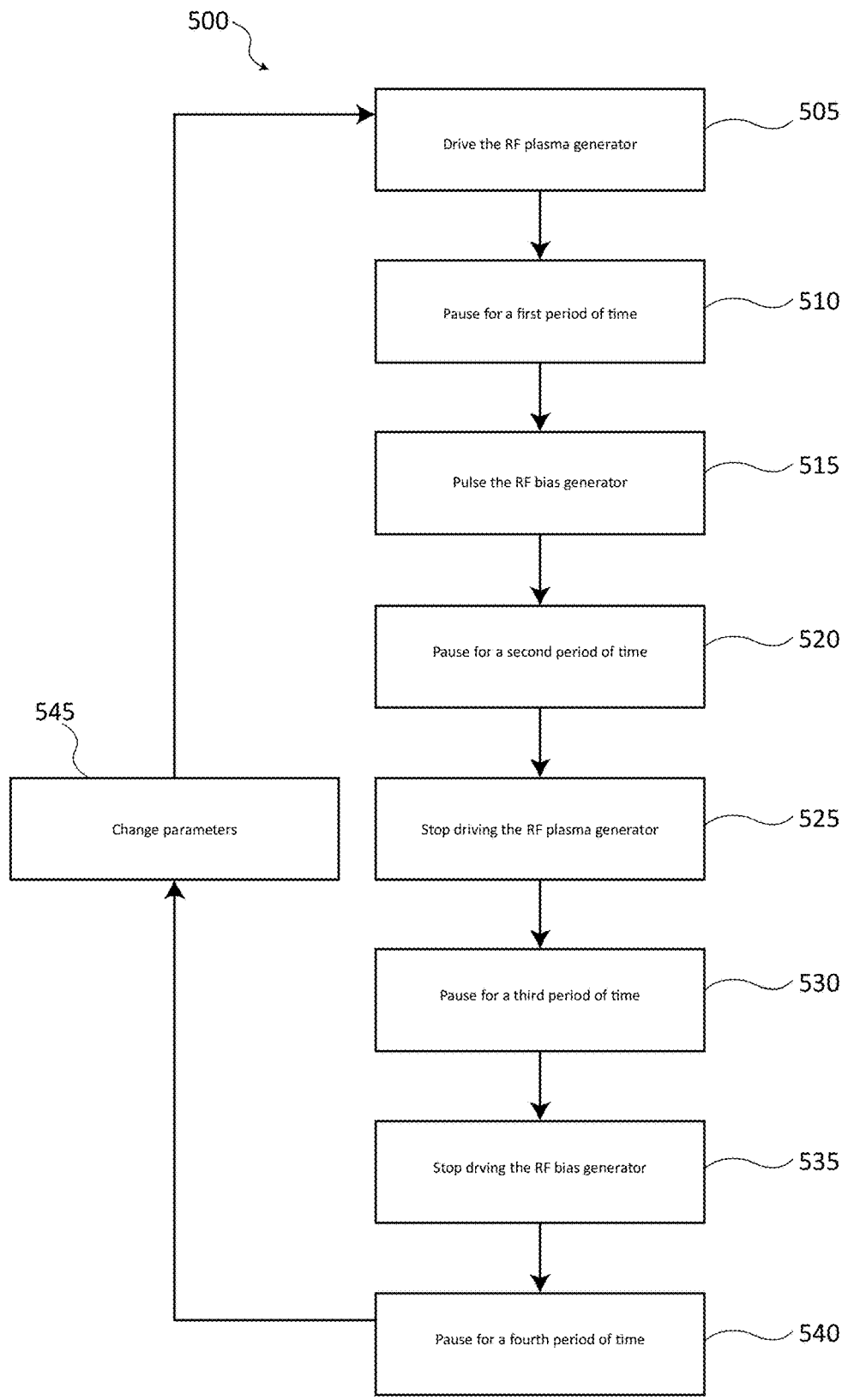
FIG. 5 is a process for controlling a plasma system according to some embodiments.

FIG. 5 is a process 500 for controlling the plasma system 100 according to some embodiments. In some embodiments, the process 500 may be executed by the controller 120.

The process 500 begins at block 505. At block 505 the controller 120 may begin to drive the RF plasma generator 105 to create a first RF burst. The first RF burst, for example, may include a waveform similar to the RF waveform 305. The first RF burst may include RF burst parameters such as, for example, an RF frequency and/or an RF voltage. The first burst from the RF plasma generator 105 may create a plasma within the chamber 110.

At block 510 the process 500 may pause for a first period of time. The first period of time, for example, may be between about 10 μs and about 10 ms. In some embodiments, the first period of time may be 0 seconds. The first period of time may be the time between the beginning of the RF waveform 305 (e.g., $t_1$ or the RF burst turn on time) and the beginning of the bias burst 310 (e.g., $t_2$ or the bias burst turn on time).

At block 515 the controller 120 may pulse the bias generator 115 to create a first bias burst. The first bias burst, for example, may include a waveform similar to the bias burst 310. The first bias burst may include bias burst parameters such as, for example, a pulse repetition frequency and/or a bias voltage.

At block 520 the process 500 may pause for a second period of time. The second period of time, for example, may be between about 10 μs and about 10 ms. The second period of time may be the time between the beginning of the bias burst 310 (e.g., $t_2$ or the bias burst turn on time) and the end of the RF waveform 305 (e.g., $t_3$ or the RF burst turn off time).

At block 525 the RF plasma generator may stop driving the chamber with an RF waveform. For example, the controller may send a signal to the RF plasma generator 105 to end the burst.

At block 530 the process 500 may pause for a third period of time. The third period of time, for example, may be between about 10 μs and about 10 ms. The third period of time, for example, may be zero seconds. The third period of time may be the time between the end of the RF waveform 305 (e.g., $t_3$ or the RF burst turn off time) and the end of the bias burst 310 (e.g., $t_4$ or the bias burst turn off time). In some embodiments, the first time period, the second time period, or the third time period may be the same. In some embodiments, the first time period, the second time period, or the third time period may be different.

At block 535 the bias generator 115 may stop pulsing. For example, the controller may send a signal to the bias generator 115 to end the burst and discontinue pulsing.

At block 540 the process 500 may pause for a fourth period of time. The fourth period of time, for example, may be the time between the end of the bias burst 310 (e.g., $t_4$ or the bias burst turn off time) and the start of the next RF burst or the beginning of the next RF waveform 305 (e.g., $t_1$ for the next RF waveform or the RF burst turn on time for the next RF waveform). In some embodiments, fourth period of time may be greater than the first period of time, the second period of time, and/or the fourth period of time. The fourth period of time may define the duty cycle of the RF waveform and/or the duty cycle of the bias burst.

At block 545 the process parameters may be changed. The process parameters may include the RF parameters, the bias parameters, the first period of time, the second period of time, the third period of time, the fourth period of time, etc. In some embodiments, the RF parameters and/or the bias parameters may be changed based on feedback from the chamber such as, for example, RF voltage, bias voltage, RF frequency, pulse repetition frequency, temperature, pressure, etc. In some embodiments, the RF parameters and/or the bias parameters may be changed based on feedback from the chamber via the HV input signals 405 or the sensors 450.

After block 545, the process may repeat.

Figure 6:
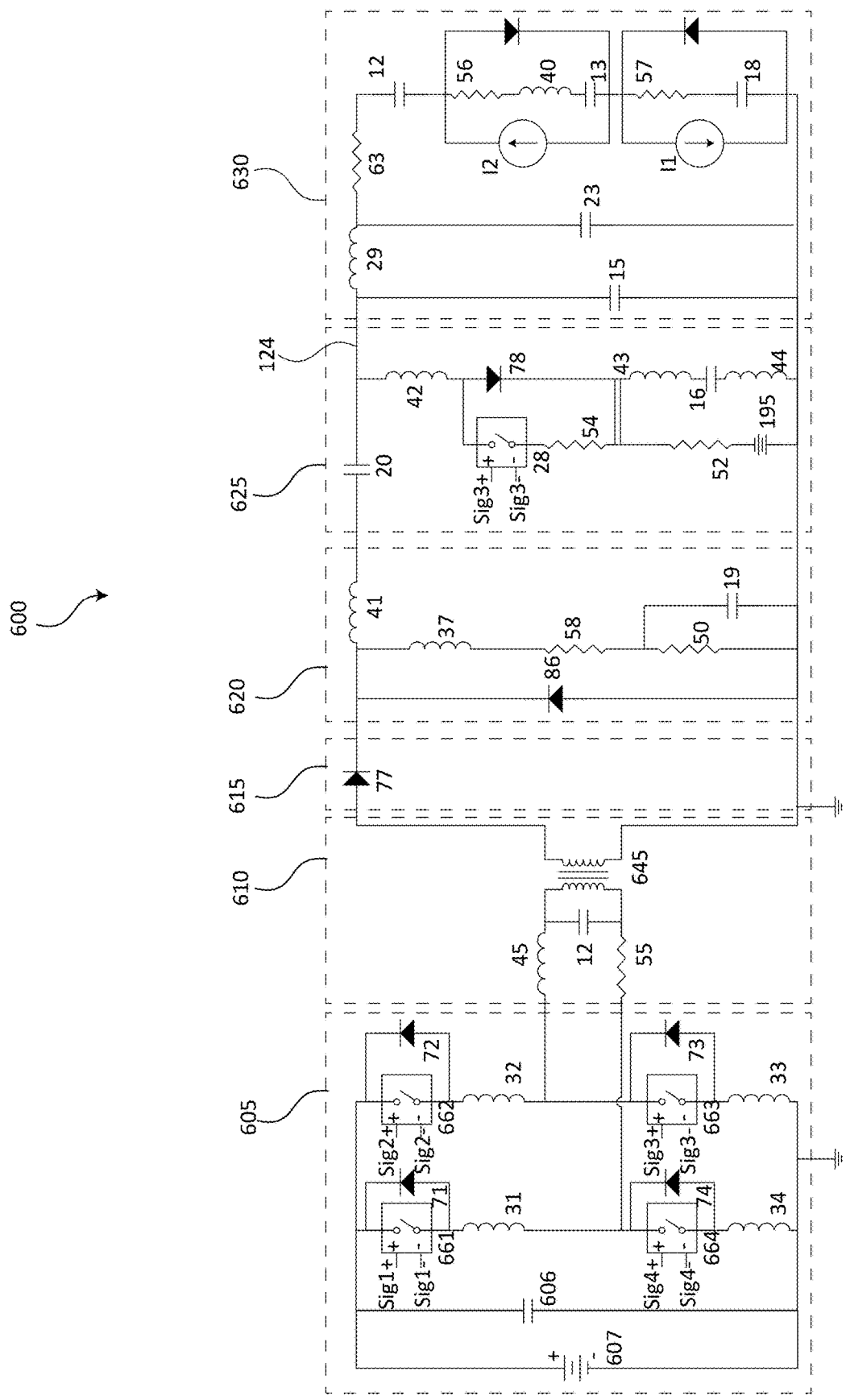
FIG. 6 is a circuit diagram of a bias generator according to some embodiments.

FIG. 6 is a circuit diagram of a bias generator 600 according to some embodiments.

In this example, the bias generator 600 may include an RF driver 605. The RF driver 605, for example, may be a half-bridge driver or a full-bridge driver as shown in FIG. 6. The RF driver 605 may include an voltage source 607, which may be a DC voltage source (e.g., a capacitive source, AC-DC converter, etc.). In some embodiments, the RF driver 605 may include four bridge switches 661, 662, 664, 664. In some embodiments, the RF driver 605 may include a plurality of switches 661, 662, 664, and 664 in series or in parallel. These switches 661, 662, 664, and 664, for example, may include any type of solid-state switch such as, for example, IGBTs, a MOSFETs, a SiC MOSFETs, SiC junction transistors, FETs, SiC switches, GaN switches, photoconductive switches, etc. These switches 661, 662, 664, and 664 may be switched at high frequencies and/or may produce a high voltage pulses. These frequencies may, for example, include frequencies of about 400 kHz, 0.5 MHz, 2.0 MHz, 4.0 MHz, 13.56 MHz, 27.12 MHz, 40.68 MHz, 50 MHz, etc.

Each switch of switches 661, 662, 664, and 664 may be coupled in parallel with a respective bridge diode 71, 72, 73, 74 and may include stray inductance represented by bridge inductor 31, 32, 33, and 34. In some embodiments, the inductances of bridge inductor 31, 32, 33, and 34 may be equal. In some embodiments, the inductances of bridge inductor 31, 32, 33, and 34 may be less than about 50 nH, 100 nH, 150 nH, 500 nH, 1,000 nH, etc. The combination of a switch (661, 662, 664, or 664) and a respective bridge diode (71, 72, 73, 74) may be coupled in series with a respective bridge inductor (31, 32, 33, or 34). For example, bridge inductors 33 and 34 are connected with ground. For example, bridge inductor 31 is connected with bridge switch 664 and the resonant circuit 610. And bridge inductor 32, for example, is connected with bridge switch 664 and the opposite side of the resonant circuit 610.

In some embodiments, the RF driver 605 may be coupled with a resonant circuit 610. The resonant circuit 610 may include a resonant inductor 45 and/or a resonant capacitor 12 coupled with a transformer 645. The resonant circuit 610 may include a resonant resistor 55, for example, that may include the stray resistance of any leads between the RF driver 605 and the resonant circuit 610 and/or any component within the resonant circuit 610 such as, for example, the transformer 645, the resonant capacitor 12, and/or the inductor 45. In some embodiments, the resonant resistor 55 comprises only stray resistances of wires, traces, or circuit elements. While the inductance and/or capacitance of other circuit elements may affect the driving frequency, the driving frequency can be set largely by choice of the resonant inductor 45 and/or the resonant capacitor 12. Further refinements and/or tuning may be required to create the proper driving frequency in light of stray inductance or stray capacitance. In addition, the rise time across the transformer 645 can be adjusted by changing inductor 45 and/or resonant capacitor 12, provided that:

$$f_{resonant} = \frac{1}{2\pi\sqrt{(L5)(C2)}} = \text{constant}.$$

Figure 7:
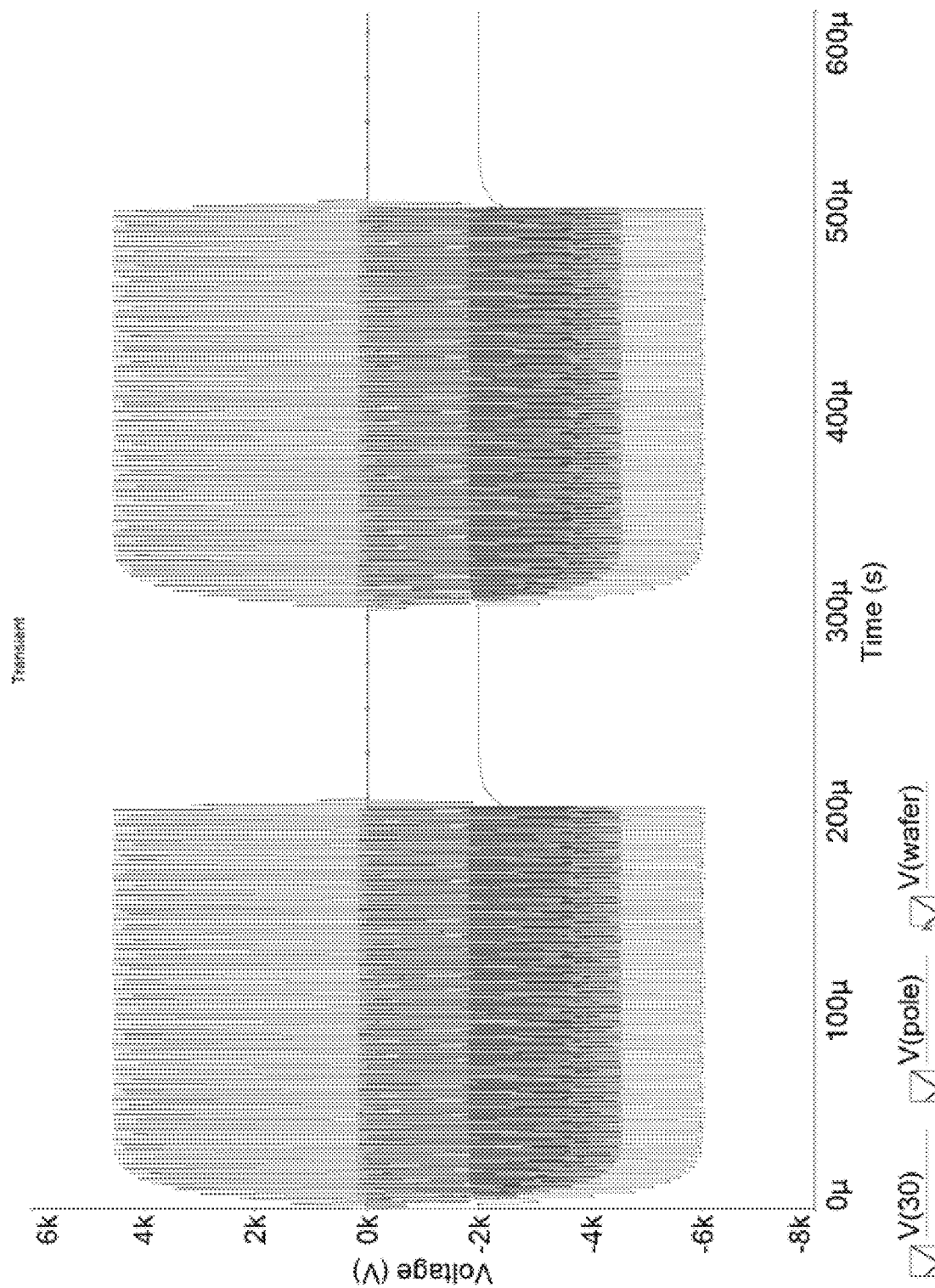
FIG. 7 is a waveform from the bias generator shown in FIG. 6.

In some embodiments, large inductance values for inductor 45 can result in slower or shorter rise times. These values may also affect the burst envelope. As shown in FIG. 7, each burst can include transient and steady state pulses. The transient pulses within each burst may be set by inductor 45 and/or the Q of the system until full voltage is reached during the steady state pulses.

If the switches in the RF driver 605 are switched at the resonant frequency, $f_{resonant}$, then the output voltage at the transformer 645 will be amplified. In some embodiments, the resonant frequency may be about 400 kHz, 0.5 MHz, 2.0 MHz, 4.0 MHz, 13.56 MHz, 27.12 MHz, 40.68 MHz, 50 MHz, etc.

In some embodiments, the resonant capacitor 12 may include the stray capacitance of the transformer 645 and/or a physical capacitor. In some embodiments, the resonant capacitor 12 may have a capacitance of about 10 µF, 1 µF, 100 nF, 10 nF, etc. In some embodiments, the resonant inductor 45 may include the stray inductance of the transformer 645 and/or a physical inductor. In some embodiments, the resonant inductor 45 may have an inductance of about 50 nH, 100 nH, 150 nH, 500 nH, 1,000 nH, etc. In some embodiments, the resonant resistor 55 may have a resistance of about 10 ohms, 25 ohms, 50 ohms, 100 ohms, 150 ohms, 500 ohms, etc.

In some embodiments, the resonant resistor 55 may represent the stray resistance of wires, traces, and/or the transformer windings within the physical circuit. In some embodiments, the resonant resistor 55 may have a resistance of about 10 mohms, 50 mohms, 100 mohms, 200 mohms, 500 mohms, etc.

In some embodiments, the transformer 645 may comprise a transformer as disclosed in U.S. patent application Ser. No. 15/365,094, titled "High Voltage Transformer," which is incorporated into this document for all purposes. In some embodiments, the output voltage of the resonant circuit 610 can be changed by changing the duty cycle (e.g., the switch "on" time or the time a switch is conducting) of switches 661, 662, 664, and/or 664. For example, the longer the duty cycle, the higher the output voltage; and the shorter the duty cycle, the lower the output voltage. In some embodiments, the output voltage of the resonant circuit 610 can be changed or tuned by adjusting the duty cycle of the switching in the RF driver 605.

For example, the duty cycle of the switches can be adjusted by changing the duty cycle of signal Sig1, which opens and closes bridge switch 661; changing the duty cycle of signal Sig2, which opens and closes bridge switch 662; changing the duty cycle of signal Sig3, which opens and closes bridge switch 664; and changing the duty cycle of signal Sig4, which opens and closes bridge switch 664. By adjusting the duty cycle of the switches 661, 662, 664, or 664, for example, the output voltage of the resonant circuit 610 can be controlled.

In some embodiments, each bridge switch 661, 662, 664, or 664 in the RF driver 605 can be switched independently or in conjunction with one or more of the other switches. For example, the signal Sig1 may be the same signal as signal Sig3. As another example, the signal Sig2 may be the same signal as signal Sig4. As another example, each signal may be independent and may control each bridge switch 661, 662, 664, or 664 independently or separately.

In some embodiments, the resonant circuit 610 may be coupled with a half-wave rectifier 615 that may include a blocking diode 77.

In some embodiments, the half-wave rectifier 615 may be coupled with the resistive output stage 620. The resistive output stage 620 may include any resistive output stage known in the art. For example, the resistive output stage 620 may include any resistive output stage described in U.S. patent application Ser. No. 16/178,538 titled "HIGH VOLTAGE RESISTIVE OUTPUT STAGE CIRCUIT," which is incorporated into this disclosure in its entirety for all purposes.

For example, the resistive output stage 620 may include an inductor 37, resistor 58, ROS resistor 50, and capacitor 19. In some embodiments, inductor 37 may include an inductance of about 5 µH to about 25 µH. In some embodiments, the ROS resistor 50 may include a resistance of about 50 ohms to about 250 ohms. In some embodiments, the resistor 58 may comprise the stray resistance in the resistive output stage 620.

In some embodiments, the ROS resistor 50 may include a plurality of resistors arranged in series and/or parallel. The capacitor 19 may represent the stray capacitance of the ROS resistor 50 including the capacitance of the arrangement series and/or parallel resistors. The capacitance of stray capacitance 19, for example, may be less than 500 pF, 250 pF, 100 pF, 50 pF, 10 pF, 1 pF, etc. The capacitance of stray capacitance 19, for example, may be less than the load capacitance such as, for example, less than the capacitance of 12, 13, and/or 18.

In some embodiments, the ROS resistor 50 may discharge the load (e.g., a plasma sheath capacitance). In some embodiments, the resistive output stage 620 may be configured to discharge over about 1 kilowatt of average power during each pulse cycle and/or a joule or less of energy in each pulse cycle. In some embodiments, the resistance of the ROS resistor 50 in the resistive output stage 620 may be less than 200 ohms. In some embodiments, the ROS resistor 50 may comprise a plurality of resistors arranged in series or parallel having a combined capacitance less than about 200 pF (e.g., 19).

In some embodiments, the resistive output stage 620 may include a collection of circuit elements that can be used to control the shape of a voltage waveform on a load. In some embodiments, the resistive output stage 620 may include passive elements only (e.g., resistors, capacitors, inductors, etc.). In some embodiments, the resistive output stage 620 may include active circuit elements (e.g., switches) as well as passive circuit elements. In some embodiments, the resistive output stage 620, for example, can be used to control the voltage rise time of a waveform and/or the voltage fall time of waveform.

In some embodiments, the resistive output stage 620 can discharge capacitive loads (e.g., a wafer and/or a plasma). For example, these capacitive loads may have small capacitance (e.g., about 10 pF, 100 pF, 500 pF, 1 nF, 10 nF, 100 nF, etc.).

In some embodiments, a resistive output stage can be used in circuits with pulses having a high pulse voltage (e.g., voltages greater than 1 kV, 10 kV, 20 kV, 50 kV, 100 kV, etc.) and/or high frequencies (e.g., frequencies greater than 1 kHz, 10 kHz, 100 kHz, 200 kHz, 500 kHz, 1 MHz, etc.) and/or frequencies of about 400 kHz, 0.5 MHz, 2.0 MHz, 4.0 MHz, 13.56 MHz, 27.12 MHz, 40.68 MHz, 50 MHz, etc.

In some embodiments, the resistive output stage may be selected to handle high average power, high peak power, fast rise times and/or fast fall times. For example, the average power rating might be greater than about 0.5 kW, 1.0 kW, 10 kW, 25 kW, etc., and/or the peak power rating might be greater than about 1 kW, 10 kW, 100 kW, 1 MW, etc.

In some embodiments, the resistive output stage 620 may include a series or parallel network of passive components. For example, the resistive output stage 620 may include a series of a resistor, a capacitor, and an inductor. As another example, the resistive output stage 620 may include a capacitor in parallel with an inductor and the capacitor-inductor combination in series with a resistor. For example, 37 can be chosen large enough so that there is no significant energy injected into the resistive output stage when there is voltage out of the rectifier. The values of 58 and 51 can be chosen so that the L/R time can drain the appropriate capacitors in the load faster than the RF frequency In some embodiments, the resistive output stage 620 may be coupled with the bias compensation circuit 625. The bias compensation circuit 625 may include any bias and/or bias compensation circuit known in the art. For example, the bias compensation circuit 625 may include any bias and/or bias compensation circuit described in U.S. patent application Ser. No. 16/523,840 titled "NANOSECOND PULSER BIAS COMPENSATION," which is incorporated into this disclosure in its entirety for all purposes.

In some embodiments, the bias compensation circuit 625 may include a bias capacitor 16, blocking capacitor 20, a blocking diode 78, switch 28 (e.g., a high voltage switch), offset supply voltage 195, resistance 52, and/or resistance 54. In some embodiments, the switch 28 comprises a high voltage switch described in U.S. Patent Application No. 62/717,637, titled "HIGH VOLTAGE SWITCH FOR NANOSECOND PULSING," and/or in U.S. patent application Ser. No. 16/178,565, titled "HIGH VOLTAGE SWITCH FOR NANOSECOND PULSING," which is incorporated into this disclosure in its entirety for all purposes.

In some embodiments, the offset supply voltage 195 may include a DC voltage source that can bias the output voltage either positively or negatively. In some embodiments, the blocking capacitor 20 may isolate/separate the offset supply voltage 195 from the resistive output stage 620 and/or other circuit elements. In some embodiments, the bias compensation circuit 625 may allow for a potential shift of power from one portion of the circuit to another. In some embodiments, the bias compensation circuit 625 may be used to hold a wafer in place as high voltage pulses are active within the chamber. Resistance 52 may protect/isolate the DC bias supply from the driver.

In some embodiments, the switch 28 may be open while the RF driver 605 is pulsing and closed when the RF driver 605 is not pulsing. While closed, the switch 28 may, for example, short current across the blocking diode 78. Shorting this current may allow the bias between the wafer and the chuck to be less than 2 kV, which may be within acceptable tolerances.

In some embodiments, the load stage 630 may be coupled with the bias compensation circuit 625. The load stage 630, for example, may be represented by the various circuit elements shown in FIG. 6. The loads stage 630 may include a plasma chamber.

FIG. 6 does not include a traditional matching network such as, for example, a 50 ohm matching network or an external matching network or standalone matching network. Indeed, the embodiments described within this document do not require a 50 ohm matching network to tune the switching power applied to the wafer chamber. In addition, embodiments described within this document provide a variable output impedance RF generator without a traditional matching network. This can allow for rapid changes to the power drawn by the plasma chamber. Typically, this tuning of the matching network can take at least 100 μs-200 μs. In some embodiments, power changes can occur within one or two RF cycles, for example, 2.5 μs-5.0 μs at 400 kHz.

Figure 8:
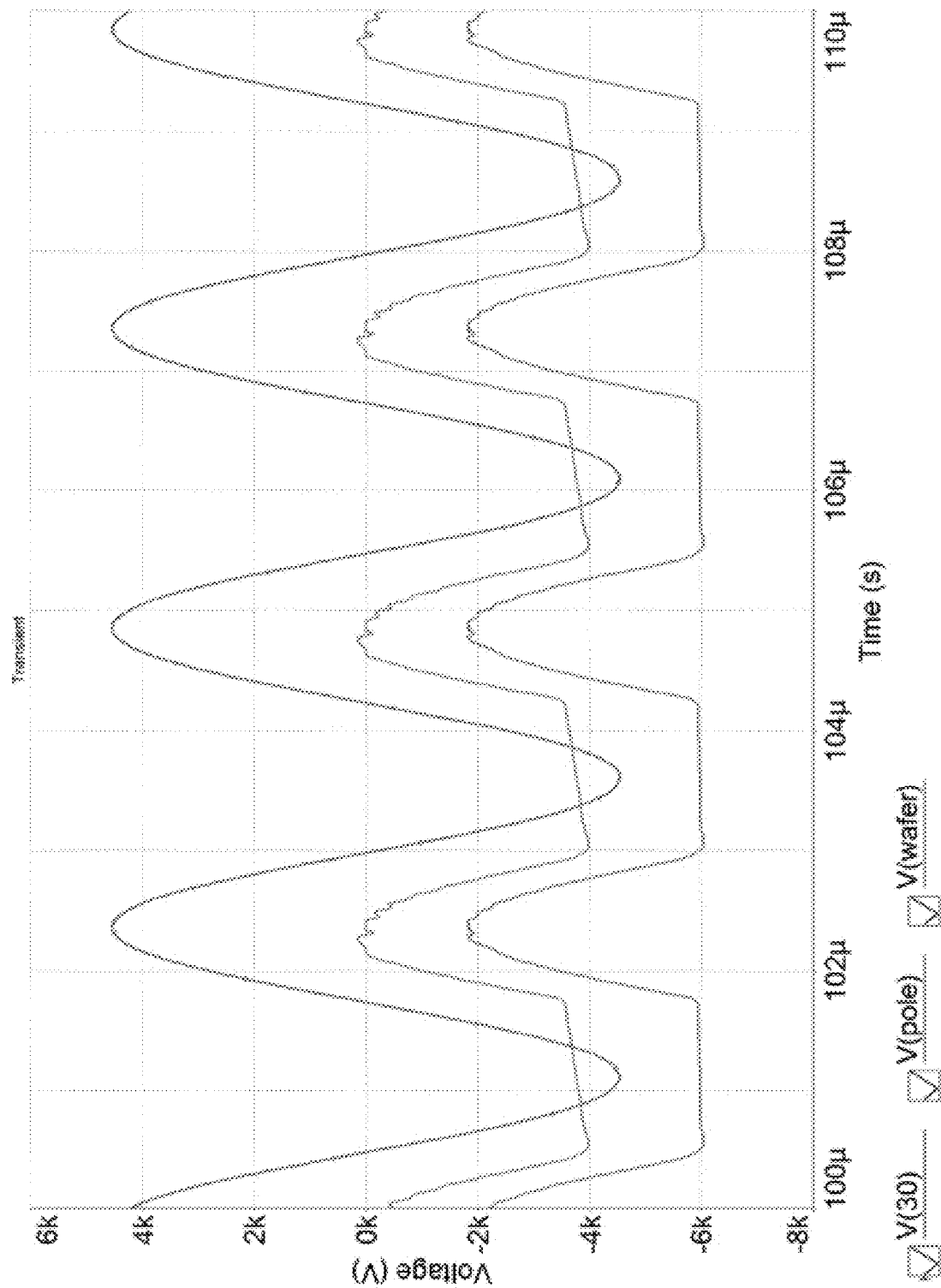
FIG. 8 is a zoomed view of the waveform shown in FIG. 7.

FIG. 7 is a waveform of the voltage across the transformer 645 (red), at the Pole (green), and at the wafer (blue) for a time frame of 600 μs. FIG. 8 is a zoomed view of the waveform over a time frame of 10 μs.

Figure 9:
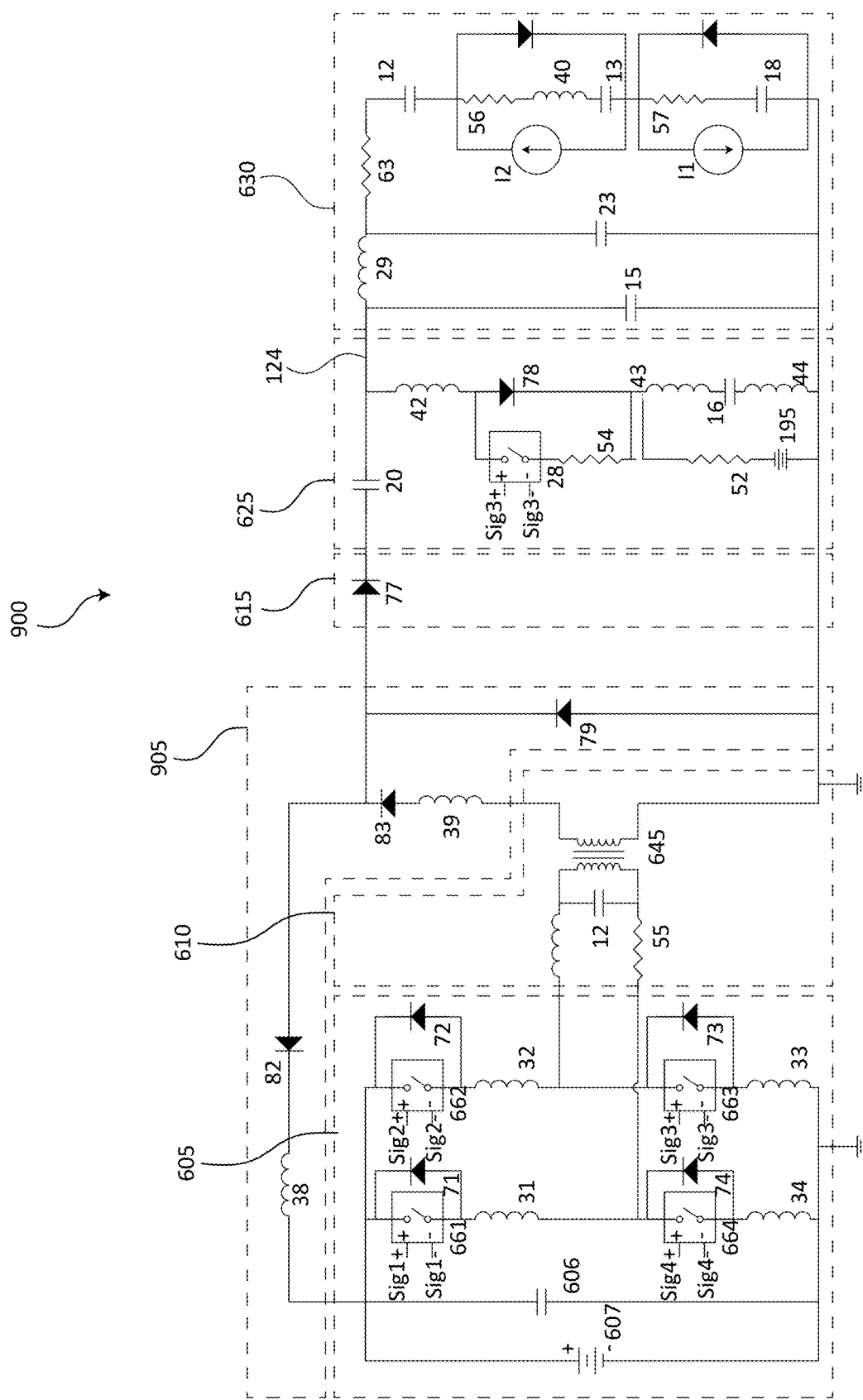
FIG. 9 is a circuit diagram of a bias generator according to some embodiments.

FIG. 9 is a circuit diagram of an bias generator 900 according to some embodiments. The bias generator 900, for example, may include the RF driver 605, the resonant circuit 610, the bias compensation circuit 625, and the load stage 630. The bias generator 900 is similar to the bias generator 600 but without the resistive output stage 620 and includes an energy recovery circuit 905.

In this example, the energy recovery circuit 905 may be positioned on or electrically coupled with the secondary side of the transformer 645. The energy recovery circuit 905, for example, may include a diode 79 (e.g., a crowbar diode) across the secondary side of the transformer 645. The energy recovery circuit 905, for example, may include diode 80 and inductor 38 (arranged in series), which can allow current to flow from the secondary side of the transformer 645 to charge the energy storage capacitor 606 and current to flow to the load stage 630. The diode 82 and the inductor 38 may be electrically connected with the secondary side of the transformer 645 and coupled with the power supply 607. In some embodiments, the energy recovery circuit 905 may include diode 83 and/or inductor 39 electrically coupled with the secondary of the transformer 645. The inductor 38 may represent the stray inductance and/or may include the stray inductance of the transformer 645.

When the nanosecond pulser is turned on, current may charge the load stage 630 (e.g., charge the capacitor 13, resonant capacitor 12, or capacitor 18). Some current, for example, may flow through inductor 38 when the voltage on the secondary side of the transformer 645 rises above the charge voltage on the power supply 607. When the nanosecond pulser is turned off, current may flow from the capacitors within the load stage 630 through the inductor 38 to charge the energy storage capacitor 606 until the voltage across the inductor 38 is zero. The diode 79 may prevent the capacitors within the load stage 630 from ringing with the inductance in the load stage 630 or the bias compensation circuit 625.

The diode 82 may, for example, prevent charge from flowing from the energy storage capacitor 606 to the capacitors within the load stage 630.

The value of inductor 38 can be selected to control the current fall time. In some embodiments, the inductor 38 can have an inductance value between 1 µH-500 µH.

In some embodiments, the energy recovery circuit 905 may include a switch that can be used to control the flow of current through the inductor 38. The switch, for example, may be placed in series with the inductor 38. In some embodiments, the switch may be closed when the bridge switch 661 is open and/or no longer pulsing to allow current to flow from the load stage 630 back to the power supply 607.

A switch in the energy recovery circuit 905, for example, may include a high voltage switch such as, for example, the high voltage switch disclosed in U.S. patent application Ser. No. 16/178,565 filed Nov. 1, 2018, titled "HIGH VOLTAGE SWITCH WITH ISOLATED POWER," which claims priority to U.S. Provisional Patent Application No. 62/717,637 filed Aug. 10, 2018, both of which are incorporated by reference in the entirety. In some embodiments, the RF driver 605 may include a high voltage switch in place of or in addition to the various components shown in RF driver 605. In some embodiments, using a high voltage switch may allow for removal of at least the transformer 645 and the bridge switch 661.

Figure 10:
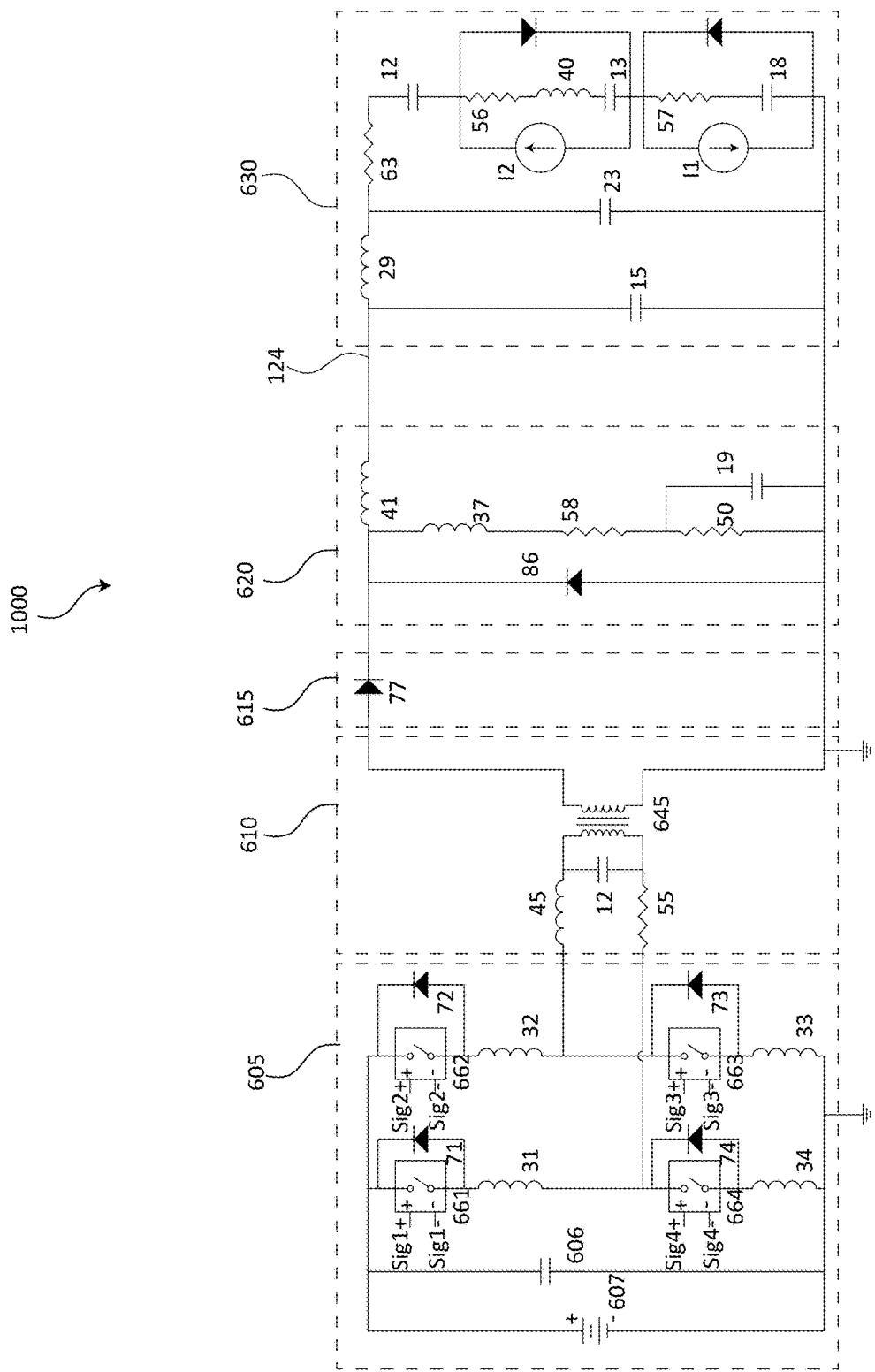
FIG. 10 is a circuit diagram of a bias generator according to some embodiments.

FIG. 10 is a circuit diagram of a bias generator 1000 according to some embodiments. The bias generator 1000, for example, may include the RF driver 605, the resonant circuit 610, the resistive output stage 620, and the load stage 630. Thus, bias generator 1000 is similar to the bias generator 600 without the bias compensation circuit 625.

Figure 11:
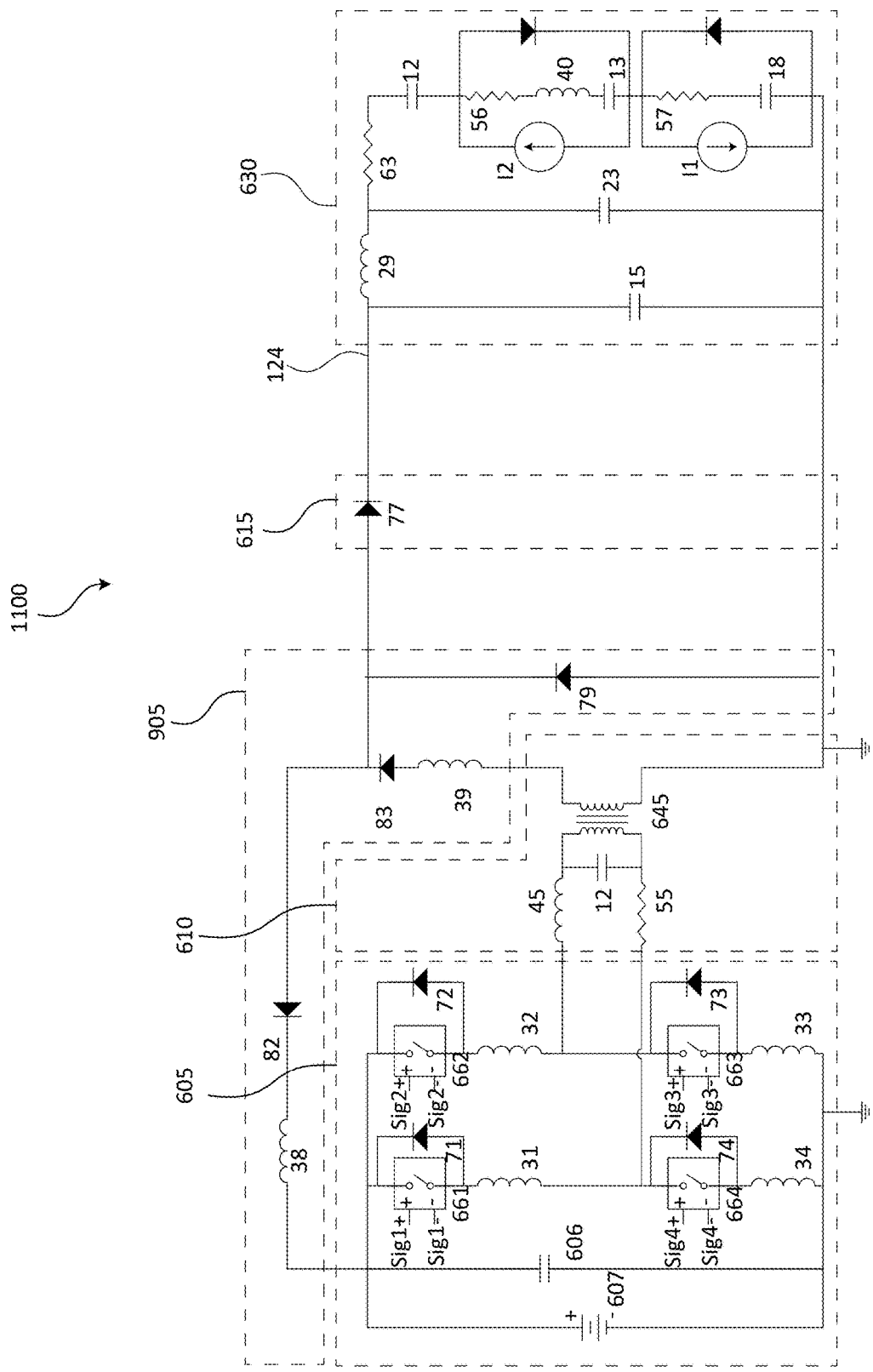
FIG. 11 is a circuit diagram of a bias generator according to some embodiments.

FIG. 11 is a circuit diagram of a bias generator 1100 according to some embodiments. The bias generator 1100, for example, may include the RF driver 605, the resonant circuit 610, the energy recovery circuit 905, and the load stage 630. Thus, bias generator 1100 is similar to the bias generator 900 without the bias compensation circuit 625.

Figure 12:
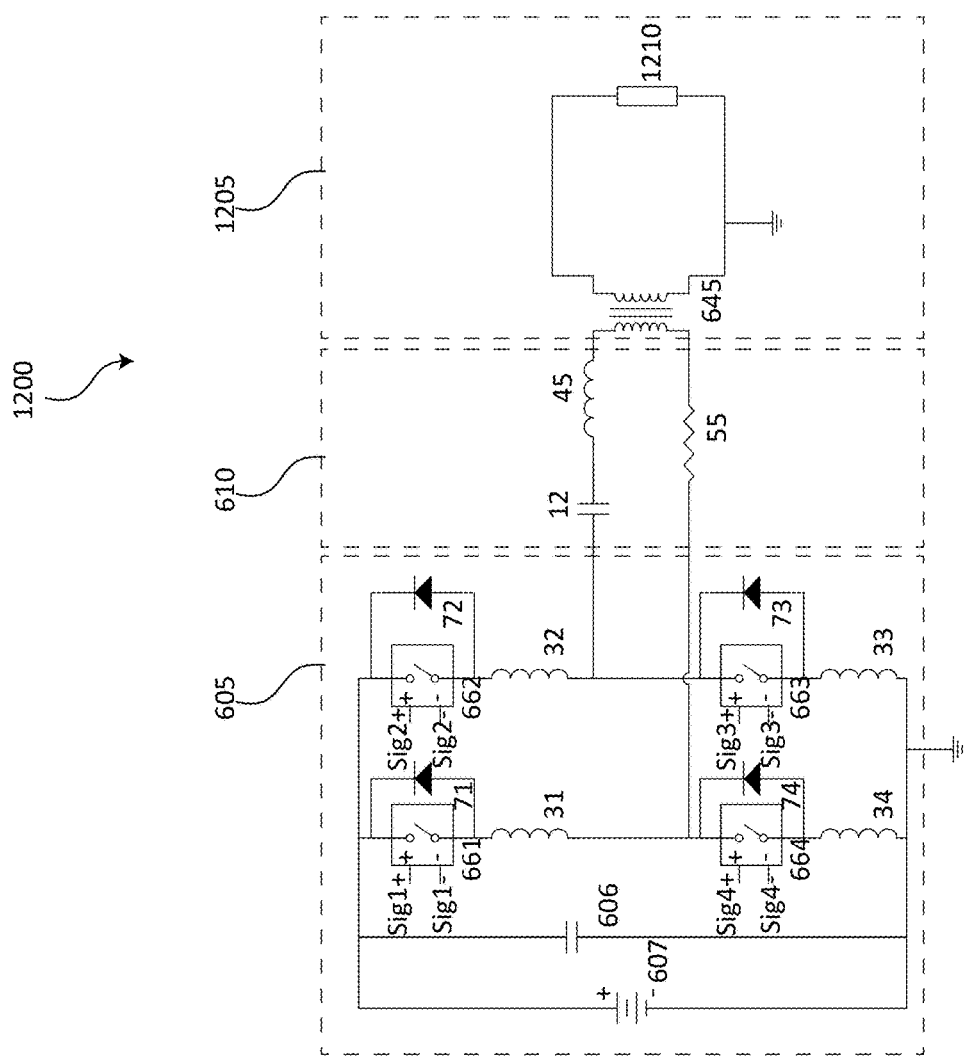
FIG. 12 is a circuit diagram of an RF plasma generator according to some embodiments.

FIG. 12 is a circuit diagram of an RF plasma generator 1200 according to some embodiments. The RF plasma generator 1200, for example, may include the RF driver 605, the resonant circuit 610, and an inductively discharged plasma 1205, which may include plasma load 1210. In this example, the inductor 46 may include the antenna that is coupled with or disposed within the inductively discharged plasma 1205. The transformer 645 may represent how the inductively discharged plasma 1205 couples with the antenna, which is represented at least in part by the inductor 46. The resonant capacitor 12 may resonate with the inductor 46 to determine the resonate frequency. The RF driver 605 may produce pulses that are driven with this resonant frequency.

Figure 13:
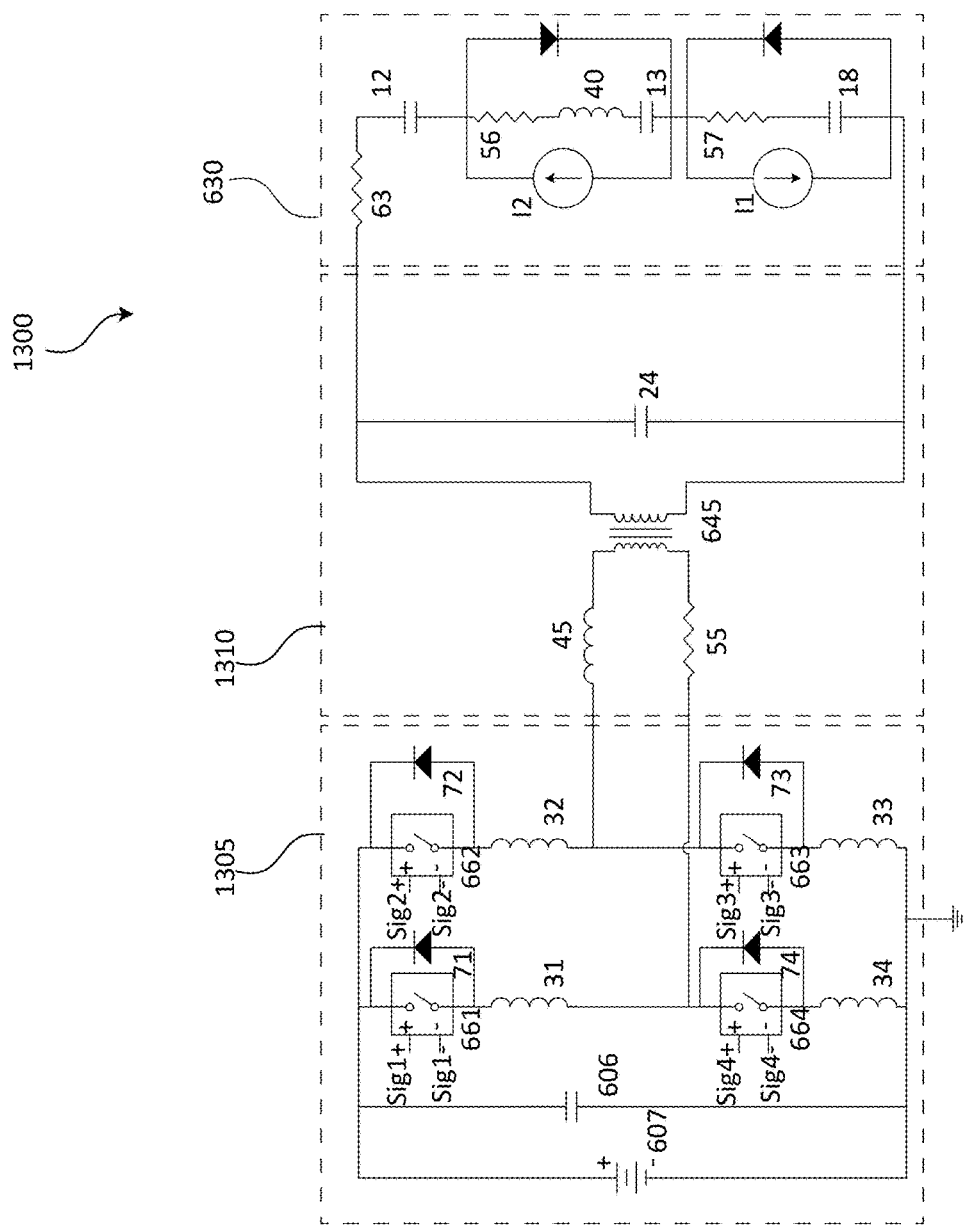
FIG. 13 is a circuit diagram of an RF plasma generator according to some embodiments.
Figure 14A:
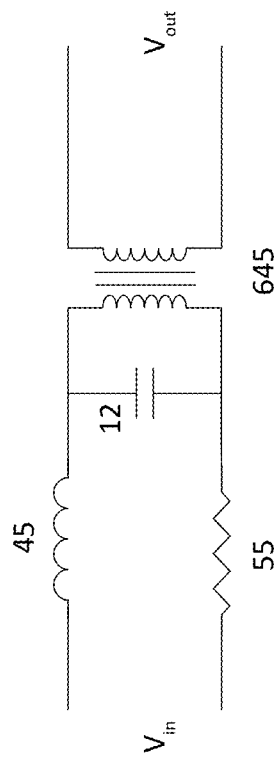
FIGS. 14A, 14B, 15A, and 15B are circuit diagrams of example resonant circuits.
Figure 14B:
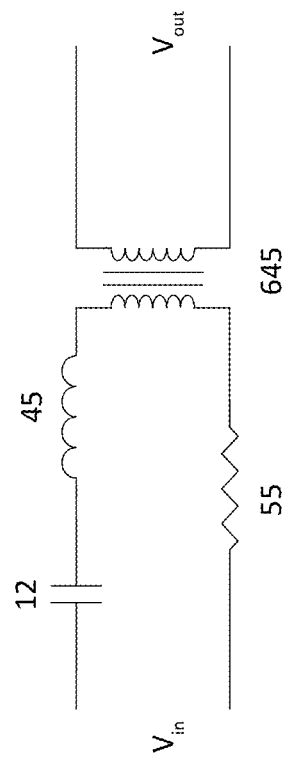
Figure 15A:
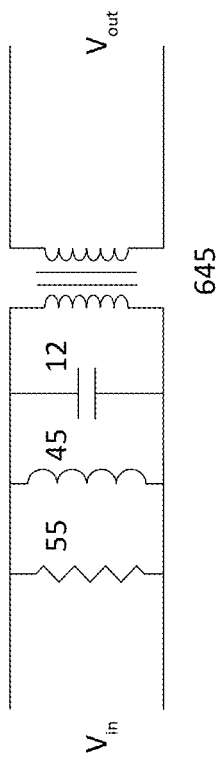
Figure 15B:
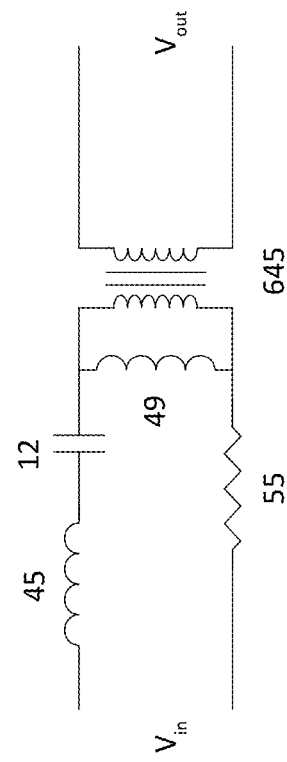

FIG. 13 is a circuit diagram of an RF plasma generator 1300 according to some embodiments. The RF plasma generator 1300, for example, may include the RF driver 1305, the resonant circuit 1310, which may include the transformer, and the load stage 630. The capacitor 24 may represent the capacitance of the discharge geometry, any stray capacitance in the circuit, or the capacitance of any capacitors in the circuit. Inductor 45 may represent the inductance of any stray inductance in the circuit or the inductance of any inductance in the circuit. The RF driver 1305 may drive the resonant circuit 1310 with a pulse frequency that is substantially equal to the resonate frequency of the resonant circuit 1310.

In some embodiments, each bridge switch 661, 662, 664, or 664 in the RF driver 1305 can be switched independently or in conjunction with one or more of the other switches. For example, the signal Sig1 may be the same signal as signal Sig3. As another example, the signal Sig2 may be the same signal as signal Sig4. As another example, each signal may be independent and may control each bridge switch 661, 662, 664, or 664 independently or separately.

In some embodiments, the transformer 645 may or may not be included in the RF plasma generator 1300.

FIGS. 14A, 14B, 15A, and 15B are circuit diagrams of example resonant circuits that may be used in place of resonant circuit 610 in FIG. 6. These circuits may or may not include the transformer shown in each figure.

Figure 16:
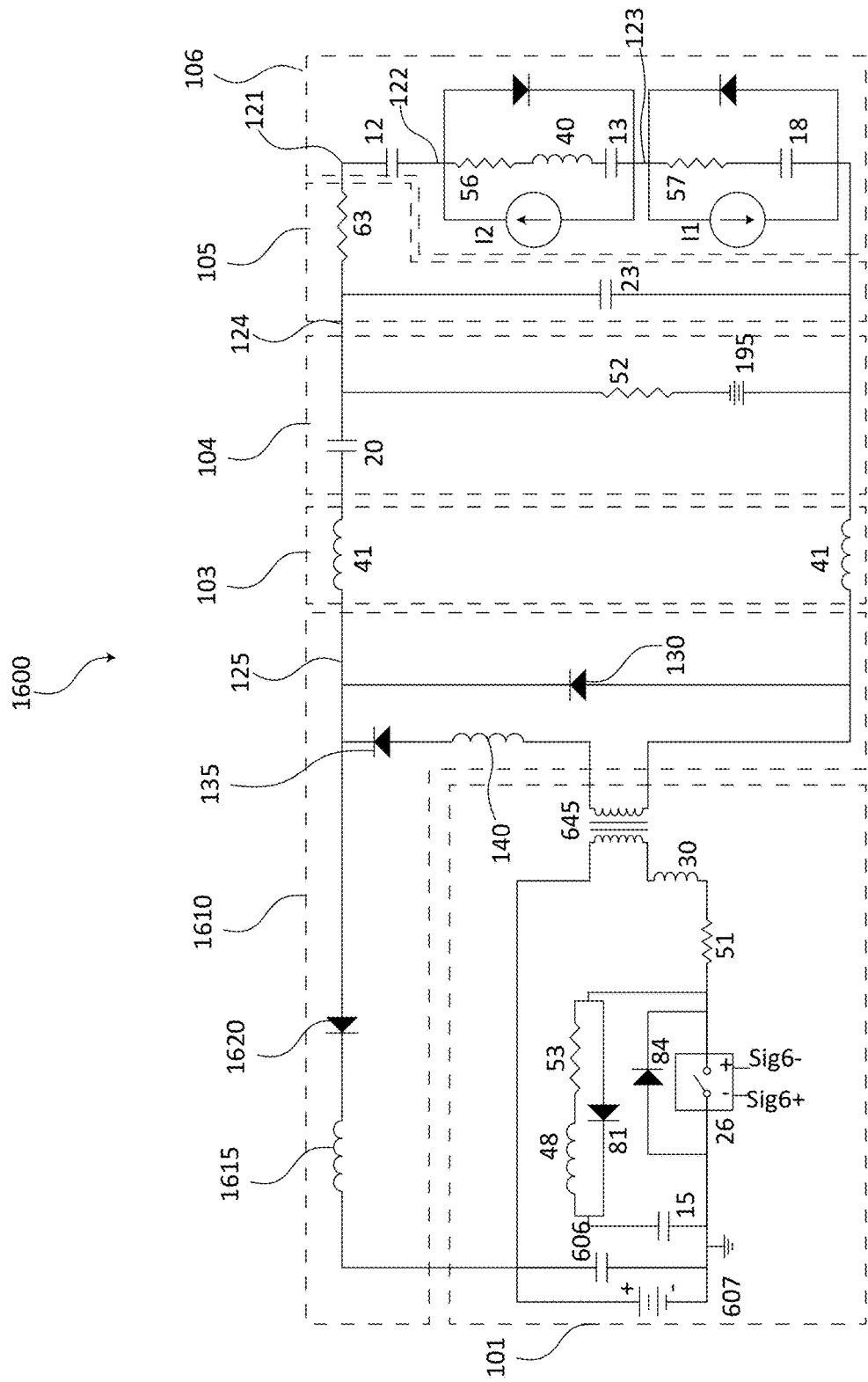
FIG. 16 is a circuit diagram of a bias generator with an energy recovery circuit according to some embodiments.

FIG. 16 is a circuit diagram of a bias generator 1600 that includes a nanosecond pulser stage 101 with an energy recovery circuit 1610, a transformer 645, a lead stage 103, a DC bias circuit 104, and a load stage 106.

In some embodiments, the load stage 106 may represent an idealized or effective circuit for semiconductor processing chamber such as, for example, a plasma deposition system, semiconductor fabrication system, plasma sputtering system, etc. The capacitance 12, for example, may represent the capacitance of an electrostatic chuck upon which a semiconductor process wafer may sit. The chuck, for example, may comprise a dielectric material (e.g., aluminum oxide, or other ceramic materials and a conductor housed within the dialectic material). For example, the capacitor 23 may have small capacitance (e.g., about 10 pF, 100 pF, 500 pF, 1 nF, 10 nF, 100 nF, etc.).

The capacitor 13, for example, may represent the sheath capacitance between the plasma to the wafer. The resistor 56, for example, may represent the sheath resistance between the plasma and the wafer. The inductor 40, for example, may represent the sheath inductance between the plasma and the wafer. The current source I2, for example, may be represent the ion current through the sheath. For example, the capacitor 23 or the capacitor 13 may have small capacitance (e.g., about 10 pF, 100 pF, 500 pF, 1 nF, 10 nF, 100 nF, etc.).

The capacitor 18, for example, may represent the plasma sheath capacitance to the wall of the chamber. The resistor 57, for example, may represent resistance between the plasma and the chamber wall. The current source I1, for example, may be representative of the ion current in the plasma. For example, the capacitor 23 or the capacitor 18 may have small capacitance (e.g., about 10 pF, 100 pF, 500 pF, 1 nF, 10 nF, 100 nF, etc.).

In some embodiments, the plasma voltage may be the voltage measured from ground to circuit point 123; the wafer voltage is the voltage measured from ground to circuit point 122 and may represent the voltage at the surface of the wafer; the chucking voltage is the voltage measured from ground to circuit point 121; the electrode voltage is the voltage measure from ground to circuit point labeled 124 (e.g., on the electrode); and the input voltage is the voltage measured from ground to circuit point 125.

In this example, the DC bias circuit 104 does not include any bias compensation. The DC bias circuit 104 includes an offset supply voltage 195 that may, for example, bias the output voltage either positively or negatively. In some embodiments, the offset supply voltage 195, can be adjusted to change the potential between the wafer voltage and the chuck voltage. In some embodiments, offset supply voltage 195 can have a voltage of about ±5 kV, ±4 kV, ±3 kV, ±2, kV, ±1 kV, etc. kV.

In some embodiments, the blocking capacitor 20 can isolate (or separate) the DC bias voltage from other circuit elements. The blocking capacitor 20, for example, may allow for a potential shift from one portion of the circuit to another. In some embodiments, this potential shift may ensure that the electrostatic force holding the wafer in place on the chuck remains below the voltage threshold. The resistor 52 may isolate the DC bias supply from the high voltage pulsed output from the nanosecond pulser stage 101.

The blocking capacitor 20, for example, may have a capacitance less than about 100 pF, 10 pF, 1 pF, 100 µF, 10 µF, 1 µF, etc. The resistor 52, for example, may have a high resistance such as, for example, a resistance of about 1 kOhm, 10 kOhm, 100 kOhm, 1 MOhm, 10 MOhm, 100 MOhm, etc.

The resistor 63, for example, may represent the resistance of the leads or transmission lines that connect from the output of the high voltage power system to the electrode (e.g., the load stage 106). The capacitors 23, for example, may represent stray capacitance in the leads or transmissions line.

In some embodiments, the nanosecond pulser stage 101 may produce pulses with high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

For example, the nanosecond pulser stage 101 may include all or any portion of any device described in U.S. patent application Ser. No. 14/542,487, titled "High Voltage Nanosecond Pulser," which is incorporated into this disclosure for all purposes, or all or any portion of any device described in U.S. patent application Ser. No. 14/635,991, titled "Galvanically Isolated Output Variable Pulse Generator Disclosure," which is incorporated into this disclosure for all purposes, or all or any portion of any device described in U.S. patent application Ser. No. 14/798,154, titled "High Voltage Nanosecond Pulser With Variable Pulse Width and Pulse Repetition Frequency," which is incorporated into this disclosure for all purposes.

In some embodiments, the nanosecond pulser stage 101 may include one or more nanosecond pulsers coupled together in any number of ways.

In some embodiments, the nanosecond pulser stage 101 may include a DC power supply providing a consistent DC voltage that is switched by switch 26 and provides the switched power to the transformer 645. The DC power supply may include a voltage source 607 and an energy storage capacitor 606. If the transformer 645 has a 1:10 turn ratio, then the transformer may produce 10 kV on the load stage 106.

In some embodiments, if the load capacitance (e.g., capacitor 13 and capacitor 18) is small in comparison with the capacitance of the energy storage capacitor 606, voltage doubling may (or may not) occur at the transformer input. For example, if the energy storage capacitor 606 provides 500 V, then 1 kV may be measured at the input of the transformer 645.

The switch 26, for example, may include one or more solid state switches such as, for example, an IGBT, a MOSFET, a SiC MOSFET, SiC junction transistor, FETs, SiC switches, GaN switches, photoconductive switch, etc. The switch 26 may be switched based on a signal from a controller labeled Sig6+ and Sig6−.

In some embodiments, the nanosecond pulser stage 101 may include snubber circuit that may include any type of snubber circuit. In some embodiments, the snubber circuit may include a capacitor. In some embodiments, the snubber circuit may include a capacitor and a resistor. In some embodiments, the snubber circuit may include a capacitor, an inductor, and a resistor In some embodiments, the snubber circuit may include snubber resistor 53 in parallel with snubber diode 81, and a snubber capacitor 15. The snubber circuit may also include stray inductance. In some embodiments, the snubber resistor 53 and/or the snubber diode 81 may be placed between the collector of switch 26 and the primary winding of the transformer 645. The snubber diode 81 may be used to snub out any over voltages in the switching. A large and/or snubber capacitor 15 may be coupled on the emitter side of the switch 26. The freewheeling diode 84 may also be coupled with the emitter side of the bridge switch 661. Various other components may be included that are not shown in the figures. One or more switches and or circuits can be arranged in parallel or series.

In some embodiments, the switch 26 may switch so fast that the switched voltage may never be at full voltage (e.g., the voltage of the energy storage capacitor 606 and/or the voltage source 607). In some embodiments, a gate resistor coupled with the switch 26 may be set with short turn on pulses.

In some embodiments, the nanosecond pulser stage 101 may include a freewheeling diode 84. In some embodiments, the freewheeling diode 84 may be used in combination with inductive loads to ensure that energy stored in the inductive load may be allowed to dissipate after the switch 26 is opened by allowing current to keep flowing in the same direction through the inductor and energy is dissipated in the resistive elements of the circuit. If a freewheeling diode 84 is not included, then this can, for example, lead to a large reverse voltage on the switch 26.

In some embodiments, the nanosecond pulser stage 101 may include stray inductance 30 and/or stray resistance 51. The stray inductance 30, for example, may be less than about 10 nH, 100 nH, 1,000 nH, 10,000 nH, etc. The stray resistance 51, for example, may be less than about 1 Ohm, 100 mOhm, 10 mOhm, etc.

In some embodiments, the energy recovery circuit 1610 may be electrically coupled with the secondary side of the transformer and/or with the energy storage capacitor 606. The energy recovery circuit 1610, for example, may include a diode 130 (e.g., a crowbar diode) across the secondary side of the transformer 645. The energy recovery circuit 1610, for example, may include energy recovery diode 1620 and the energy recovery inductor 1615 (arranged in series), which can allow current to flow from the secondary side of the transformer 645 to charge the energy storage capacitor 606. The energy recovery diode 1620 and the energy recovery inductor 1615 may be electrically connected with the secondary side of the transformer 645 and the energy storage capacitor 606. In some embodiments, the energy recovery circuit 1610 may include diode 130 and/or inductor 140 electrically coupled with the secondary of the transformer 645. The inductor 140 may represent the stray inductance and/or may include the stray inductance of the transformer 645.

In some embodiments, the energy recovery inductor 1615 may include any type of inductor such as, for example, a ferrite core inductor or an air core inductor. In some embodiments, the energy recovery inductor 1615 may have any type of geometry such as, for example, a solenoidal winding, a toroidal winding, etc. In some embodiments, the energy recovery inductor 1615 may have an inductance greater then about 10 µH, 50 µH, 100 µH, 500 µH, etc. In some embodiments, the energy recovery inductor 1615 may have an inductance of about 1 µH to about 100 mH.

In some embodiments, when the nanosecond pulser is turned on, current may charge the load stage 106 (e.g., charge the capacitor 13, resonant capacitor 12, or capacitor 18). Some current, for example, may flow through energy recovery inductor 1615 when the voltage on the secondary side of the transformer 645 rises above the charge voltage on the energy storage capacitor 606. When the nanosecond pulser is turned off, current may flow from the capacitors within the load stage 106 (e.g., capacitor 23) through the energy recovery inductor 1615 to charge the energy storage capacitor 606 until the voltage across the energy recovery inductor 1615 is zero. The diode 130 may prevent the capacitors within the load stage 106 from ringing with the inductance in the load stage 106 or the DC bias circuit 104.

The energy recovery diode 1620 may, for example, prevent charge from flowing from the energy storage capacitor 606 to the capacitors within the load stage 106.

The value of energy recovery inductor 1615 can be selected to control the current fall time. In some embodiments, the energy recovery inductor 1615 can have an inductance value between 1 µH-600 µH. In some embodiments, the energy recovery inductor 1615 can have an inductance value greater than 50 µH. In some embodiments, the energy recovery inductor 1615 may have an inductance less than about 50 µH, 100 µH, 150 µH, 200 µH, 250 µH, 300 µH, 350 µH, 350 µH, 400 µH, 400 µH, 500 µH, etc.

For example, if the energy storage capacitor 606 provides 500 V, then 1 kV will be measured at the input of the transformer 645 (e.g., as noted above due to voltage doubling). The 1 kV at the transformer 645 may be divided among the components of the energy recovery circuit 1610 when the switch 26 is open. If the values are chosen appropriately (e.g., inductor 140 has an inductance less than the inductance of energy recovery inductor 1615), the voltage across the energy recovery diode 1620 and the energy recovery inductor 1615 may be greater than 500 V. Current may then flow through energy recovery diode 1620 and/or charge the energy storage capacitor 606. Current may also flow through diode 135 and inductor 140. Once the energy storage capacitor 606 is charged, the current may no longer flow through energy recovery diode 1620 and energy recovery inductor 1615.

In some embodiments, the energy recovery circuit 1610 may transfer energy (or transfer charge) from the load stage 106, for example, on fast time scales (e.g., 1 ns, 10 ns, 50 ns, 100 ns, 250 ns, 500 ns, 1,000 ns, etc. time scales). The stray resistance of the energy recovery circuit may be low to ensure the pulse across the load stage 106 has a fast fall time $t_f$. The stray resistance of the energy recovery circuit 1610, for example, may have a resistance less than about 1 Ohm, 100 mOhm, 10 mOhm, etc. In some embodiments, the energy transfer efficiency from the load stage 106 may be high such as, for example, greater than about 60%, 70%, 80%, or 90%, etc.

Any number of components shown in FIG. 16 may or may not be required such as, for example, the diode 135 or the diode 130 or the inductor 140.

In some embodiments, a diode may be placed between the voltage source 607 and the point where the energy recovery circuit 1610 connects with the voltage source 607 and/or the energy storage capacitor 606. This diode, for example, may be arranged to allow current to flow from the voltage source 607 to the energy storage capacitor 606 but may not allow current to flow from the energy recovery circuit to the energy storage capacitor 606.

1700 is a circuit diagram of a bias generator 1700 that includes a nanosecond pulser stage 101 with an active energy recovery circuit 111 having an energy recovery switch 25 according to some embodiments. The energy recovery switch 25 may be switched based on a signal from a controller labeled Sig5+ and Sig5−.

Figure 17:
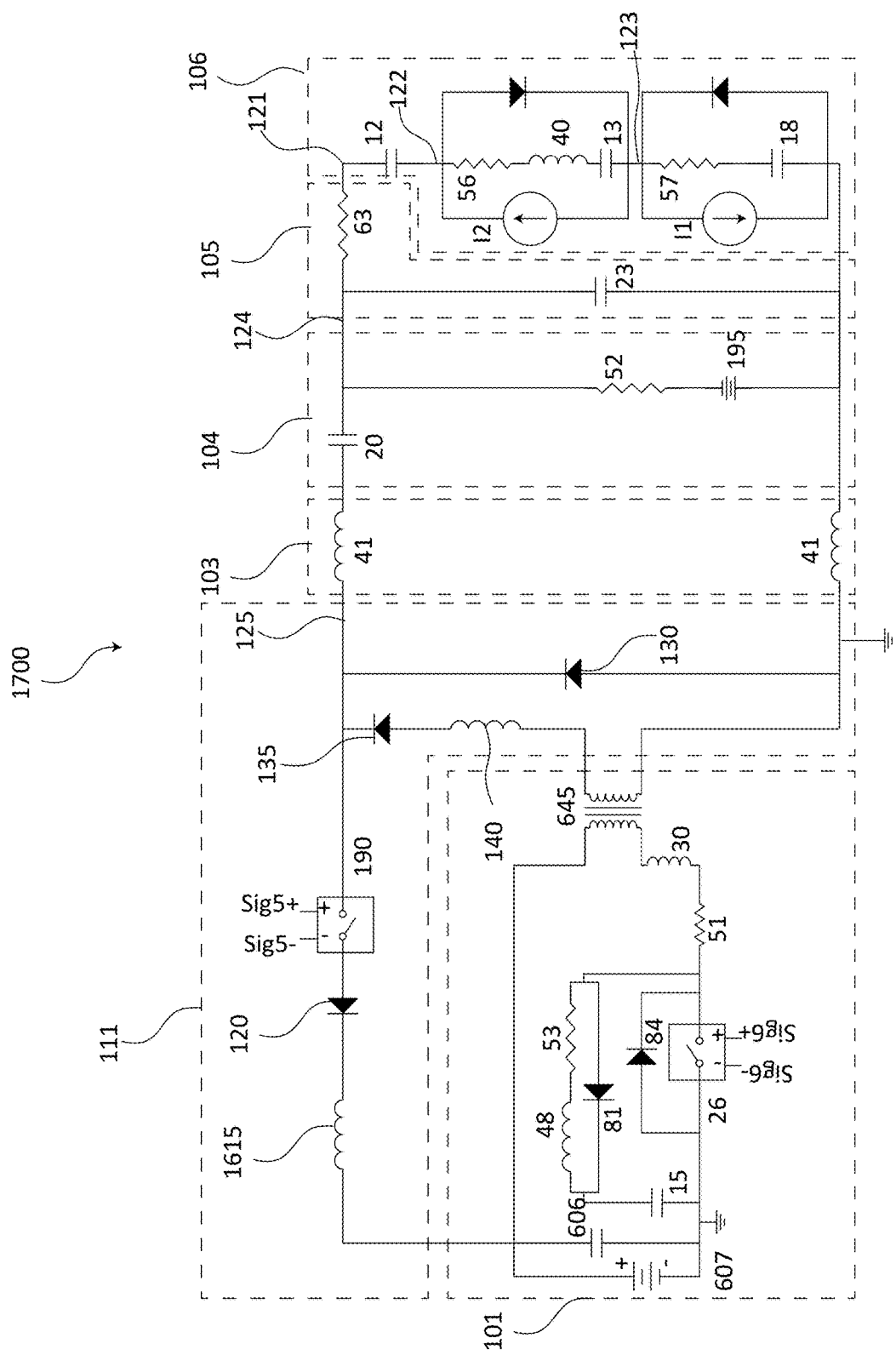
FIG. 17 is a circuit diagram of a bias generator with an active energy recovery circuit according to some embodiments.

In FIG. 17, the active energy recovery circuit 111 may include an energy recovery switch 25 that can be used to control the flow of current through the energy recovery inductor 1615. In some embodiments, the energy recovery switch 25 may include a freewheeling diode arranged across the energy recovery switch. The energy recovery switch 25, for example, may be placed in series with the energy recovery inductor 1615. In some embodiments, the energy recovery switch 25 may be opened and closed based on a signal from Sig5+ and/or Sig5−. In some embodiments, the switching input 190 may close the energy recovery switch when the bridge switch 661 is open and/or no longer pulsing to allow current to flow from the load stage 106 back to the voltage source 607. In some embodiments, the switching signal from Sig5+ and/or Sig5− may open the energy recovery switch when the bridge switch 661 is closed and/or pulsing to restrict current from flowing to the voltage source 607.

The energy recovery switch 25 in FIG. 17 is shown in series with the energy recovery diode 1620 and the energy recovery inductor 1615 and is placed between the secondary side of the transformer 645 and both the energy recovery diode 1620 and the energy recovery inductor 1615. In some embodiments, both the energy recovery diode 1620 and the energy recovery inductor 1615 may be placed between the energy recovery switch 25 and the secondary side of the transformer 645. In some embodiments, the energy recovery switch 25 may be placed between the energy recovery diode 1620 and the energy recovery inductor 1615. The energy recovery diode 1620, the energy recovery inductor 1615, and the energy recovery switch 25 may be arranged in any order.

The energy recovery switch 25, for example, may include a high voltage switch such as, for example, the high voltage switch 2300.

In some embodiments, the load stage 106 may be charged by the nanosecond pulser stage 101 while the energy recovery switch 25 is open. It may be beneficial to remove the charge from the load stage 106 such as, for example, on fast time scales (e.g., less than about 1 ns, 10 ns, 50 ns, 100 ns, 250 ns, 500 ns, 1,000 ns, etc.). To remove the charge from the load stage 106, the energy recovery switch 25 may be closed.

Figure 18:
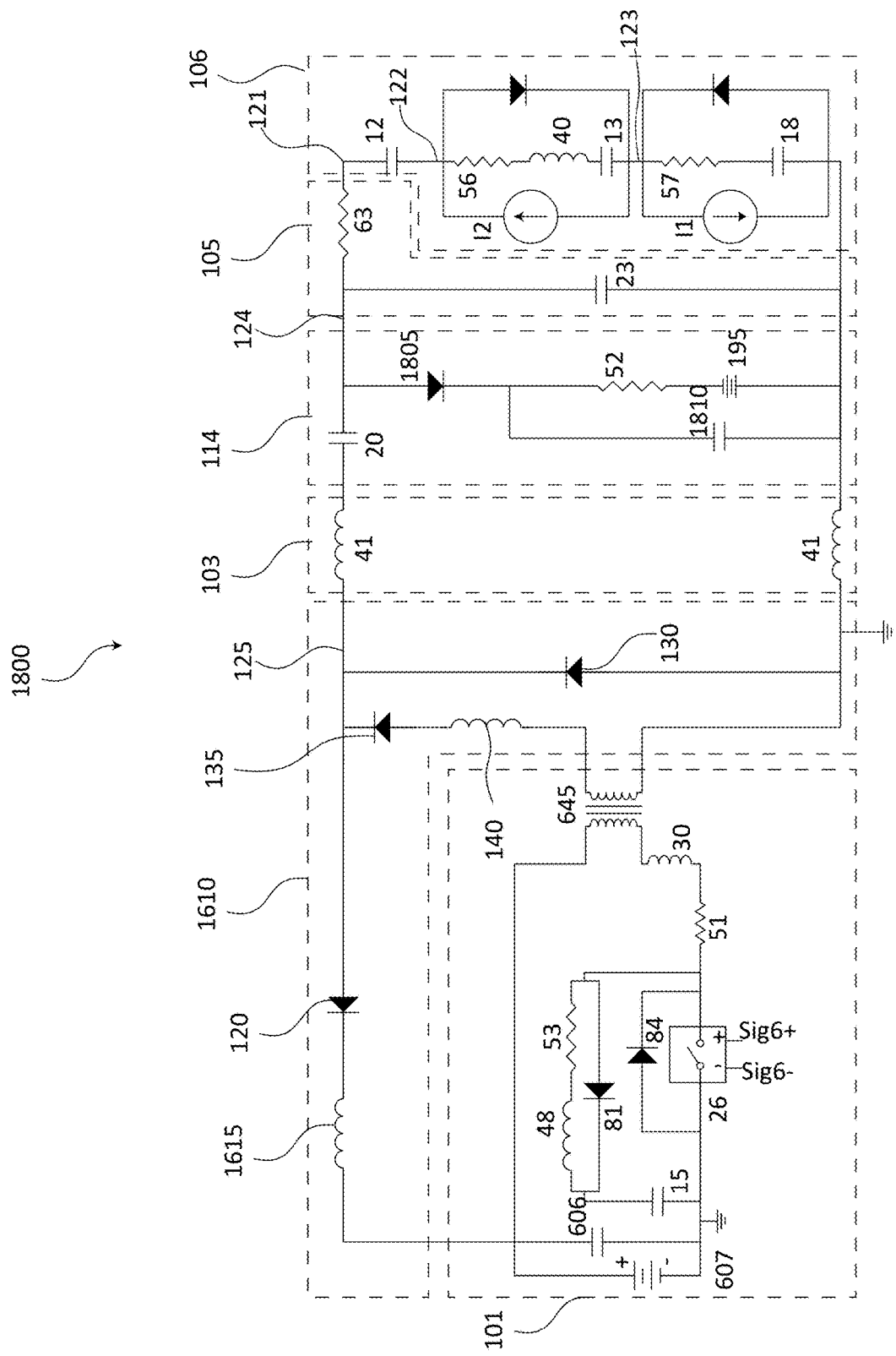
FIG. 18 is a circuit diagram of a bias generator that includes a passive bias compensation circuit an energy recovery circuit according to some embodiments.

FIG. 18 is a circuit diagram of a bias generator 1800 that includes a passive bias compensation circuit 114 with the energy recovery circuit 1610 according to some embodiments.

In this example, the passive bias compensation circuit 114 is a passive bias compensation circuit and can include a bias compensation diode 1805 and a bias compensation capacitor 1810. The bias compensation diode 1805 can be arranged in series with offset supply voltage 195. The bias compensation capacitor 1810 can be arranged across either or both the offset supply voltage 195 and the resistor 52. The bias compensation capacitor 1810 can have a capacitance less than 100 nF to 100 µF such as, for example, about 100 µF, 50 µF, 25 µF, 10 µF, 2 µF, 500 nF, 200 nF, etc.

In some embodiments, the bias compensation diode 1805 can conduct currents of between 10 A and 1 kA at a frequency of between 10 Hz and 500 kHz.

In some embodiments, the blocking capacitor 20 may allow for a voltage offset between the output of the nanosecond pulser stage 101 (e.g., at the position labeled 125) and the voltage on the electrode (e.g., at the position labeled 124). In operation, the electrode may, for example, be at a DC voltage of –2 kV during a burst (a burst may include a plurality of pulses), while the output of the nanosecond pulser alternates between +6 kV during pulses and 0 kV between pulses.

The blocking capacitor 20, for example, 100 nF, 10 nF, 1 nF, 100 µF, 10 µF, 1 µF, etc. The resistor 52, for example, may have a high resistance such as, for example, a resistance of about 1 kOhm, 10 kOhm, 100 kOhm, 1 MOhm, 10 MOhm, 100 MOhm, etc.

In some embodiments, the bias compensation capacitor 1810 and the bias compensation diode 1805 may allow for the voltage offset between the output of the nanosecond pulser stage 101 (e.g., at the position labeled 125) and the voltage on the electrode (e.g., at the position labeled 124) to be established at the beginning of each burst, reaching the needed equilibrium state. For example, charge is transferred from blocking capacitor 20 into bias compensation capacitor 1810 at the beginning of each burst, over the course of a plurality of pulses (e.g., maybe about 5-100 pulses), establishing the correct voltages in the circuit.

In some embodiments, the pulse repetition frequency (e.g., the frequency of pulses within a burst) may be between 200 kHz and 800 MHz such as, for example, 2 MHz, 13.56 MHz, 27 MHz, 60 MHz, and 80 MHz etc. In some embodiments, the burst repetition frequency (e.g., the frequency of bursts) may be about 10 kHz, 50 Hz, 100 kHz, 500 kHz, 1 MHz, etc. such as, for example, 400 kHz The energy recovery circuit 1610 may or may not include an energy recovery switch as shown in FIG. 17.

Figure 19:
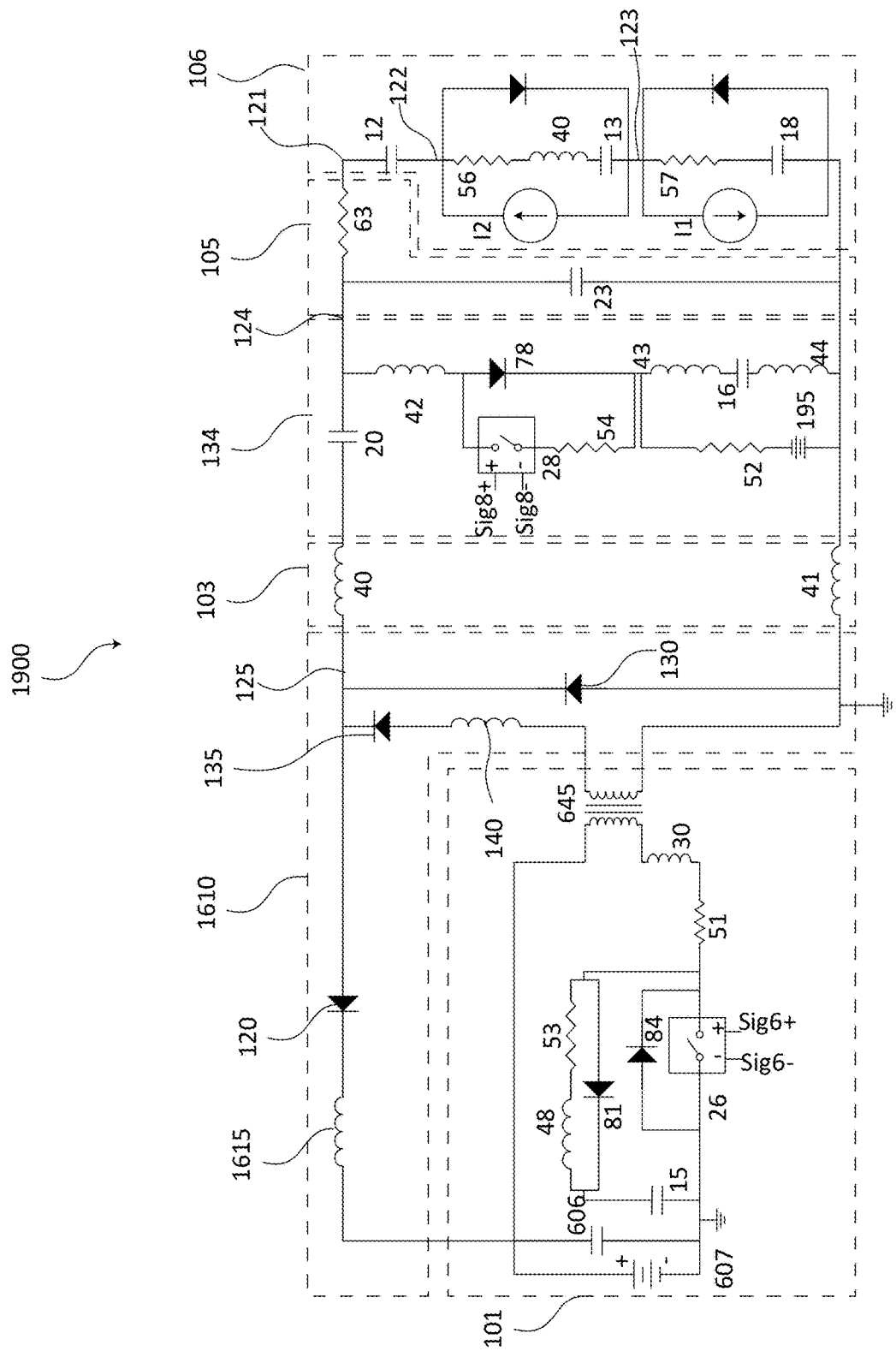
FIG. 19 is a circuit diagram of a bias generator that includes an active bias compensation circuit with an energy recovery circuit according to some embodiments.

FIG. 19 is a circuit diagram of a bias generator 1900 that includes an active bias compensation circuit 134 with the energy recovery circuit 1610 according to some embodiments.

The active bias compensation circuit 134 may include any bias and/or bias compensation circuit known in the art. For example, the active bias compensation circuit 134 may include any bias and/or bias compensation circuit described in U.S. patent application Ser. No. 16/523,840 titled "NANOSECOND PULSER BIAS COMPENSATION," which is incorporated into this disclosure in its entirety for all purposes.

In some embodiments, the active bias compensation circuit 134 of bias generator 1900 shown in FIG. 19 may include a bias capacitor 16, blocking capacitor 20, a blocking diode 78, bias compensation switch 28 (e.g., a high voltage switch), an offset supply voltage 195, resistance 52, and/or resistance 54. In some embodiments, the switch 28, for example, may include a high voltage switch such as, for example, the high voltage switch 2300 shown in FIG. 25. The bias compensation switch 28 may be switched based on a signal from a controller labeled Sig8+ and Sig8–.

In some embodiments, the offset supply voltage 195 may include a DC voltage source that can bias the output voltage either positively or negatively. In some embodiments, the blocking capacitor 20 may isolate/separate the offset supply voltage 195 from other circuit elements. In some embodiments, the active bias compensation circuit 134 may allow for a potential shift of power from one portion of the circuit to another. In some embodiments, the active bias compensation circuit 134 may be used maintain a constant chucking force between a process wafer and an electrostatic chuck. Resistance 52, for example, may protect/isolate the DC bias supply from the driver. As another example, the resistance 52 may be used to ensure that the DC supply 195 does not go into overcurrent failure.

In some embodiments, the bias compensation switch 28 may be open while the nanosecond pulser stage 101 is not actively producing pulses at greater than 10 kHz or providing a burst of pulses and closed when the nanosecond pulser stage 101 is not pulsing. While closed, the bias compensation switch 28 may, for example, allow current in the direction prevented by the blocking diode 78. Shorting this current may allow the bias between the wafer and the chuck to be less than 2 kV, which may be within acceptable tolerances.

In some embodiments, the load stage 106 may be coupled with the active bias compensation circuit 134. In some embodiments, the energy recovery circuit 1610 may or may not include an energy recovery switch as shown in FIG. 17.

Figure 20:
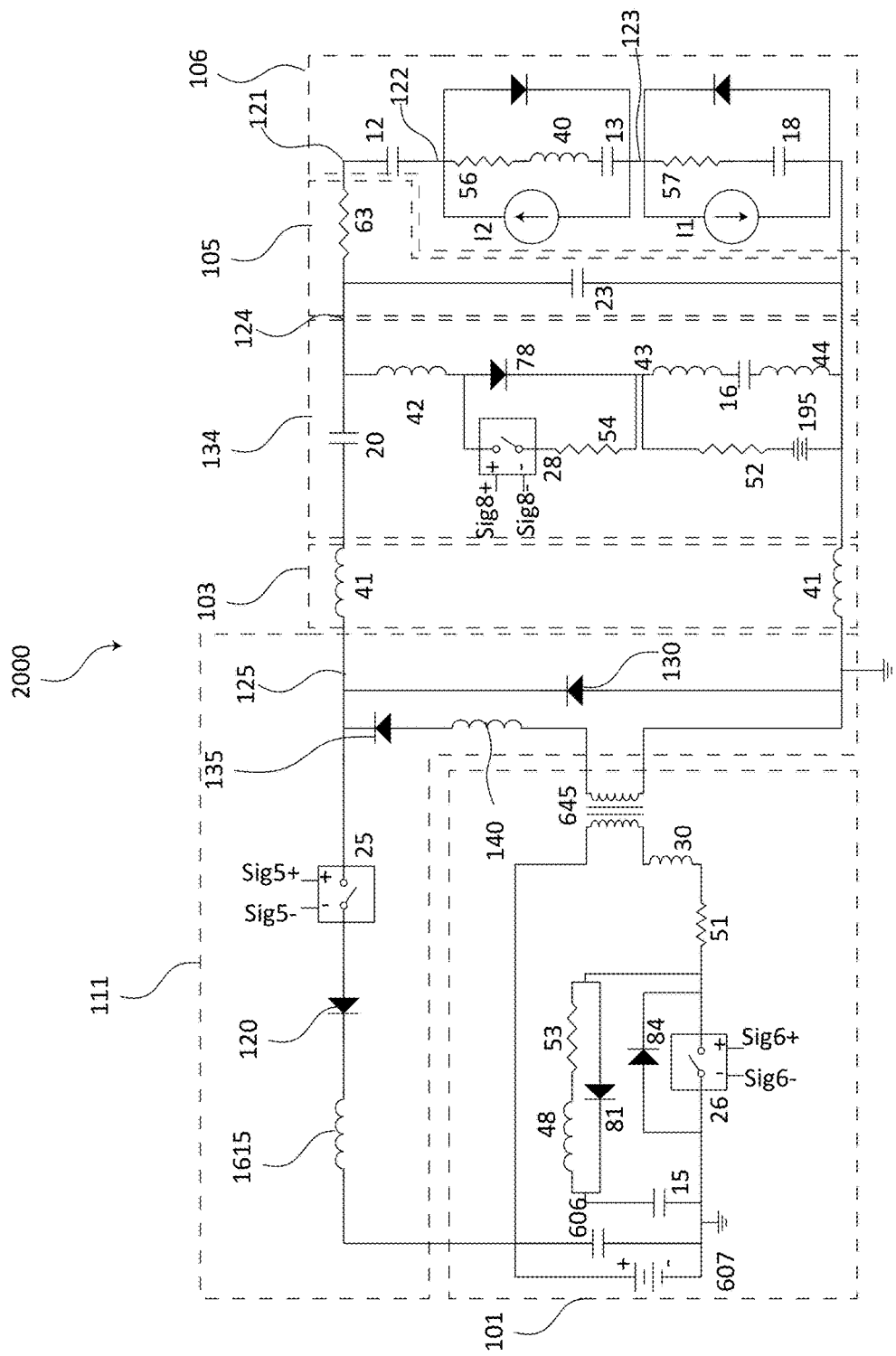
FIG. 20 is a circuit diagram of a bias generator that includes an active bias compensation circuit with an active energy recovery circuit according to some embodiments.

FIG. 20 is a circuit diagram of a bias generator 2000 that includes an active bias compensation circuit 134 with an active energy recovery circuit 111 according to some embodiments.

Figure 21:
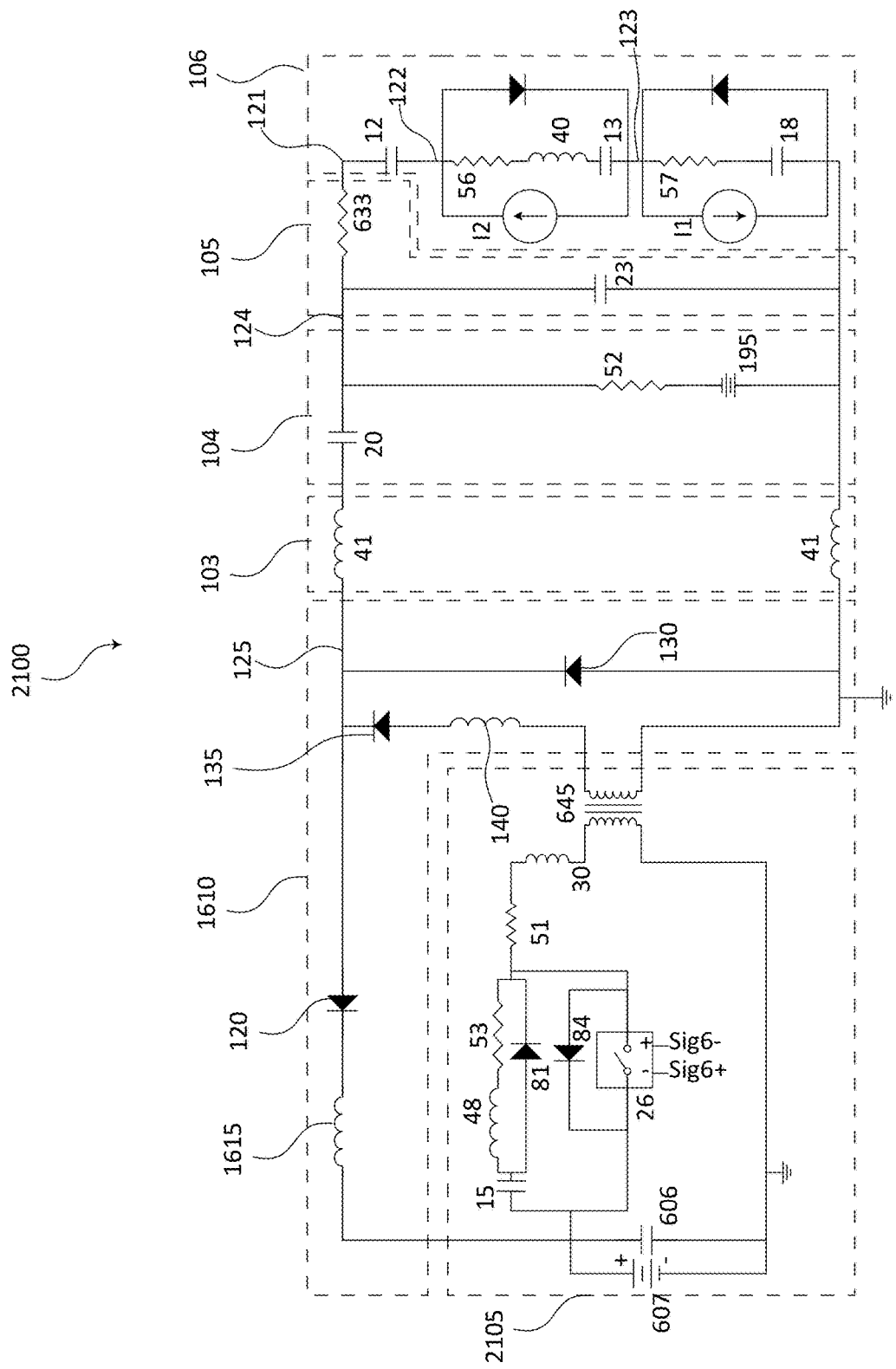
FIG. 21 is a circuit diagram of a bias generator with an energy recovery circuit according to some embodiments.

FIG. 21 is a circuit diagram of a bias generator 2100 with the energy recovery circuit 1610 according to some embodiments. In this example, the bias generator 2100 is similar to the bias generator 1600 with the nanosecond pulser stage 101 switching the other polarity of the energy storage capacitor 606. When switch 26 is open, charge on the resonant capacitor 12 flows through the energy recovery circuit 1610 to the energy storage capacitor 606 and may charge the energy storage capacitor 606. When the charge on the resonant capacitor 12 is less than the charge on the energy storage capacitor 606 the current stops flowing through the energy recovery circuit 1610. In some embodiments, the DC bias circuit 104 may be replaced with the passive bias compensation circuit 114 or the active bias compensation circuit 134. In some embodiments, the energy recovery circuit 1610 may be replaced with the active energy recovery circuit 111.

Figure 22:
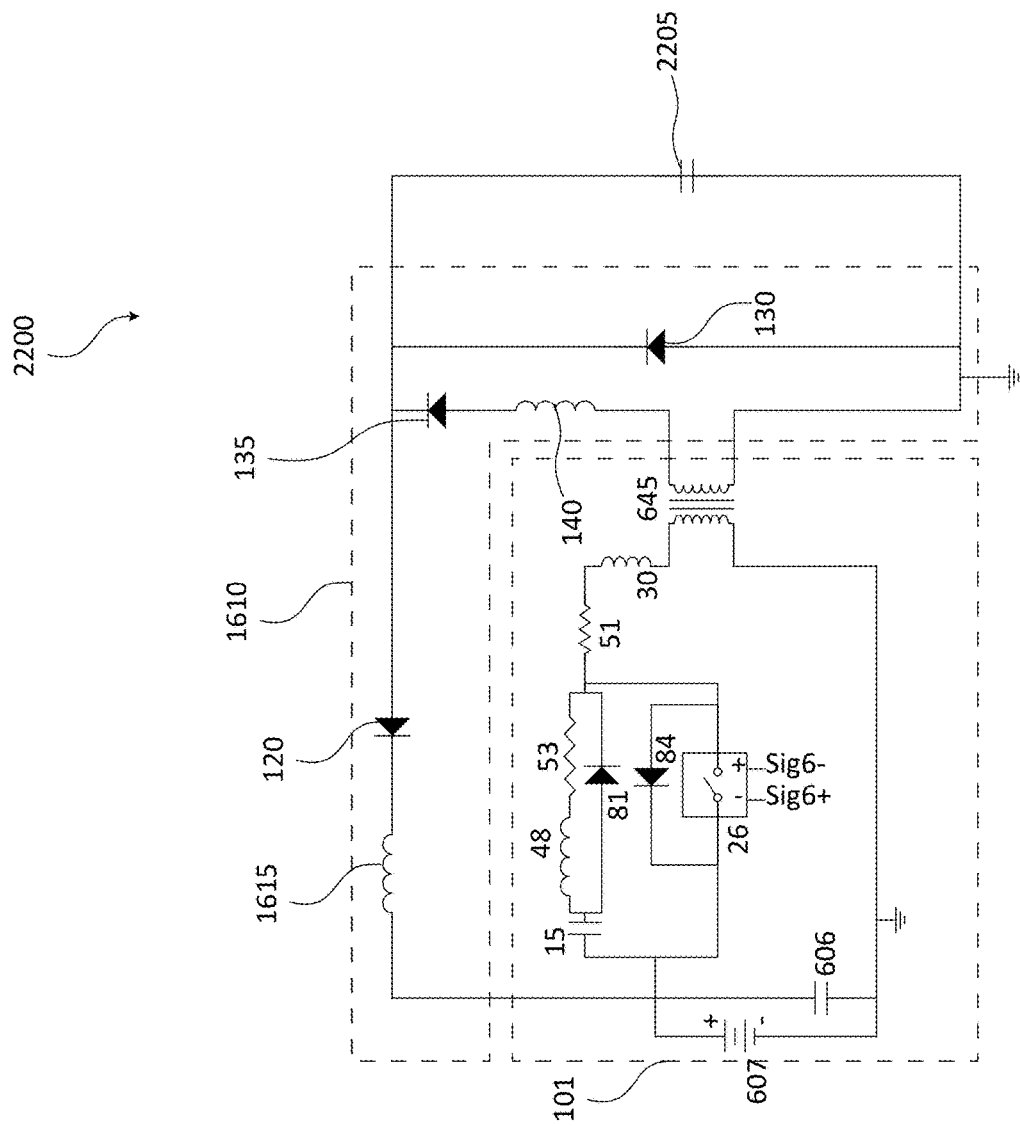
FIG. 22 is a circuit diagram of a bias generator with an energy recovery circuit driving a capacitive load according to some embodiments.

In some embodiments, a nanosecond pulser (or switches) are included that switch the ground side (see e.g., FIG. 16) or the positive side of the voltage source 607 and/or energy storage capacitor 606 (see e.g., FIG. 21 or FIG. 22). Either arrangement may be used. A figure showing one arrangement may be replaced with the other arrangement.

FIG. 22 is a circuit diagram of a bias generator 2200 with the energy recovery circuit 1610 driving a capacitive load 2205 according to some embodiments. In this example, the bias generator 2200 is similar to the bias generator 1600 without the DC bias circuit 104 and is driving a capacitive load 2205. The capacitive load 2205 may include any type of load such as, for example, a plasma load, a plurality of grids, a plurality of electrodes, physical capacitor, a photoconductive switch capacitance, etc.

Figure 23:
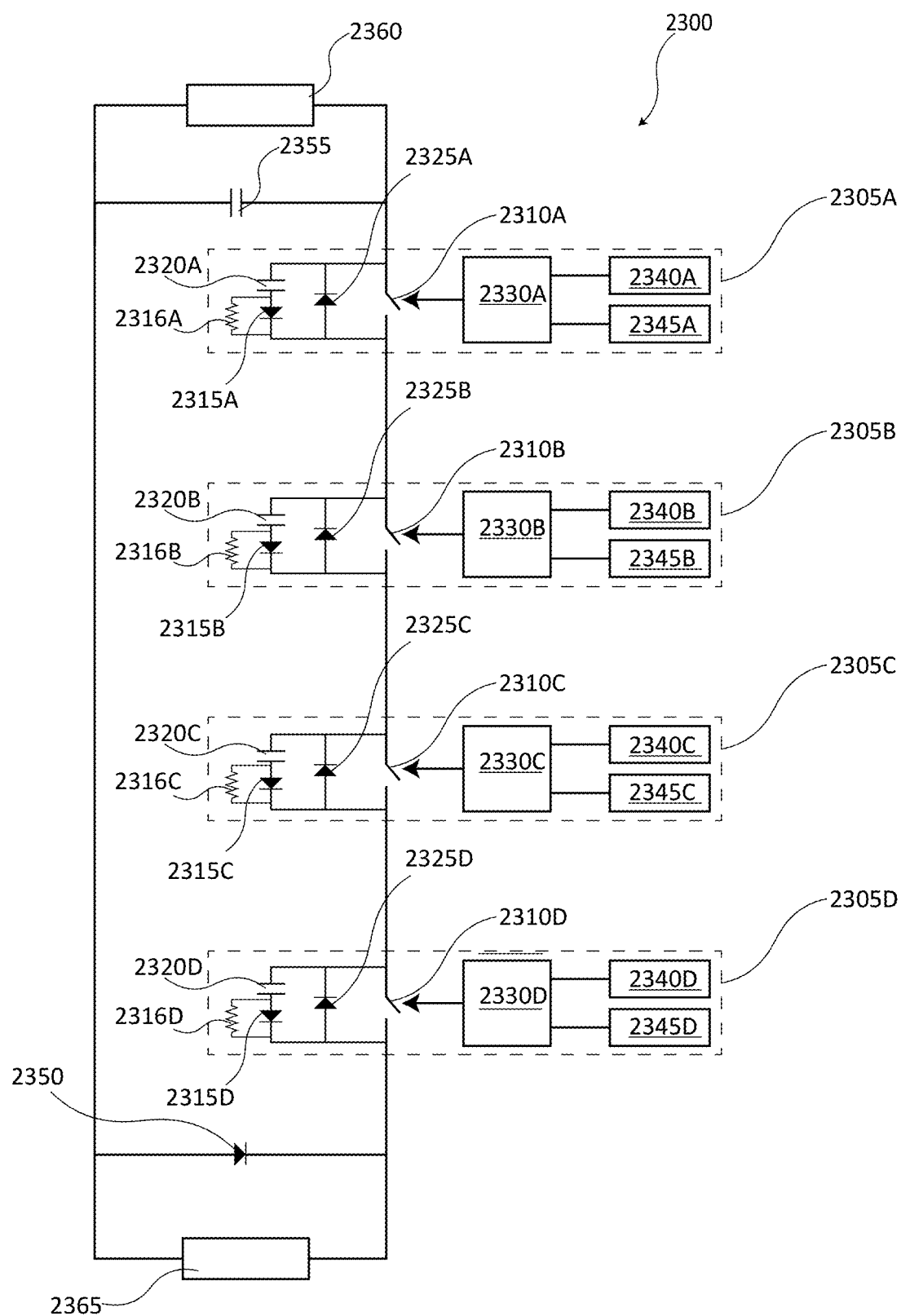
FIG. 23 is a block diagram of a high voltage switch with isolated power according to some embodiments.

FIG. 23 is a block diagram of a high voltage switch 2300 with isolated power according to some embodiments. The high voltage switch 2300 may include a plurality of switch modules 2305 (collectively or individually 2305, and individually 2305A, 2305B, 2305C, and 2305D) that may switch voltage from a high voltage source 2360 with fast rise times and/or high frequencies and/or with variable pulse widths. Each switch module 2305 may include a switch 2310 such as, for example, a solid state switch.

In some embodiments, the switch 2310 may be electrically coupled with a gate driver circuit 2330 that may include a power supply 2340 and/or an isolated fiber trigger 2345 (also referred to as a gate trigger or a switch trigger). For example, the switch 2310 may include a collector, an emitter, and a gate (or a drain, a source, and a gate) and the power supply 2340 may drive the gate of the switch 2310 via the gate driver circuit 2330. The gate driver circuit 2330 may, for example, be isolated from the other components of the high voltage switch 2300.

In some embodiments, the power supply 2340 may be isolated, for example, using an isolation transformer. The isolation transformer may include a low capacitance transformer. The low capacitance of the isolation transformer may, for example, allow the power supply 2340 to charge on fast time scales without requiring significant current. The isolation transformer may have a capacitance less than, for example, about 100 pF. As another example, the isolation transformer may have a capacitance less than about 30-100 pF. In some embodiments, the isolation transformer may provide voltage isolation up to 1 kV, 5 kV, 10 kV, 23 kV, 50 kV, etc.

In some embodiments, the isolation transformer may have a low stray capacitance. For example, the isolation transformer may have a stray capacitance less than about 1,000 pF, 100 pF, 10 pF, etc. In some embodiments, low capacitance may minimize electrical coupling to low voltage components (e.g., the source of the input control power) and/or may reduce EMI generation (e.g., electrical noise generation). In some embodiments, the transformer stray capacitance of the isolation transformer may include the capacitance measured between the primary winding and secondary winding.

In some embodiments, the isolation transformer may be a DC to DC converter or an AC to DC transformer. In some embodiments, the transformer, for example, may include a 110 V AC transformer. Regardless, the isolation transformer can provide isolated power from other components in the high voltage switch 2300. In some embodiments, the isolation may be galvanic, such that no conductor on the primary side of the isolation transformer passes through or makes contact with any conductor on the secondary side of the isolation transformer.

In some embodiments, the transformer may include a primary winding that may be wound or wrapped tightly around the transformer core. In some embodiments, the primary winding may include a conductive sheet that is wrapped around the transformer core. In some embodiments, the primary winding may include one or more windings.

In some embodiments, a secondary winding may be wound around the core as far from the core as possible. For example, the bundle of windings comprising the secondary winding may be wound through the center of the aperture in the transformer core. In some embodiments, the secondary winding may include one or more windings. In some embodiments, the bundle of wires comprising the secondary winding may include a cross section that is circular or square, for example, to minimize stray capacitance. In some embodiments, an insulator (e.g., oil or air) may be disposed between the primary winding, the secondary winding, or the transformer core.

In some embodiments, keeping the secondary winding far from the transformer core may have some benefits. For example, it may reduce the stray capacitance between the primary side of the isolation transformer and secondary side of the isolation transformer. As another example, it may allow for high voltage standoff between the primary side of the isolation transformer and the secondary side of the isolation transformer, such that corona and/or breakdown is not formed during operation.

In some embodiments, spacings between the primary side (e.g., the primary windings) of the isolation transformer and the secondary side of the isolation transformer (e.g., the secondary windings) can be about 0.1", 0.5", 1", 5", or 10". In some embodiments, typical spacings between the core of the isolation transformer and the secondary side of the isolation transformer (e.g., the secondary windings) can be about 0.1", 0.5", 1", 5", or 10". In some embodiments, the gap between the windings may be filled with the lowest dielectric material possible such as, for example, vacuum, air, any insulating gas or liquid, or solid materials with a relative dielectric constant less than 3.

In some embodiments, the power supply 2340 may include any type of power supply that can provide high voltage standoff (isolation) or have low capacitance (e.g., less than about 1,000 pF, 100 pF, 10 pF, etc.). In some embodiments, the control voltage power source may supply 1420 V AC or 240 V AC at 60 Hz.

In some embodiments, each power supply 2340 may be inductively and/or electrically coupled with a single control voltage power source. For example, the power supply 2340A may be electrically coupled with the power source via a first transformer; the power supply 2340B may be electrically coupled with the power source via a second transformer; the power supply 2340C may be electrically coupled with the power source via a third transformer; and the power supply 2340D may be electrically coupled with the power source via a fourth transformer. Any type of transformer, for example, may be used that can provide voltage isolation between the various power supplies.

In some embodiments, the first transformer, the second transformer, the third transformer, and the fourth transformer may comprise different secondary winding around a core of a single transformer. For example, the first transformer may comprise a first secondary winding, the second transformer may comprise a second secondary winding, the third transformer may comprise a third secondary winding, and the fourth transformer may comprise a fourth secondary winding. Each of these secondary winding may be wound around the core of a single transformer. In some embodiments, the first secondary winding, the second secondary winding, the third secondary winding, the fourth secondary winding, or the primary winding may comprise a single winding or a plurality of windings wound around the transformer core.

In some embodiments, the power supply 2340A, the power supply 2340B, the power supply 2340C, and/or the power supply 2340D may not share a return reference ground or a local ground.

The isolated fiber trigger 2345, for example, may also be isolated from other components of the high voltage switch 2300. The isolated fiber trigger 2345 may include a fiber optic receiver that allows each switch module 2305 to float relative to other switch modules 2305 and/or the other components of the high voltage switch 2300, and/or, for example, while allowing for active control of the gates of each switch module 2305.

In some embodiments, return reference grounds or local grounds or common grounds for each switch module 2305, for example, may be isolated from one another, for example, using an isolation transformer.

Electrical isolation of each switch module 2305 from common ground, for example, can allow multiple switches to be arranged in a series configuration for cumulative high voltage switching. In some embodiments, some lag in switch module timing may be allowed or designed. For example, each switch module 2305 may be configuration or rated to switch 1 kV, each switch module may be electrically isolated from each other, and/or the timing of closing each switch module 2305 may not need to be perfectly aligned for a period of time defined by the capacitance of the snubber capacitor and/or the voltage rating of the switch.

In some embodiments, electrical isolation may provide many advantages. One possible advantage, for example, may include minimizing switch to switch jitter and/or allowing for arbitrary switch timing. For example, each switch 2310 may have switch transition jitters less than about 500 ns, 50 ns, 20 ns, 5 ns, etc.

In some embodiments, electrical isolation between two components (or circuits) may imply extremely high resistance between two components and/or may imply a small capacitance between the two components.

Each switch 2310 may include any type of solid state switching device such as, for example, an IGBT, a MOSFET, a SiC MOSFET, SiC junction transistor, FETs, SiC switches, GaN switches, photoconductive switch, etc. The switch 2310, for example, may be able to switch high voltages (e.g., voltages greater than about 1 kV), with high frequency (e.g., greater than 1 kHz), at high speeds (e.g., a repetition rate greater than about 500 kHz) and/or with fast rise times (e.g., a rise time less than about 23 ns) and/or with long pulse lengths (e.g., greater than about 10 ms). In some embodiments, each switch may be individually rated for switching 1,200 V-1,700 V, yet in combination can switch greater than 4,800 V-6,800 V (e.g., for four switches). Switches with various other voltage ratings may be used.

There may be some advantages to using a large number of lower voltage switches rather than a few higher voltage switches. For example, lower voltage switches typically have better performance: lower voltage switches may switch faster, may have faster transition times, and/or may switch more efficiently than high voltage switches. However, the greater the number of switches, for example, the greater the need for switch timing precision.

The high voltage switch 2300 shown in FIG. 23 includes four switch modules 2305. While four are shown in this figure, any number of switch modules 2305 may be used such as, for example, two, eight, twelve, sixteen, twenty, twenty-four, etc. For example, if each switch in each switch module 2305 is rated at 1200 V, and sixteen switches are used, then the high voltage switch can switch up to 19.2 kV. As another example, if each switch in each switch module 2305 is rated at 1700 V, and sixteen switches are used, then the high voltage switch can switch up to 27.2 kV.

In some embodiments, the high voltage switch 2300 may switch voltages greater than 5 kV, 10 kV, 14 kV, 20 kV, 23 kV, etc.

In some embodiments, the high voltage switch 2300 may include a fast capacitor 2355. The fast capacitor 2355, for example, may include one or more capacitors arranged in series and/or in parallel. These capacitors may, for example, include one or more polypropylene capacitors. The fast capacitor 2355 may store energy from the high voltage source 2360.

In some embodiments, the fast capacitor 2355 may have low capacitance. In some embodiments, the fast capacitor 2355 may have a capacitance value of about 1 µF, about 5 µF, between about 1 µF and about 5 µF, between about 100 nF and about 1,000 nF etc.

In some embodiments, the high voltage switch 2300 may or may not include a crowbar diode 2350. The crowbar diode 2350 may include a plurality of diodes arranged in series or in parallel that may, for example, be beneficial for driving inductive loads. In some embodiments, the crowbar diode 2350 may include one or more Schottky diodes such as, for example, a silicon carbide Schottky diode. The crowbar diode 2350 may, for example, sense whether the voltage from the switches of the high voltage switch is above a certain threshold. If it is, then the crowbar diode 2350 may short the power from switch modules to ground. The crowbar diode, for example, may allow an alternating current path to dissipate energy stored in the inductive load after switching. This may, for example, prevent large inductive voltage spikes. In some embodiments, the crowbar diode 2350 may have low inductance such as, for example, 1 nH, 10 nH, 100 nH, etc. In some embodiments, the crowbar diode 2350 may have low capacitance such as, for example, 100 pF, 1 nF, 10 nF, 100 nF, etc.

In some embodiments, the crowbar diode 2350 may not be used such as, for example, when the load 2365 is primarily resistive.

In some embodiments, each gate driver circuit 2330 may produce less than about 1000 ns, 100 ns, 10.0 ns, 5.0 ns, 3.0 ns, 1.0 ns, etc. of jitter. In some embodiments, each switch 2310 may have a minimum switch on time (e.g., less than about 10 µs, 1 µs, 500 ns, 100 ns, 50 ns, 10, 5 ns, etc.) and a maximum switch on time (e.g., greater than 23 s, 10 s, 5 s, 1 s, 500 ms, etc.).

In some embodiments, during operation each of the high voltage switches may be switched on and/or off within 1 ns of each other.

In some embodiments, each switch module 2305 may have the same or substantially the same (±5%) stray inductance. Stray inductance may include any inductance within the switch module 2305 that is not associated with an inductor such as, for example, inductance in leads, diodes, resistors, switch 2310, and/or circuit board traces, etc. The stray inductance within each switch module 2305 may include low inductance such as, for example, an inductance less than about 300 nH, 100 nH, 10 nH, 1 nH, etc. The stray inductance between each switch module 2305 may include low inductance such as, for example, an inductance less than about 300 nH, 100 nH, 10 nH, 1 nH, etc.

In some embodiments, each switch module 2305 may have the same or substantially the same (±5%) stray capacitance. Stray capacitance may include any capacitance within the switch module 2305 that is not associated with a capacitor such as, for example, capacitance in leads, diodes, resistors, switch 2310 and/or circuit board traces, etc. The stray capacitance within each switch module 2305 may include low capacitance such as, for example, less than about 1,000 pF, 100 pF, 10 pF, etc. The stray capacitance between each switch module 2305 may include low capacitance such as, for example, less than about 1,000 pF, 100 pF, 10 pF, etc.

Imperfections in voltage sharing can be addressed, for example, with a passive snubber circuit (e.g., the snubber diode 2315, the snubber capacitor 2320, and/or the freewheeling diode 2325). For example, small differences in the timing between when each of the switches 2310 turn on or turn off or differences in the inductance or capacitances may lead to voltage spikes. These spikes can be mitigated by the various snubber circuits (e.g., the snubber diode 2315, the snubber capacitor 2320, and/or the freewheeling diode 2325).

A snubber circuit, for example, may include a snubber diode 2315, a snubber capacitor 2320, a snubber resistor 2316, and/or a freewheeling diode 2325. In some embodiments, the snubber circuit may be arranged together in parallel with the switch 2310. In some embodiments, the snubber capacitor 2320 may have low capacitance such as, for example, a capacitance less than about 100 pF.

In some embodiments, the high voltage switch 2300 may be electrically coupled with or include a load 2365 (e.g., a resistive or capacitive or inductive load). The load 2365, for example, may have a resistance from 50 ohms to 500 ohms. Alternatively or additionally, the load 2365 may be an inductive load or a capacitive load.

In some embodiments, the energy recovery circuit 1610 or the active energy recovery circuit 111 can decrease the energy consumption of a high voltage bias generator and/or the voltage required to drive a given load with the same energy output performance as systems without an energy recover circuit. For example, the energy consumption, for the same energy output performance as systems without an energy recover circuit, can be reduced as much as 10%, 15% 20%, 23%, 30%, 40%, 45%, 50%, etc. or more.

In some embodiments, the diode 130, the diode 135, and/or the energy recovery diode 1620 may comprise a high voltage diode.

Figure 24:
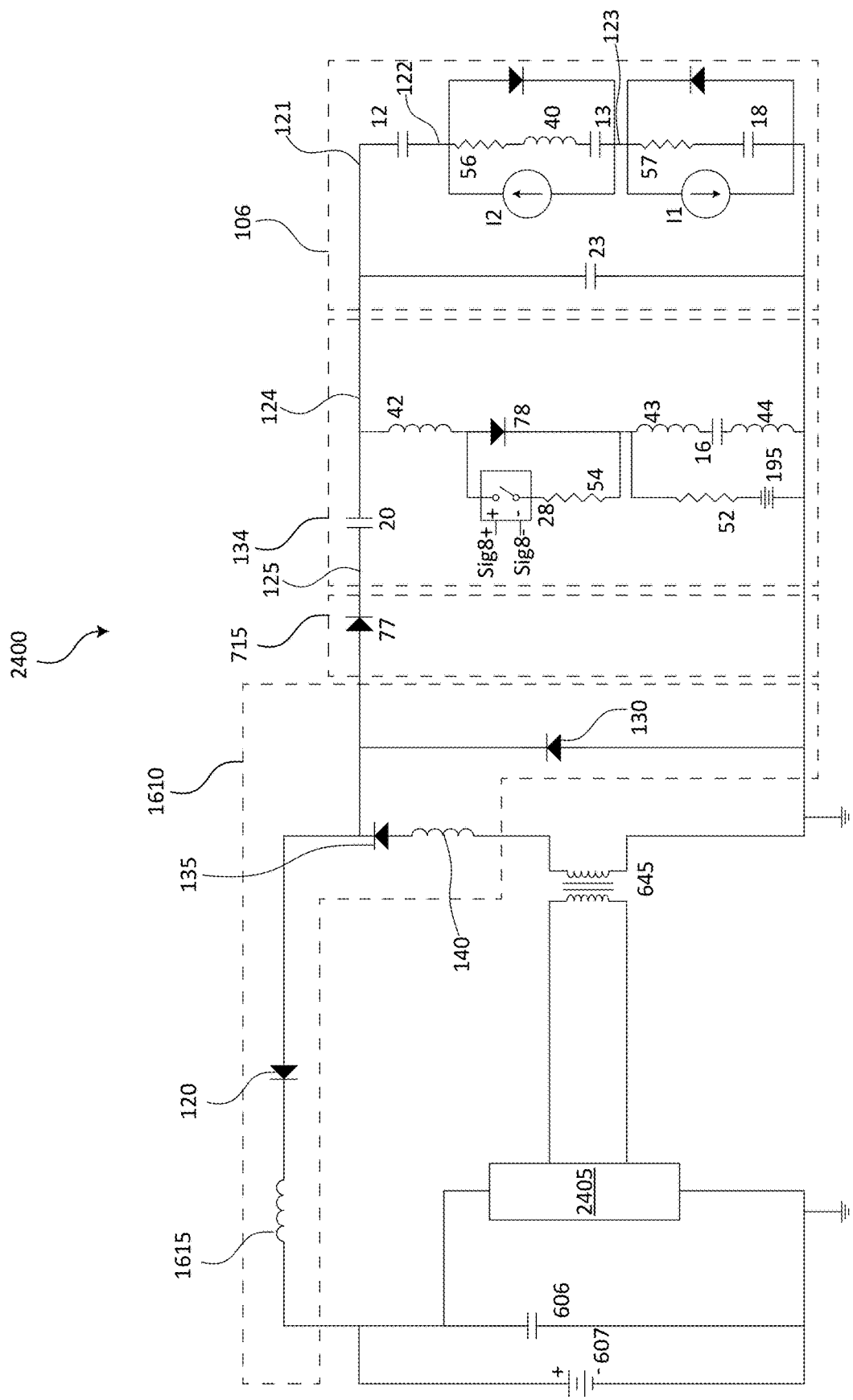
FIG. 24 is a circuit diagram of an bias generator that includes an RF source, the active bias compensation circuit, and the energy recovery circuit according to some embodiments.

FIG. 24 is a circuit diagram of an bias generator 2400 that includes an RF source 2405, the active bias compensation circuit 134, and the energy recovery circuit 1610 according to some embodiments. In this example, the bias generator 2400 is similar to the bias generator 900 with the RF driver 605 and resonant circuit 610 replaced by an RF source 2405. The RF driver 605 shown in FIG. 9 comprises a full wave rectifier and a resonant circuit 610, which is replaced with an RF source 2405.

In some embodiments, the RF source 2405 may include a plurality of high frequency solid state switch(es), an RF generator, an amplifier tube based RF generator, or a tube based RF generator.

The bias generator 2400 may or may not include a traditional matching network such as, for example, a 50 ohm matching network or an external matching network or standalone matching network. In some embodiments, the bias generator 2400 does not require a 50 ohm matching network to optimize the switching power applied to the wafer chamber. An RF generator without a traditional matching network can allow for rapid changes to the power drawn by the plasma chamber. Typically, this optimization of the matching network can take at least 100 μs-200 μs. In some embodiments, power changes can occur within one or two RF cycles, for example, 2.5 μs-5.0 μs at 400 kHz.

In some embodiments, the RF source 2405 may operate at frequency about 400 kHz, 0.5 MHz, 2.0 MHz, 4.0 MHz, 13.56 MHz, 27.12 MHz, 40.68 MHz, 50 MHz, etc.

Figure 25:
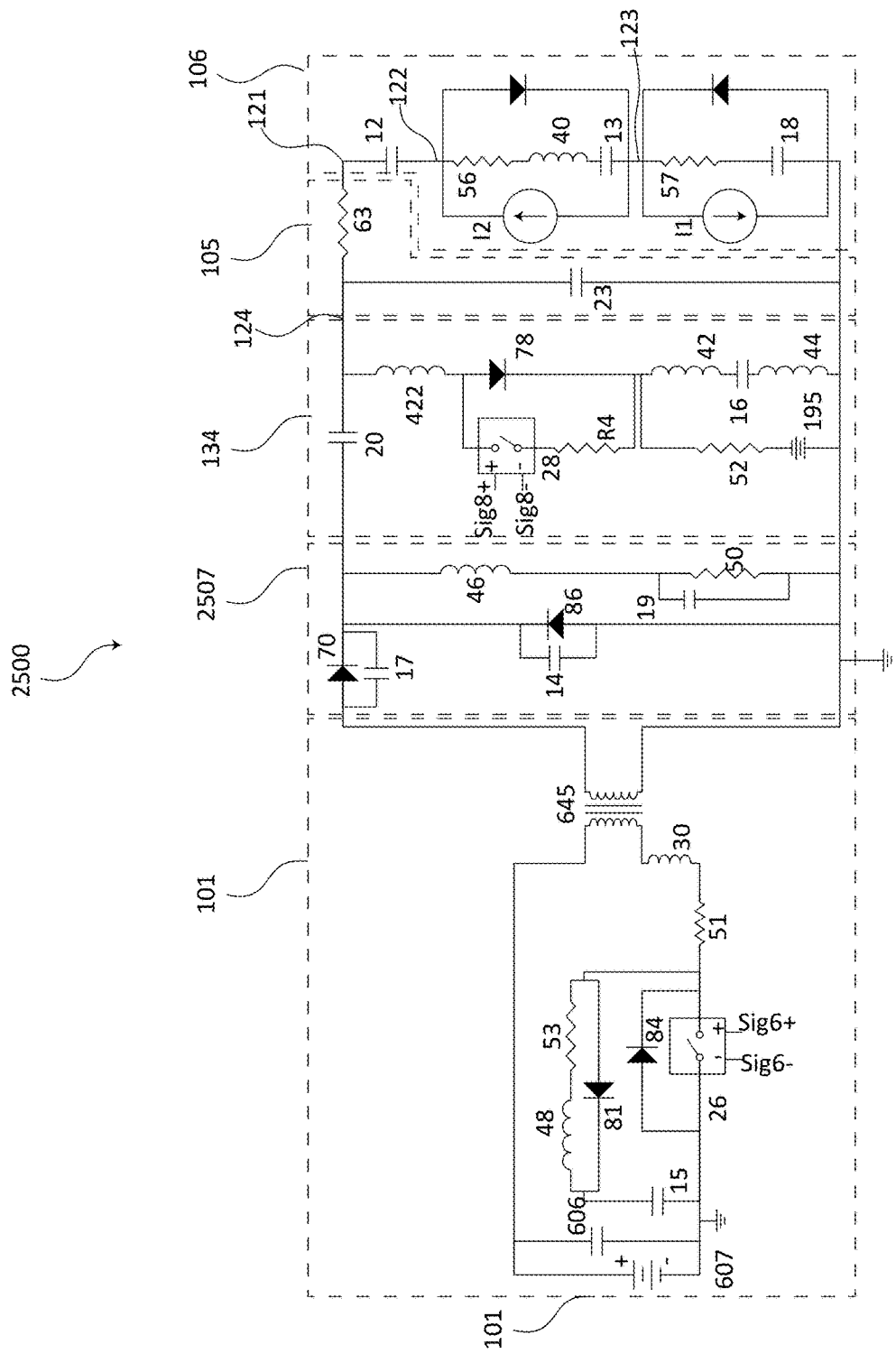
FIG. 25 shows another example bias generator according to some embodiments.

FIG. 25 shows another example bias generator 2500 according to some embodiments. The bias generator 2500 can be generalized into five stages (these stages could be broken down into other stages or generalized into fewer stages). The bias generator 2500 includes nanosecond pulser stage 101, a resistive output stage 2507, the bias compensation circuit 134, and a load stage 106.

In this example, the load stage 106 may represent an effective circuit for a plasma deposition system, plasma etch system, or plasma sputtering system. The capacitance 12 may represent the capacitance of the dielectric material upon which a wafer may sit. The capacitor 13 may represent the sheath capacitance of the plasma to the wafer. The capacitor 18 may represent capacitance within the plasma between a chamber wall and the top surface of the wafer. The current source I2 and the current source I1 may represent the ion current through the sheath.

In this example, the resistive output stage 2507 may include one or more inductive elements represented by inductor 46. The inductor 46, for example, may represent the stray inductance of the leads in the resistive output stage 2507. Inductor 46 may be set to minimize the power that flows directly from the nanosecond pulser stage 101 into ROS resistor 50.

In some embodiments, the ROS resistor 50 may dissipate charge from the load stage 2515, for example, on fast time scales (e.g., 1 ns, 10 ns, 50 ns, 100 ns, 250 ns, 500 ns, 100 ns, etc. time scales). The resistance of ROS resistor 50 may be low to ensure the pulse across the load stage 2515 has a fast fall time $t_f$.

In some embodiments, the ROS resistor 50 may include a plurality of resistors arranged in series and/or parallel. The capacitor 19 may represent the stray capacitance of the ROS resistor 50 including the capacitance of the arrangement series and/or parallel resistors. The capacitance of stray capacitance 19, for example, may be less than 500 pF, 250 pF, 100 pF, 50 pF, 10 pF, 1 pF, etc. The capacitance of stray capacitance 19, for example, may be less than the load capacitance such as, for example, less than the capacitance of resonant capacitor 12, 13, and/or 18.

In some embodiments, a plurality of nanosecond pulser stages 2506 can be ganged up in parallel and coupled with the resistive output stage 2507 across the inductor 46 and/or the ROS resistor 50. Each of the plurality of pulser and transformer stages 906 may each also include diode 70 and/or diode 86.

In some embodiments, the capacitor 17 may represent the stray capacitance of the blocking diode 70. In some embodiments, the capacitor 14 may represent the stray capacitance of the diode 86.

Figure 26:
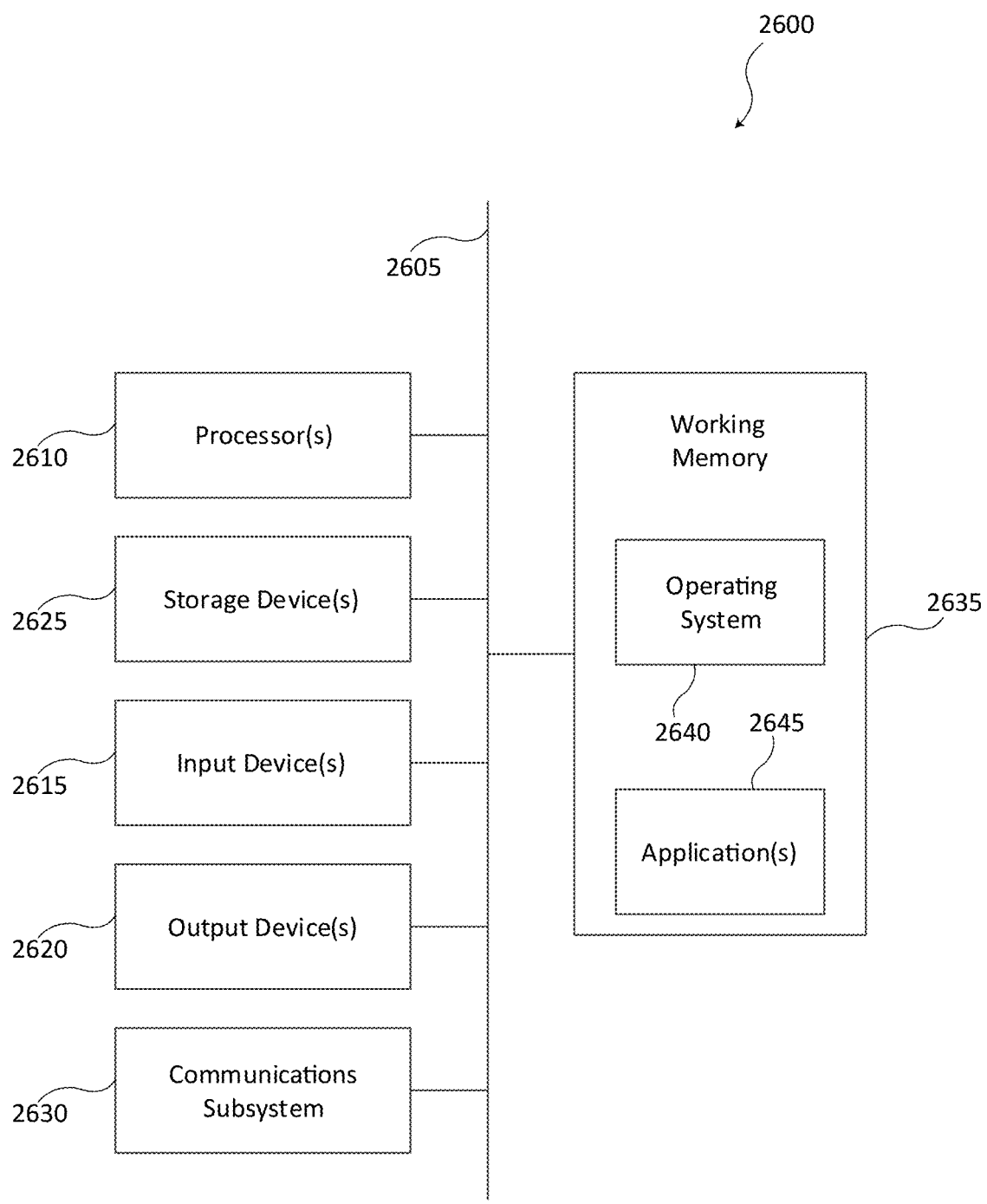
FIG. 26 is a block diagram of a computational system according to some embodiments.

The computational system 2600, shown in FIG. 26 can be used to perform any of the embodiments of the invention. For example, computational system 2600 can be used to execute process 500. As another example, computational system 2600 can be used perform any calculation, identification and/or determination described here. Computational system 2600 includes hardware elements that can be electrically coupled via a bus 2605 (or may otherwise be in communication, as appropriate). The hardware elements can include one or more processors 2610, including without limitation one or more general-purpose processors and/or one or more special-purpose processors (such as digital signal processing chips, graphics acceleration chips, and/or the like); one or more input devices 2615, which can include without limitation a mouse, a keyboard and/or the like; and one or more output devices 2620, which can include without limitation a display device, a printer and/or the like.

The computational system 2600 may further include (and/or be in communication with) one or more storage devices 2625, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 2600 might also include a communications subsystem 2630, which can include without limitation a modem, a network card (wireless or wired), an infrared communication device, a wireless communication device and/or chipset (such as a Bluetooth device, an 802.6 device, a Wi-Fi device, a WiMax device, cellular communication facilities, etc.), and/or the like. The communications subsystem 2630 may permit data to be exchanged with a network (such as the network described below, to name one example), and/or any other devices described in this document. In many embodiments, the computational system 2600 will further include a working memory 2635, which can include a RAM or ROM device, as described above.

The computational system 2600 also can include software elements, shown as being currently located within the working memory 2635, including an operating system 2640 and/or other code, such as one or more application programs 2645, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 2625 described above.

In some cases, the storage medium might be incorporated within the computational system 2600 or in communication with the computational system 2600. In other embodiments, the storage medium might be separate from a computational system 2600 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 2600 and/or might take the form of source and/or installable code, which, upon compilation and/or installation on the computational system 2600 (e.g., using any of a variety of generally available compilers, installation programs, compression/decompression utilities, etc.) then takes the form of executable code.

Figure 27:
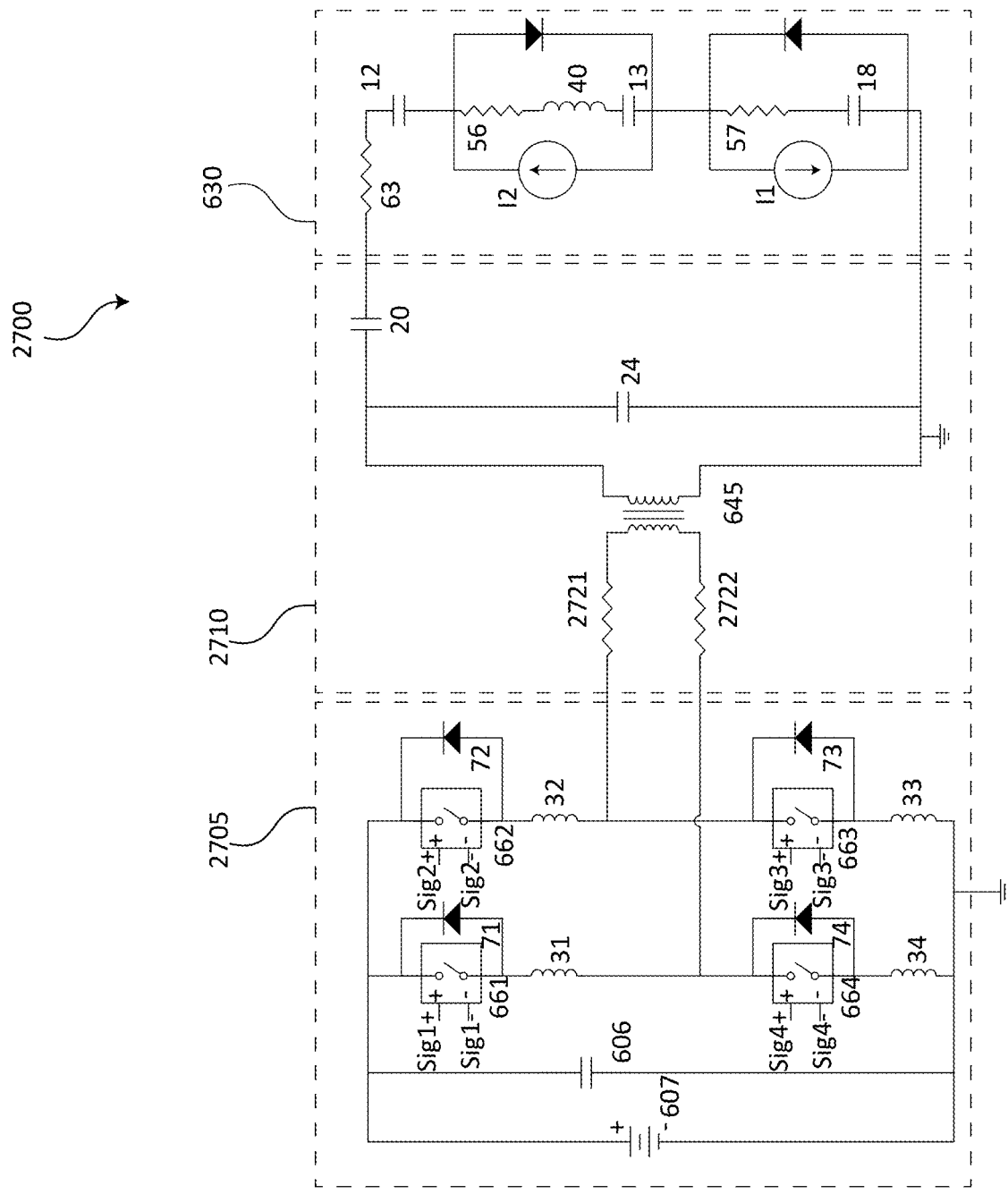
FIG. 27 is a circuit diagram of a plasma generator according to some embodiments.

FIG. 27 is a circuit diagram of a plasma generator 2700 according to some embodiments. The plasma generator 2700, for example, may include a pulse driver 2705, which is shown in a full bridge configuration; a dampening circuit 2710, which may include a dampening resistor 2721 and/or a dampening resistor 2722; a transformer 645; and the load stage 630. The capacitor 24 may represent the capacitance of the discharge geometry, any stray capacitance in the circuit, or the capacitance of any capacitors in the circuit. In some embodiments, the transformer 645 may or may not be included with the plasma generator 2700.

Figure 33:
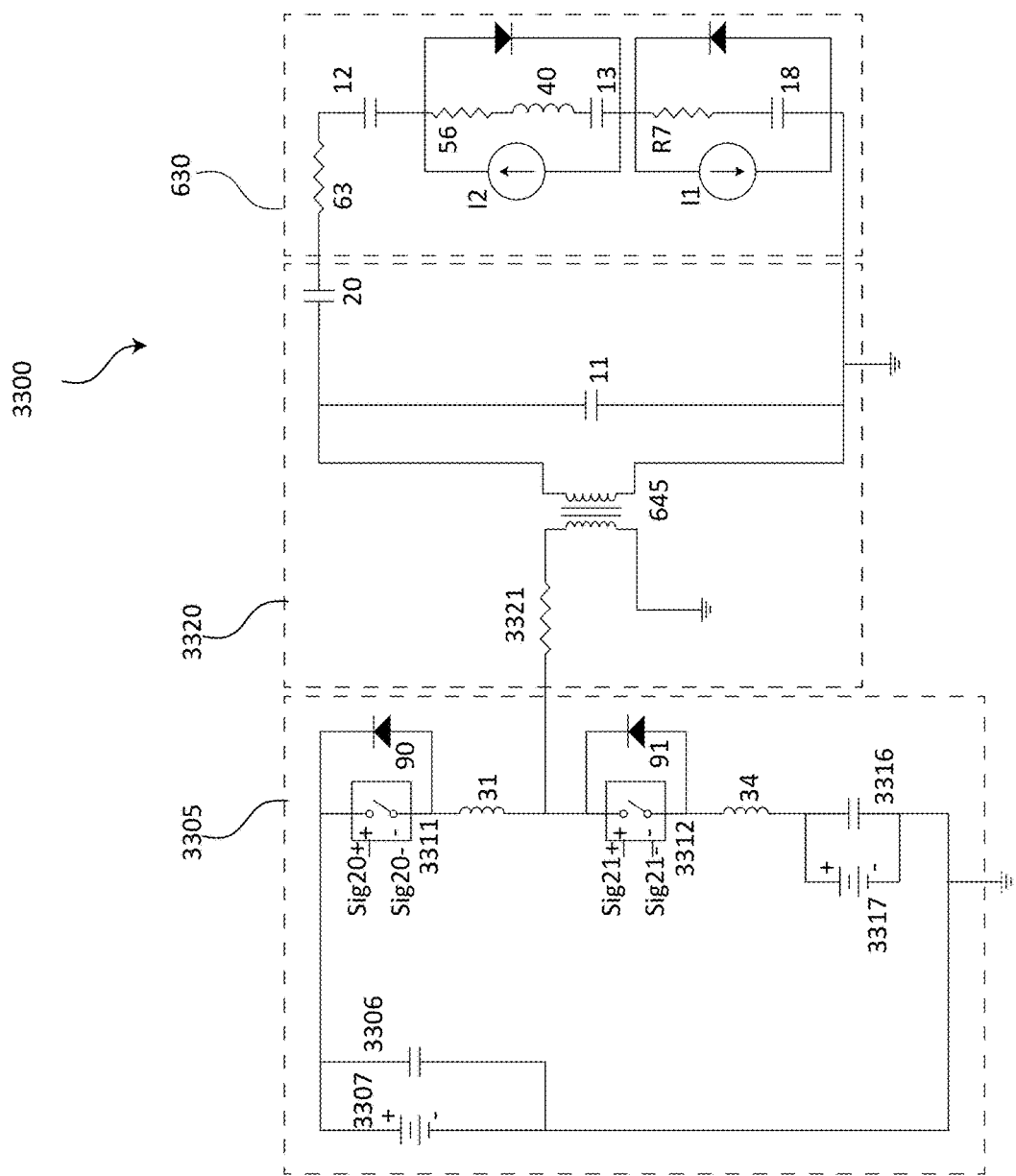
FIG. 33 is a circuit diagram of a plasma generator according to some embodiments.

In some embodiments, the pulse driver 2705 may comprise switches arranged in a full bridge topology as shown or a half bridge topology with two switches (e.g., as shown in FIG. 33). The switches 661, 662, 663, 664 may switch DC charge stored within the energy storage capacitor 606. Each of the switches 661, 662, 663, 664 may include one or more switches arranged in series or parallel. For example, switch 661 may comprise one, two, four, eight or twelve switches; switch 662 may comprise one, two, four, eight or twelve switches; switch 663 may comprise one, two, four, eight or twelve switches; and/or switch 664 may comprise one, two, four, eight or twelve switches.

The voltage source 607, which may be a DC voltage source (e.g., a capacitive source, AC-DC converter, etc.), may charge the energy storage capacitor 606. The pulse driver 2705 may drive the dampening circuit 2710 with a pulse frequency that is or is not substantially equal to the resonate frequency of the dampening circuit 2710.

In a full bridge, each of the switches 661, 662, 663, 664 may be coupled with a bridge diode 71, 72, 73, 74. In some embodiments, each bridge switch 661, 662, 663, or 664 in the pulse driver 2705 can be switched independently or in conjunction with one or more of the other switches. For example, the signal Sig1 may be the same signal as signal Sig3 turning switches 661 and 663 on and off at that same time. As another example, the signal Sig2 may be the same signal as signal Sig4 turning on and off switches 662 and 664 at the same time. As another example, each signal may be independent and may control each bridge switch 661, 662, 663, or 664 independently, in conjunction, or separately.

In some embodiments, the dampening circuit 2710 may include dampening resistor 2721 and/or dampening resistor 2722. In some embodiments, only a single dampening resistor may be included. For example, the value of dampening resistor 2721 and/or dampening resistor 2722 may include resistances from about 10 m$\Omega$ to 100$\Omega$. For example, the value of the dampening resistor 2721 and/or dampening resistor 2722 may include resistances less than about 10 m$\Omega$, 100 m$\Omega$, 1 $\Omega$, 10 $\Omega$, 100$\Omega$, etc. The dampening resistor 2721 and/or dampening resistor 2722, for example, may dampen any parasitic ringing in any positive going pulses and/or flatten the voltage on a wafer. The dampening resistor 2721 and/or dampening resistor 2722, for example, may dissipate as much as 1 kW, 2 kW, 5 kW, 10 kW, etc.

In some embodiments, bridge switches 661 and 663 may be opened and closed together to create a negative going pulse and bridge switches 662 and 664 may be opened and closed together to create a positive going pulse.

The voltage $V_1$ and/or the voltage $V_2$ in any of the waveforms shown in any of the drawings may represent positive or negative voltage values. The voltage $V_1$ and/or the voltage $V_2$ in any of the waveforms in any of the drawings may have a magnitude more than bout 2 kV, 5 kV, 7.5 kV, 10 kV, 12.5 kV, 15 kV, 20 kV, etc. The voltage $V_1$ and/or the voltage $V_2$ in any of the waveforms in any of the drawings may be the same or different.

Figure 28:
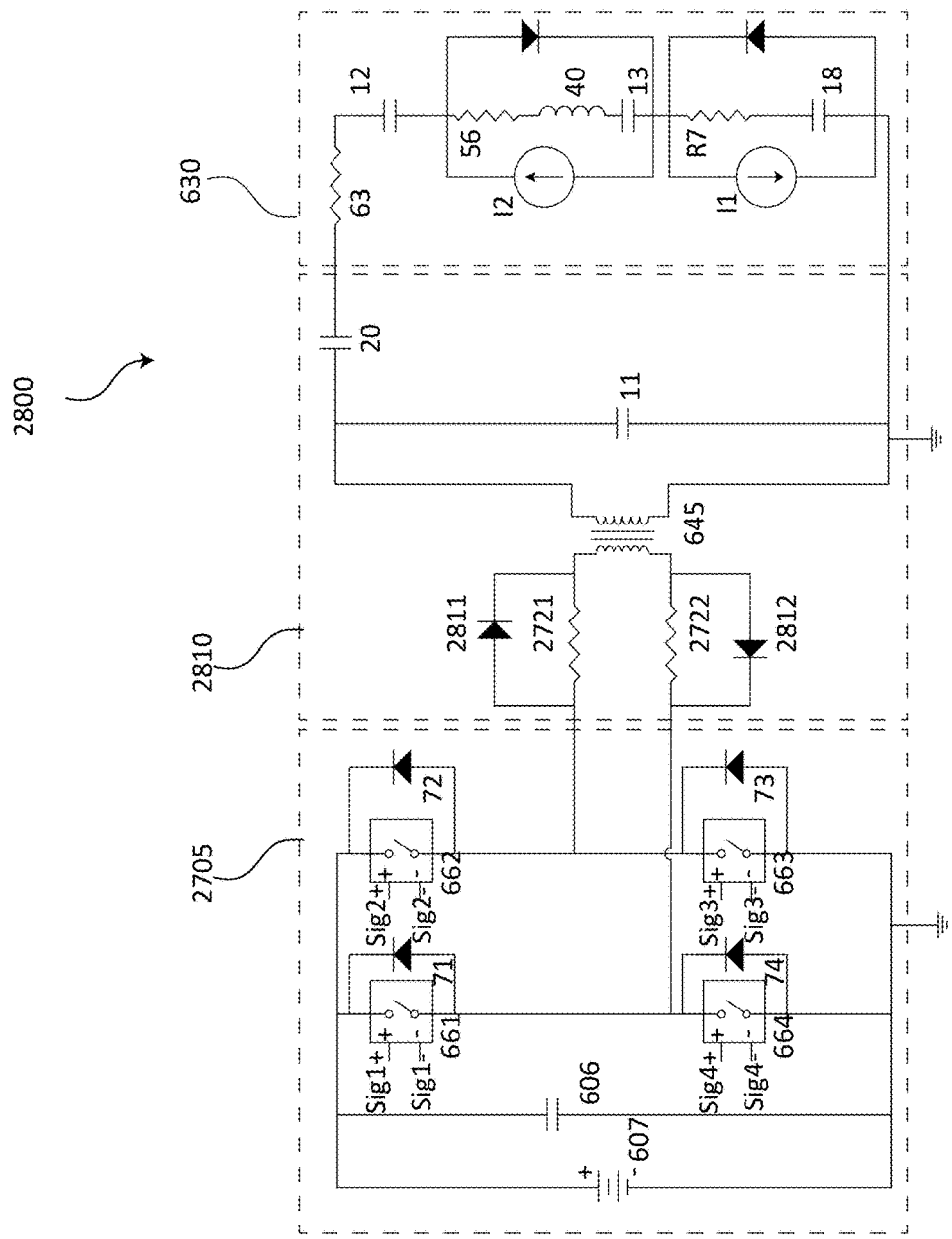
FIG. 28 is a circuit diagram of a plasma generator according to some embodiments.

FIG. 28 is a circuit diagram of a plasma generator 2800 according to some embodiments. The plasma generator 2800, for example, may include an pulse driver 2705, which is shown in a full bridge configuration; a dampening circuit 2710, which may include a dampening resistor 2721 and/or a dampening resistor 2722; a dampening diode 2811 and/or a dampening diode 2812; a transformer 645; and the voltage source 607. The capacitor 24 may represent the capacitance of the discharge geometry, any stray capacitance in the circuit, or the capacitance of any capacitors in the circuit. In some embodiments, the transformer 645 may or may not be included with the plasma generator 2700.

In some embodiments, the pulse driver 2805 may comprise switches arranged in a full bridge topology as shown or a half bridge topology with two switches (e.g., as shown in FIG. 33). The switches 661, 662, 663, 664 may switch DC charge stored within the energy storage capacitor 606. The voltage source 607, which may be a DC voltage source (e.g., a capacitive source, AC-DC converter, etc.), may charge the energy storage capacitor 606. The pulse driver 2805 may drive the dampening circuit 2810 with a pulse frequency that is or is not substantially equal to the resonate frequency of the dampening circuit 2810.

In a full bridge, each of the switches 661, 662, 663, 664 are coupled with a diode 71, 72, 73, 74. In some embodiments, each bridge switch 661, 662, 663, or 664 in the pulse driver 2805 can be switched independently or in conjunction with one or more of the other switches. For example, the signal Sig1 may be the same signal as signal Sig3 turning switches 661 and 663 on and off at that same time. As another example, the signal Sig2 may be the same signal as signal Sig4 turning on and off switches 662 and 664 at the same time. As another example, each signal may be independent and may control each bridge switch 661, 662, 663, or 664 independently, in conjunction, or separately.

The dampening diode 2811 may, for example, allow the positive voltage to ring to a higher value which may produce higher amplitude wafer voltage without affecting negative waveform flatness by allowing current during a positive-going pulse to flow around and not through dampening resistor 2721. The dampening diode 2812 may, for example, allow the positive voltage to ring to a higher value which may produce higher amplitude wafer voltage without affecting negative waveform flatness by allowing current during a positive-going pulse to flow around and not through dampening resistor 2722.

In some embodiments, the pulse driver 2805 may include a half bridge topology with two switches (e.g., as shown in FIG. 33).

Figure 29:
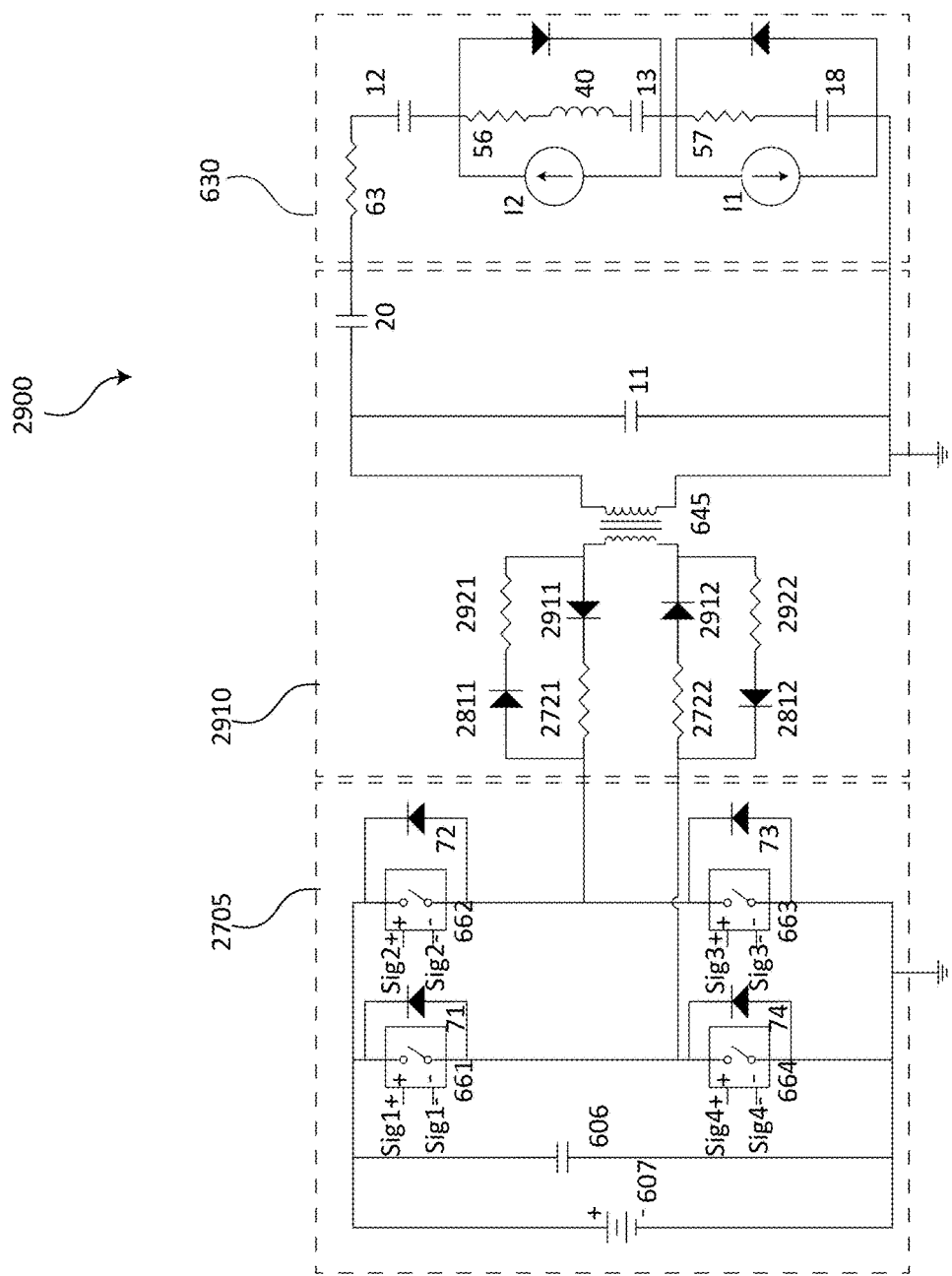
FIG. 29 is a circuit diagram of a plasma generator according to some embodiments.

FIG. 29 is a circuit diagram of a plasma generator 2900 according to some embodiments. The plasma generator 2800, for example, may include an pulse driver 2905, which is shown in a full bridge configuration; a dampening circuit 2910, which may include a dampening resistor 2721 and/or a dampening resistor 2722, a dampening diode 2811 and/or a dampening diode 2812, a second dampening diode 2911 and/or a second dampening diode 2912; and/or a second dampening diode 2911 and/or a second dampening diode 2912; a transformer 645; and the voltage source 607. The second dampening diode 2911, for example, may be disposed in a reverse position in comparison to the dampening diode 2711 and/or the second dampening diode 2912, for example, may be disposed in a reverse position in comparison to the dampening diode 2712.

The capacitor 24 may represent the capacitance of the discharge geometry, any stray capacitance in the circuit, or the capacitance of any capacitors in the circuit. In some embodiments, the transformer 645 may or may not be included with the plasma generator 2700.

In some embodiments, the pulse driver 2905 may comprise switches arranged in a full bridge topology as shown or a half bridge topology with two switches (e.g., as shown in FIG. 33). The switches 661, 662, 663, 664 may switch DC charge stored within the energy storage capacitor 606. The voltage source 607, which may be a DC voltage source (e.g., a capacitive source, AC-DC converter, etc.), may charge the energy storage capacitor 606. The pulse driver 2905 may drive the dampening circuit 2910 with a pulse frequency that is or is not substantially equal to the resonate frequency of the dampening circuit 2910.

In some embodiments, the pulse driver 2905 may include a half bridge topology with two switches (e.g., as shown in FIG. 33).

The first dampening resistor 2921 and the second dampening resistor 2922, for example, may have a resistance of about 10 mΩ to 100Ω. For example, the value of the dampening resistor 2921 and/or dampening resistor 2922 may include resistances less than about 10 mΩ, 100 mΩ, 1 Ω, 10 Ω, 100Ω, etc. The first dampening resistor 2921 and/or the second dampening resistor 2922, for example, may have a resistance that is less than about $\frac{1}{10}$, $\frac{1}{8}$, $\frac{1}{6}$, $\frac{1}{4}$, $\frac{1}{3}$, $\frac{3}{8}$, $\frac{1}{2}$, $\frac{2}{3}$, $\frac{5}{8}$, $\frac{3}{4}$, $\frac{7}{8}$, etc. or one times the resistance of the dampening resistor 2721 and/or the dampening resistor 2722.

Figure 30:
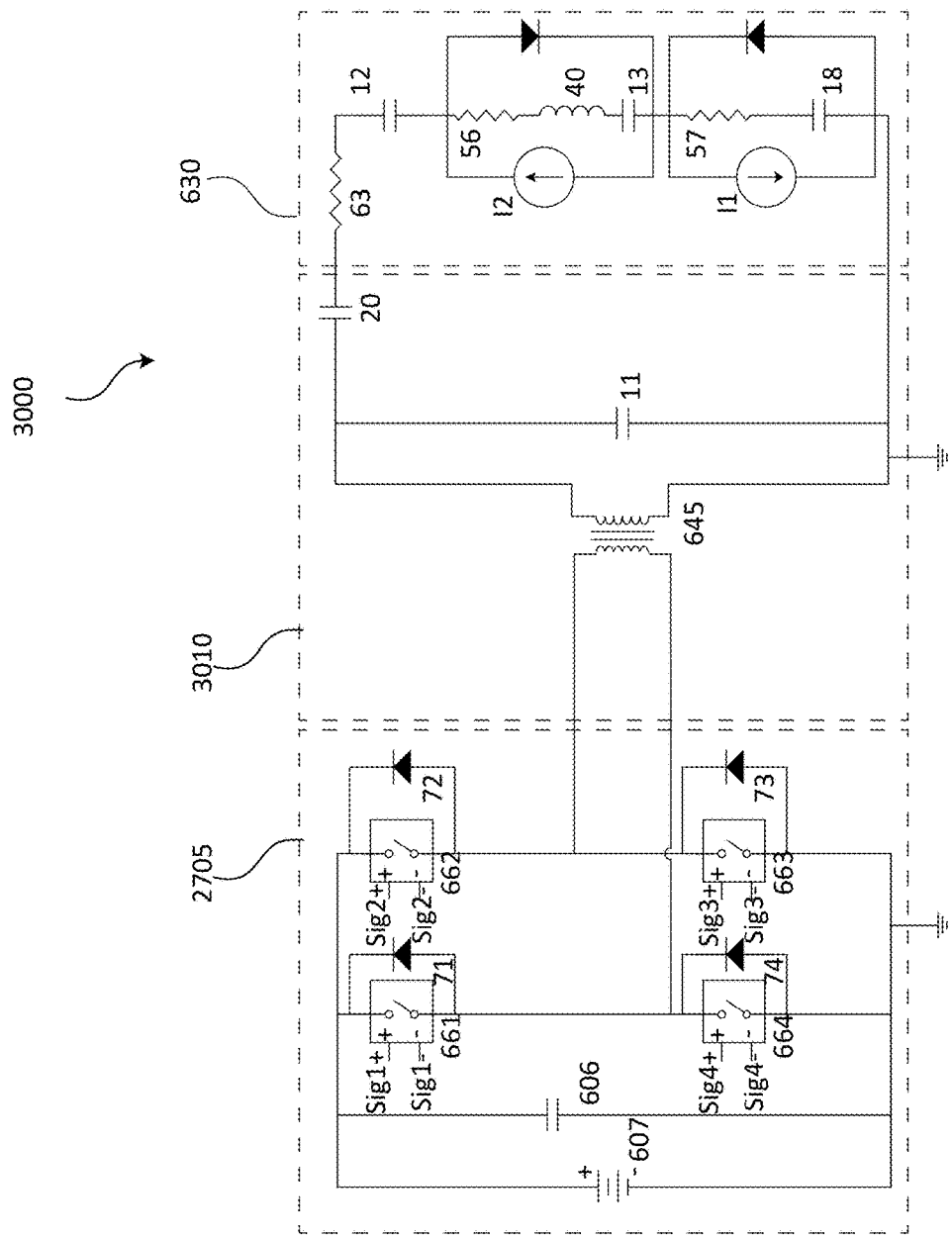
FIG. 30 is a circuit diagram of a plasma generator according to some embodiments.

FIG. 30 is a circuit diagram of a plasma generator 3000 according to some embodiments. The plasma generator 3000, for example, may include an pulse driver 3005, which is shown in a full bridge configuration; a transformer 645; and the load stage 630. In this example, there are no dampening diodes or dampening resistors. Ringing, for example, may be reduced or mitigated with precision timing of the switches 661, 662, 663, 664.

The capacitor 11 may represent the capacitance of the discharge geometry, any stray capacitance in the circuit, or the capacitance of any capacitors in the circuit. In some embodiments, the transformer 645 may or may not be included with the plasma generator 3000.

In some embodiments, the pulse driver 3005 may comprise switches arranged in a full bridge topology as shown or a half bridge topology with two switches (e.g., as shown in FIG. 33). The switches 661, 662, 663, 664 may switch DC charge stored within the energy storage capacitor 606. The voltage source 607, which may be a DC voltage source (e.g., a capacitive source, AC-DC converter, etc.), may charge the energy storage capacitor 606. The pulse driver 3005 may drive the dampening circuit 3010 with a pulse frequency that is or is not substantially equal to the resonate frequency of the dampening circuit 3010.

In some embodiments, the pulse driver 3005 may include a half bridge topology with two switches (e.g., as shown in FIG. 33)

Figure 31:
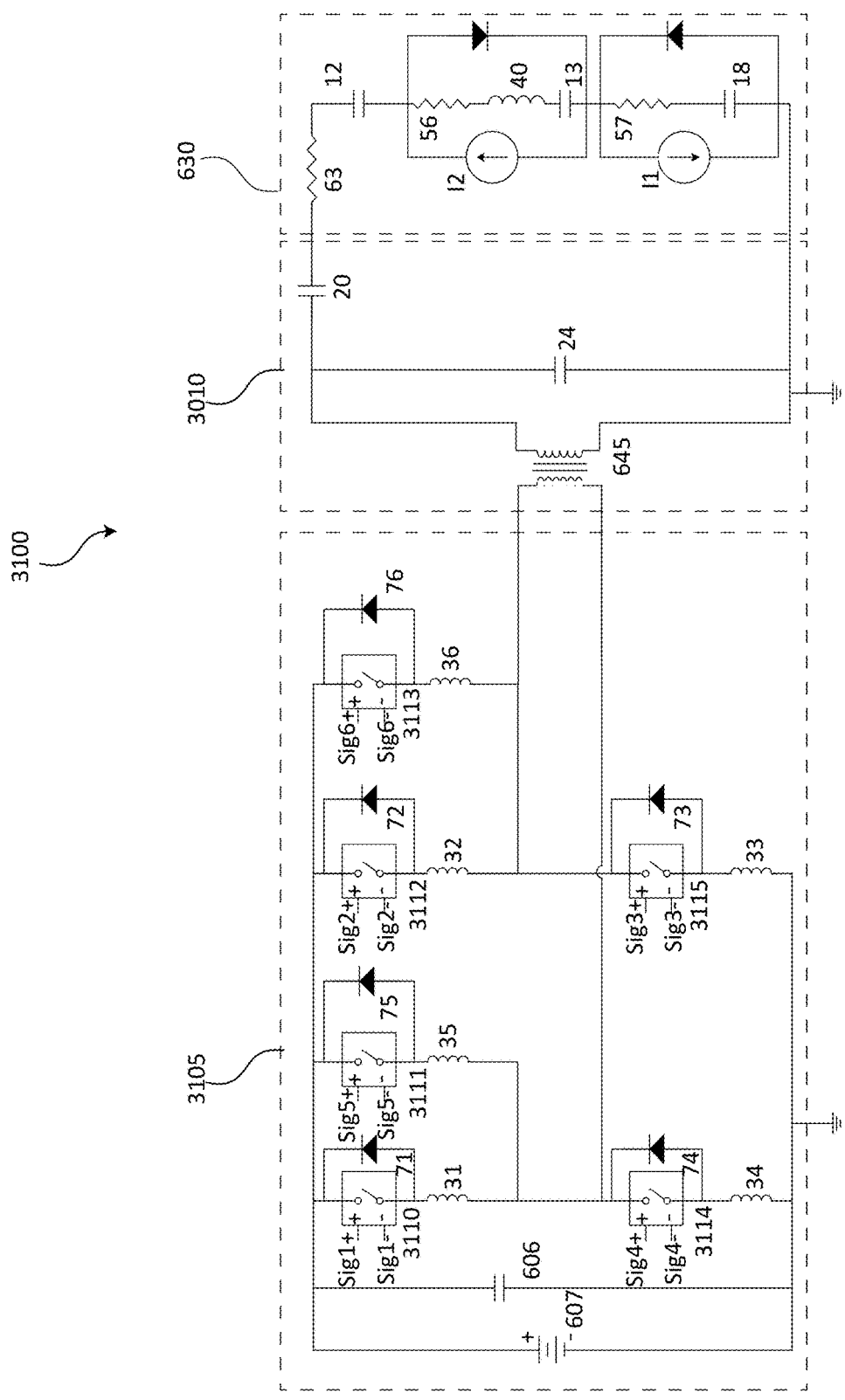
FIG. 31 is a circuit diagram of a plasma generator according to some embodiments.

FIG. 31 is a circuit diagram of a plasma generator 3100 according to some embodiments. The plasma generator 3100, for example, may include a pulse driver 3105, which is shown in a full bridge configuration; a transformer 645; and the load stage 630. The plasma generator 3100 may include the dampening circuit 2710, the dampening circuit 2810, or the dampening circuit 2910.

The capacitor 24 may represent the capacitance of the discharge geometry, any stray capacitance in the circuit, or the capacitance of any capacitors in the circuit. In some embodiments, the transformer 645 may or may not be included with the plasma generator 3100.

In some embodiments, the pulse driver 3105 may comprise switches arranged in a full bridge topology as shown. The bridge switches 3110, 3111, 3112, 3113, 3114, 3115 may switch DC charge stored within the energy storage capacitor 606. The voltage source 607, which may be a DC voltage source (e.g., a capacitive source, AC-DC converter, etc.), may charge the energy storage capacitor 606. The pulse driver 3105 may drive the dampening circuit 3110 with a pulse frequency that is or is not substantially equal to the resonate frequency of the dampening circuit 3110.

Each of the switches 3110, 3111, 3112, 3113, 3114, 3115 may include one or more switches arranged in series or parallel. For example, switch 3110 may comprise one, two, four, eight or twelve switches; switch 3111 may comprise one, two, four, eight or twelve switches; switch 3112 may comprise one, two, four, eight or twelve switches; switch 3113 may comprise one, two, four, eight or twelve switches; switch 3114 may comprise one, two, four, eight or twelve switches; and/or switch 3115 may comprise one, two, four, eight or twelve switches.

The pulse driver 3105, for example, may include pre-pulse switch 3111 and pre-pulse switch 3113. In this example, the pre-pulse switch 3111 may be placed across bridge switch 3110 and/or the pre-pulse switch 3113 may be placed across bridge switch 3112. The pre-pulse switch 3110 may pulse prior to bridge switch 3110 and/or the pre-pulse switch 3113 may pulse prior to bridge switch 3112 such as, for example, as shown in the waveforms shown in FIG. 39. The pre-pulse switch 3111 and the pre-pulse switch 3113 may be independently controlled and/or independently triggered relative to any other switches.

In some embodiments, the pulse driver 3105 may include a half bridge topology with two switches (e.g., as shown in FIG. 33) and a pre-pulse switch across bridge switch 3311 and/or a pre-pulse switch across bridge switch 3312.

Figure 32:
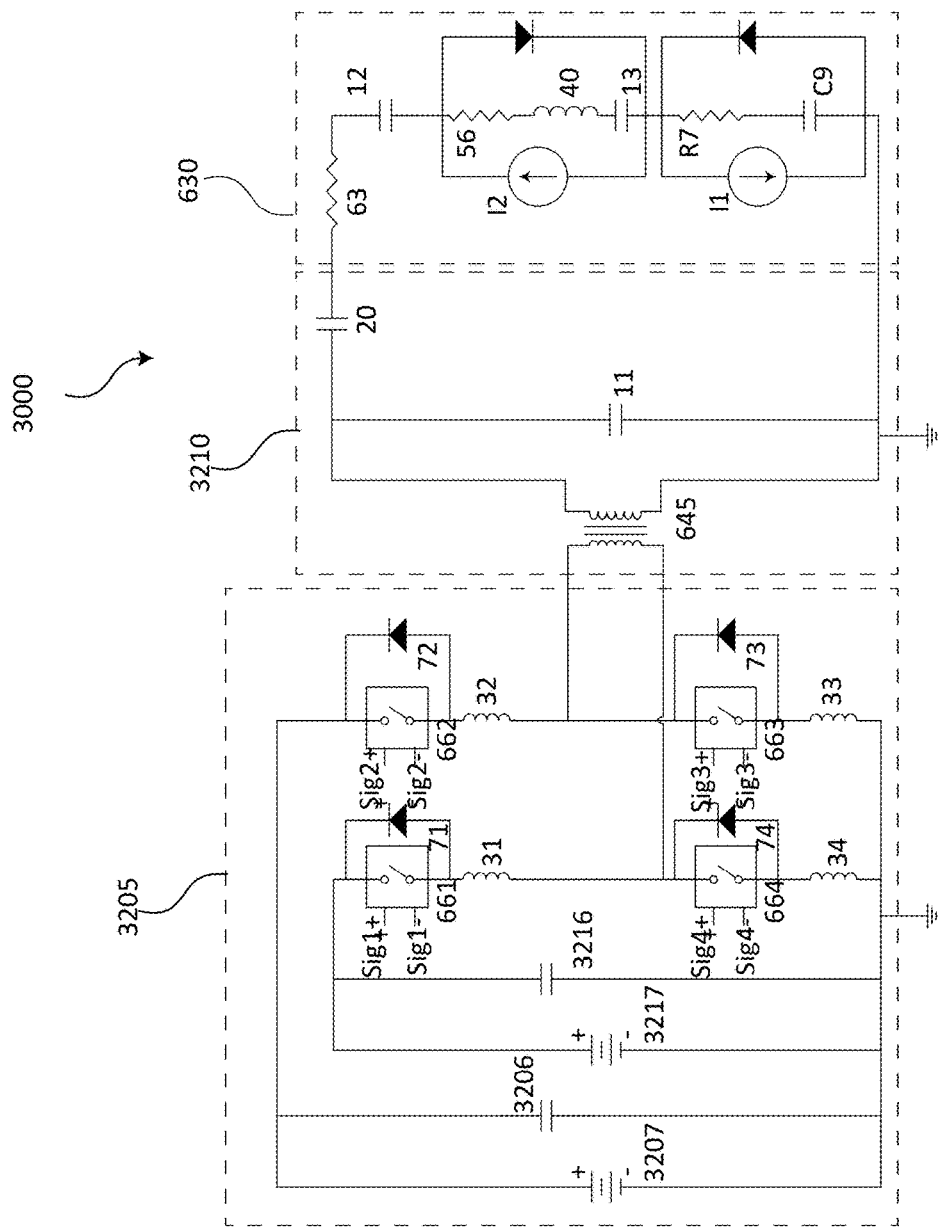
FIG. 32 is a circuit diagram of a plasma generator according to some embodiments.

FIG. 32 is a circuit diagram of a plasma generator 3200 according to some embodiments. The plasma generator 3200, for example, may include a pulse driver 3205, which is shown in a full bridge configuration; a transformer 645; and the load stage 630. The plasma generator 3200 may include a dampening circuit such as, for example, dampening circuit 2710, dampening circuit 2810, dampening circuit 2910, and/or dampening circuit 3010, etc.

In this example, the plasma generator 3200 comprises two power supplies that have the same or different potentials providing the same or different voltages. The switches 661, 663 may switch DC charge stored within the energy storage capacitor 3206. Input voltage source 3207 that may be a DC voltage source (e.g., a capacitive source, AC-DC converter, etc.), may charge the energy storage capacitor 3206. The switches 662, 664 may switch DC charge stored within the energy storage capacitor 3216. Input voltage source 3217 that may be a DC voltage source (e.g., a capacitive source, AC-DC converter, etc.), may charge the energy storage capacitor 3216.

The voltage provided by the energy storage capacitor 3206 and/or the input voltage source 3207 may be designated $V_1$, the pulse turn on time of switches 661, 663 may be designated $T_1$, the voltage provided by the energy storage capacitor 3216 and/or the input voltage source 3217 may be designated $V_2$, and the pulse turn on time of switches 662, 664 may be designated $T_2$. The voltages and switch turn on times may satisfy (or substantially satisfy) the following equation:

$$V_1 T_1 = V_2 T_2.$$

Alternatively or additionally, the integral of the waveform produced by switches 661, 663 may be substantially equal to the integral of the waveform produced by switches 662, 664.

The capacitor 11 may represent the capacitance of the discharge geometry, any stray capacitance in the circuit, or the capacitance of any capacitors in the circuit. In some embodiments, the transformer 645 may or may not be included with the plasma generator 3200.

In The pulse driver 3205 may drive a dampening circuit (e.g., dampening circuit 2710, dampening circuit 2810, dampening circuit 2910, dampening circuit 3010, etc.) with a pulse frequency that is or is not substantially equal to the resonate frequency of the dampening circuit.

FIG. 33 is a circuit diagram of a plasma generator 3300 according to some embodiments. The plasma generator 3300, for example, may include a pulse driver 3305, which is shown in a half bridge configuration; a transformer 645; and the load stage 630. The plasma generator 3300 may include a dampening circuit 3320 that includes resistor 3311 In some embodiments, plasma generator 3300 may include one or more diodes such as, for example, dampening diode 2811 and/or second dampening diode 2911.

The capacitor 11 may represent the capacitance of the discharge geometry, any stray capacitance in the circuit, or the capacitance of any capacitors in the circuit. In some embodiments, the transformer 645 may or may not be included with the plasma generator 3300.

In some embodiments, the pulse driver 3305 may comprise switches arranged in a half bridge topology as shown. Each of the bridge switches 3311, 3312 may be coupled with a diode 90 and diode 91. In some embodiments, each bridge switch 3311 or 3312 in the pulse driver 3305 can be switched independently or in conjunction with one or more of the other switches.

The bridge switch 3311 may switch DC charge stored within the energy storage capacitor 3306. Input voltage source 3307 that may be a DC voltage source (e.g., a capacitive source, AC-DC converter, etc.), may charge the energy storage capacitor 3306. The bridge switch 3312 may switch DC charge stored within the energy storage capacitor 3316. Input voltage source 3317 that may be a DC voltage source (e.g., a capacitive source, AC-DC converter, etc.), may charge the energy storage capacitor 3316.

The pulse driver 3305 may drive the dampening circuit 3320 with a pulse frequency that is or is not substantially equal to the resonate frequency of the dampening circuit 3320.

Figure 34:
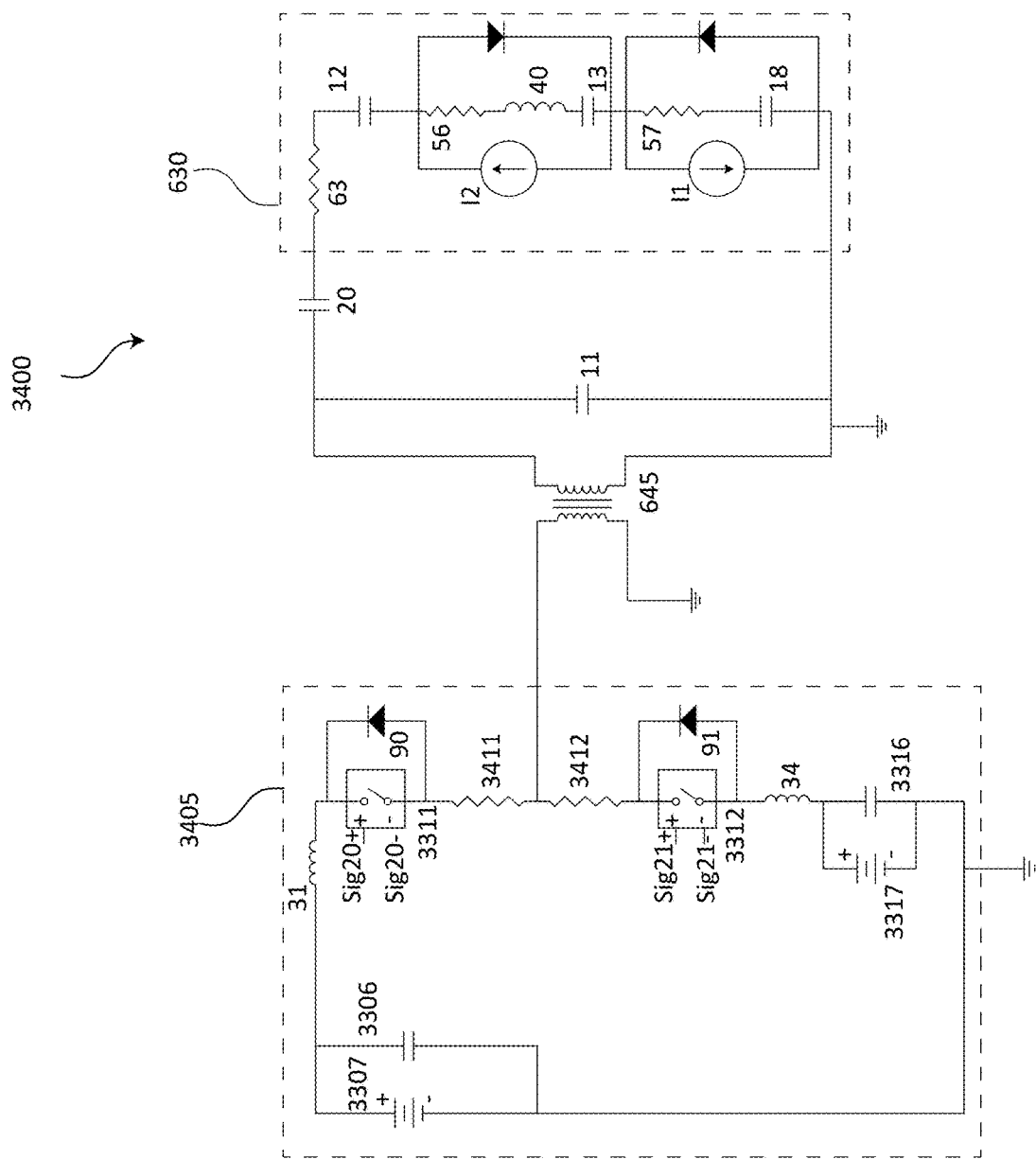
FIG. 34 is a circuit diagram of a plasma generator that is similar to plasma generator according to some embodiments.

FIG. 34 is a circuit diagram of a plasma generator 3400 that is similar to plasma generator 3300 according to some embodiments. The plasma generator 3400 does not include a dampening circuit.

Figure 35:
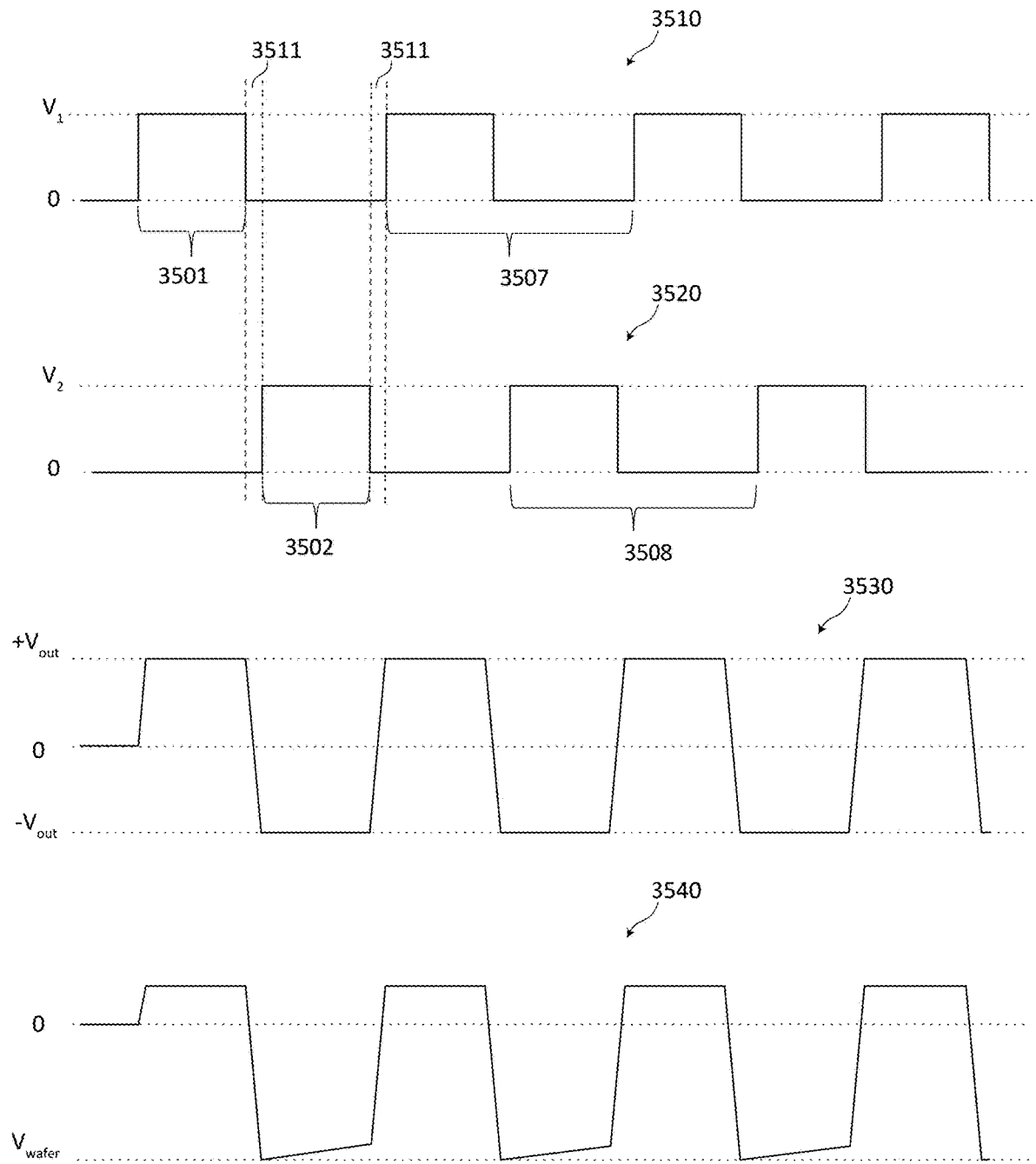
FIG. 35 shows four example waveforms that may, for example, be used or produced by a plasma generator according to some embodiments.

FIG. 35 shows four example waveforms that may, for example, be used or produced by a plasma generator such as, for example, plasma generator 2700, plasma generator 2800, plasma generator 2900, plasma generator 3000, plasma generator 3100, plasma generator 3200, plasma generator 3300, and/or plasma generator 3400. The first waveform 3510 shows the timing of opening and closing bridge switches 661 and 663 (or bridge switch 3311 in plasma generator 3300 or plasma generator 3400). The second waveform 3520 shows the timing of opening and closing bridge switches 662 and 664 (or bridge switch 3312 in plasma generator 3300 or plasma generator 3400). For example, the first waveform 3510 and the second waveform 3520 may have substantially the same voltages (e.g., $V_1 \cong V_2$). As another example, the first waveform 3510 and the second waveform 3520 may have substantially the same pulse widths (e.g., first pulse width 3501≅second pulse width 3502). As yet another example, the first waveform 3510 and the second waveform 3520 may have substantially the same period (e.g., period 3507≅period 3508). The first pulse width 3501 and/or the second pulse width 3502, for example, may be about 10 ns to 10 μs such as, for example, 10 ns, 100 ns, 1 μs, 10 μs, 100 μs, etc. The first waveform 3510 and/or the second waveform 3520 may have a pulse repetition frequency of about 1 kHz to 1,000 kHz such as, for example, 1 kHz, 10 kHz, 100 kHz, 1,000 kHz, etc. The period, for example, may be about 20 ns to 20 μs such as, for example, 20 ns, 200 ns, 2 µs, 20 µs, 200 µs, etc. The voltage, for example, being switched from each switch may be more than about 500 V, 1 kV, 3 kV, 5 kV, 6 kV, etc.

A dwell 3511 may occur between the fall of the first waveform 3510 and the rise of the second waveform 3520. The dwell 3511 may be set, for example, to ensure or reduce shoot through, which may occur when all the switches are closed and the load is shorted through the switches. The dwell 3511, for example, may be about 10 ns, 25 ns, 50 ns, 100 ns, etc.

The first waveform 3510 may output a voltage $V_1$ and the second waveform 3520 may output a voltage $V_2$. The voltage $V_1$, for example, may equal voltage $V_2$. As another example, the voltage $V_1$ may not equal voltage $V_2$. The voltage $V_1$ and/or the voltage $V_2$ may be about The third waveform 3530 shows the output voltage of the pulse driver and the dampening circuit such as, for example, the voltage at circuit point labeled 124. The flat top voltage $V_{out}$ may be about ±1 kV, 5 kV, 10 kV, 20 kV, 30 kV, etc. The fourth waveform 3540 shows the pulse on a wafer within the load stage 630 such as, for example, the voltage at circuit point 123. The wafer voltage of $V_{wafer}$ may be about −1 kV, −5 kV, −10 kV, −15 kV, −20 kV, −30 kV, etc.

Figure 36:
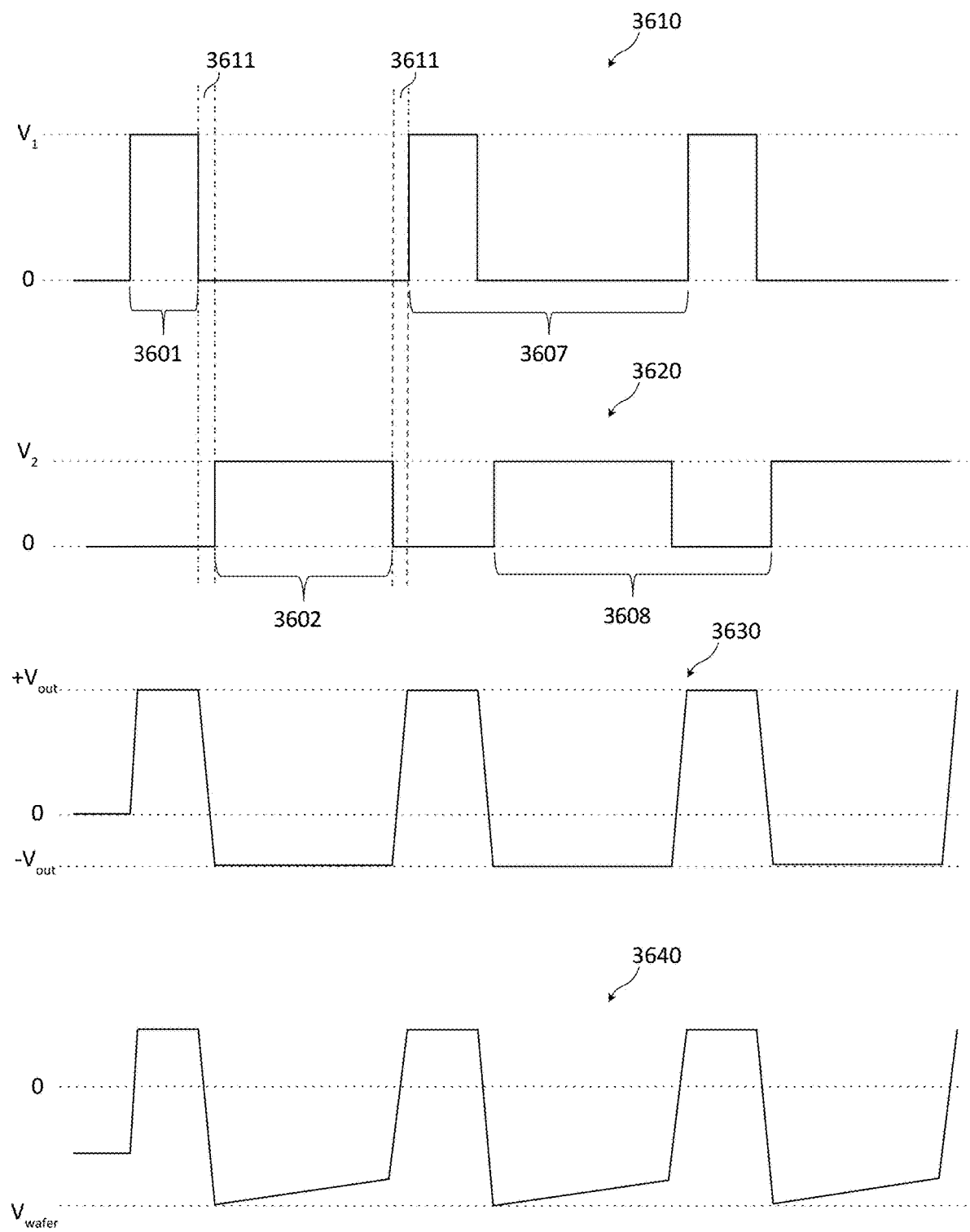
FIG. 36 shows four example waveforms that may, for example, be used or produced by a plasma generator according to some embodiments.

FIG. 36 shows four example waveforms that may, for example, be used or produced by a plasma generator such as, for example, plasma generator 2700, plasma generator 2800, plasma generator 2900, plasma generator 3000 plasma generator 3100, plasma generator 3200, plasma generator 3300, and/or plasma generator 3400. The first waveform 3610 shows the timing of opening and closing bridge switches 661 and 664 (or bridge switch 3311 in plasma generator 3300 or plasma generator 3400). The second waveform 3620 shows the timing of opening and closing bridge switches 662 and 663 (or bridge switch 3312 in plasma generator 3300 or plasma generator 3400). For example, the first waveform 3610 and the second waveform 3620 may have substantially different voltages (e.g., $V_1 \not\approx V_2$). As another example, the first waveform 3610 and the second waveform 3620 may have substantially different pulse widths (e.g., first pulse width 3601 ≠ second pulse width 3602). As yet another example, the first waveform 3610 and the second waveform 3620 may have substantially the same period (e.g., period 3607≅period 3608).

The first waveform 3610 has a flattop voltage $V_1$ and the second waveform 3620 has a flattop voltage $V_2$. The voltages ($V_1$ and $V_2$) and switch turn on times (pulse widths 3601 may satisfy (or substantially satisfy) the following equation:

$$V_1 T_1 \cong V_2 T_2.$$

Alternatively or additionally, the integral of the waveform produced by switches 661, 663 may be substantially equal to the integral of the waveform produced by switches 662, 664 such as, for example:

$$\int_0^T V(t)dt = 0,$$

where T is a whole number of periods such as, for example, period 3607 or period 3608.

A dwell 3611 may occur between the fall of the first waveform 3610 and the rise of the second waveform 3602. The dwell 3611 may be set, for example, to ensure or reduce shoot through, which may occur when all the switches are closed and the load is shorted through the switches. The dwell 3611, for example, may be about 10 ns, 25 ns, 50 ns, 100 ns, etc.

The third waveform 3630 shows the output voltage of the pulse driver and the dampening circuit such as, for example,
the voltage at circuit point labeled 124. The flat top voltage $V_{out}$ may be ±1, 5, 10, 20, 30 kV. The fourth waveform 3640 shows the pulse on a wafer within the load stage 630 such as, for example, the voltage at circuit point 123. The wafer voltage of $V_{wafer}$ may be about −1 kV, −5 kV, −10 kV, −15 kV, −20 kV, −30 kV, etc.

Figure 37:
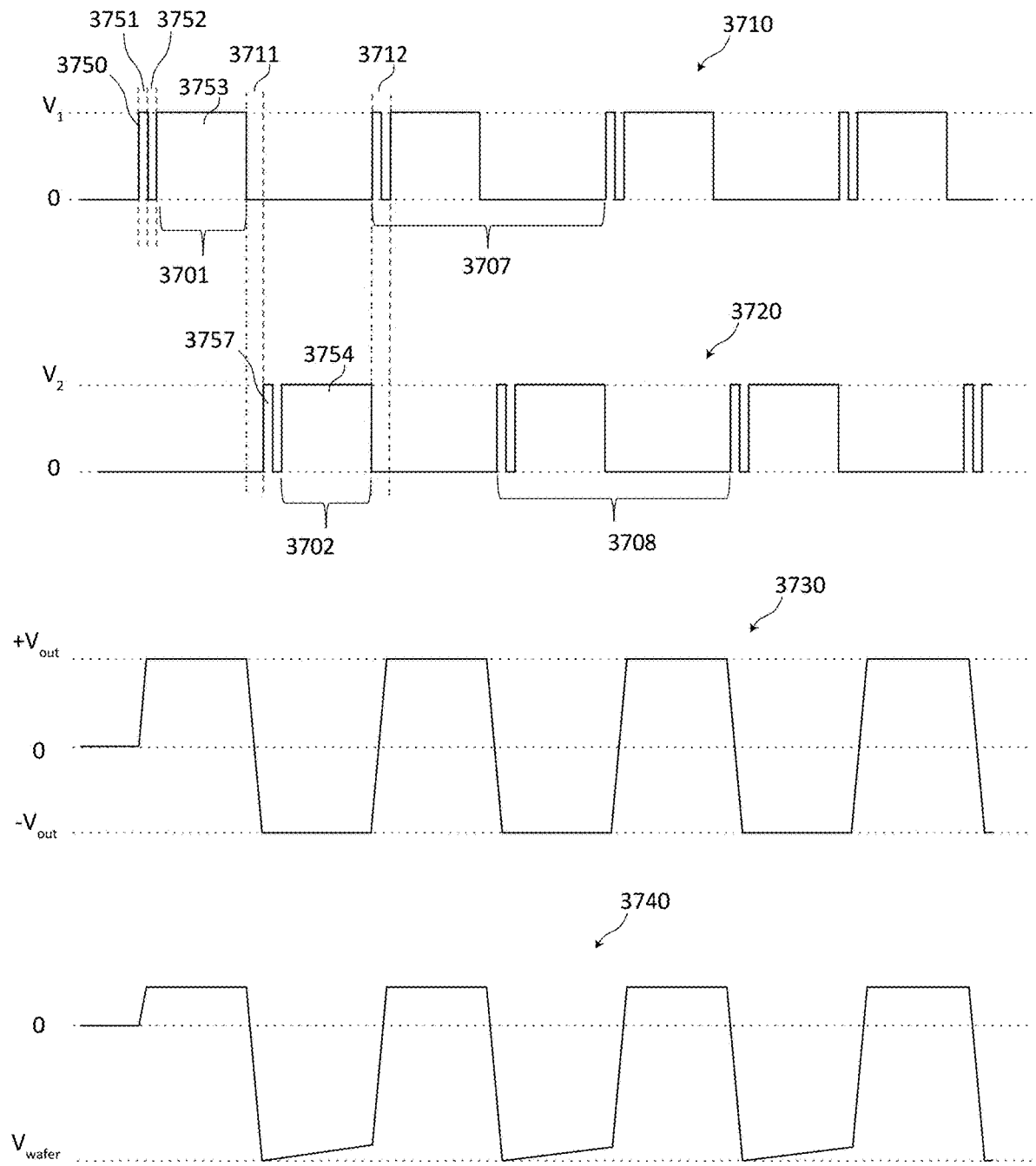
FIG. 37 shows four example waveforms that may, for example, be used or produced by a plasma generator according to some embodiments.

FIG. 37 shows four example waveforms that may, for example, be used or produced by a plasma generator such as, for example, plasma generator 2700, plasma generator 2800, plasma generator 2900, plasma generator 3000, plasma generator 3100, and/or plasma generator 3200. The first waveform 3710 shows the timing of opening and closing bridge switches 661 and 663 (or bridge switch 3311 in plasma generator 3300 or plasma generator 3400) and may include a pre-pulse 3750. The second waveform 3720 shows the timing of opening and closing bridge switches 662 and 664 (or bridge switch 3312 in plasma generator 3300 or plasma generator 3400) and may include a pre-pulse 3750.

A pre-pulse 3750, for example, may occur on every pulse on either or both waveform 3710 and/or waveform 3720. As another example, a pre-pulse 3750, for example, may occur on every other pulse on either or both waveform 3710 and/or waveform 3720. As another example, a pre-pulse 3750, for example, may alternate between pulses on either or both waveform 3710 and/or waveform 3720.

For example, the pre-pulse 3750 may have a pulse width 3751 of about 10 nanoseconds. A pause 3752 between the pre-pulse 3750 and the main pulse 3753 may be about 10 ns-500 ns such as, for example, about 10 ns, 50 ns, 100 ns, 250 ns, 500 ns, etc. As another example, the pulse width 3751 of the pre-pulse 3750 may be about 2% of the pulse width 3701 of the main pulse 3753. For example, the time period between the rising edge of the pre-pulse 3750 and the rising edge of the main pulse 3753 may be about 50 ns.

In some embodiments, the pulse width 3701 and/or the pulse width 3702 may be drastically longer than the pulse width 3751 such as, for example, 1,000%, 5,000%, 10,000%, 15,000%, etc. longer.

In some embodiments, the switch 661, the switch 662, the switch 663, and/or the switch 664 may include a plurality of switches arranged in parallel (and/or series). The pre-pulse 3750, for example, may be produced by closing all of the plurality of switches of switch 661 and/or all of the plurality of switches of switch 664. The pre-pulse 3757, for example, may be produced by closing one of the plurality of switches of switch 662 and/or one of the plurality of switches of switch 663.

In some embodiments, the switch 3311 and/or the switch 3312 may include a plurality of switches arranged in parallel (and/or series). The pre-pulse 3750, for example, may be produced by closing all of the plurality of switches of switch 3311. The pre-pulse 3757, for example, may be produced by closing one of the plurality of switches of switch 3312.

The pre-pulse 3750 and/or the pre-pulse 3757 may mitigate ringing and/or voltage or current overshoots that can be caused by stray inductance and/or stray capacitance (or the interaction between the two). The third waveform 3730 shows the output voltage of the pulse driver and/or the dampening circuit such as, for example, the voltage at circuit point labeled 124. The flat top voltage $V_{out}$ may be ±1, 5, 10, 20, 30 kV. The fourth waveform 3740 shows the pulse on a wafer within the load stage 630 such as, for example, the voltage at circuit point 123. The wafer voltage of $V_{wafer}$ may be about −1 kV, −5 kV, −10 kV, −15 kV, −20 kV, −30 kV, etc.

A dwell 3711 may occur between the fall of the main pulse 3753 and the rise of the pre-pulse 3757 of the second waveform 3702. The dwell 3711 may be set, for example, to ensure or reduce shoot through, which may occur when all the switches are closed and the load is shorted through the switches. The dwell 3711, for example, may be about 10 ns, 25 ns, 50 ns, 100 ns, etc.

Figure 38:
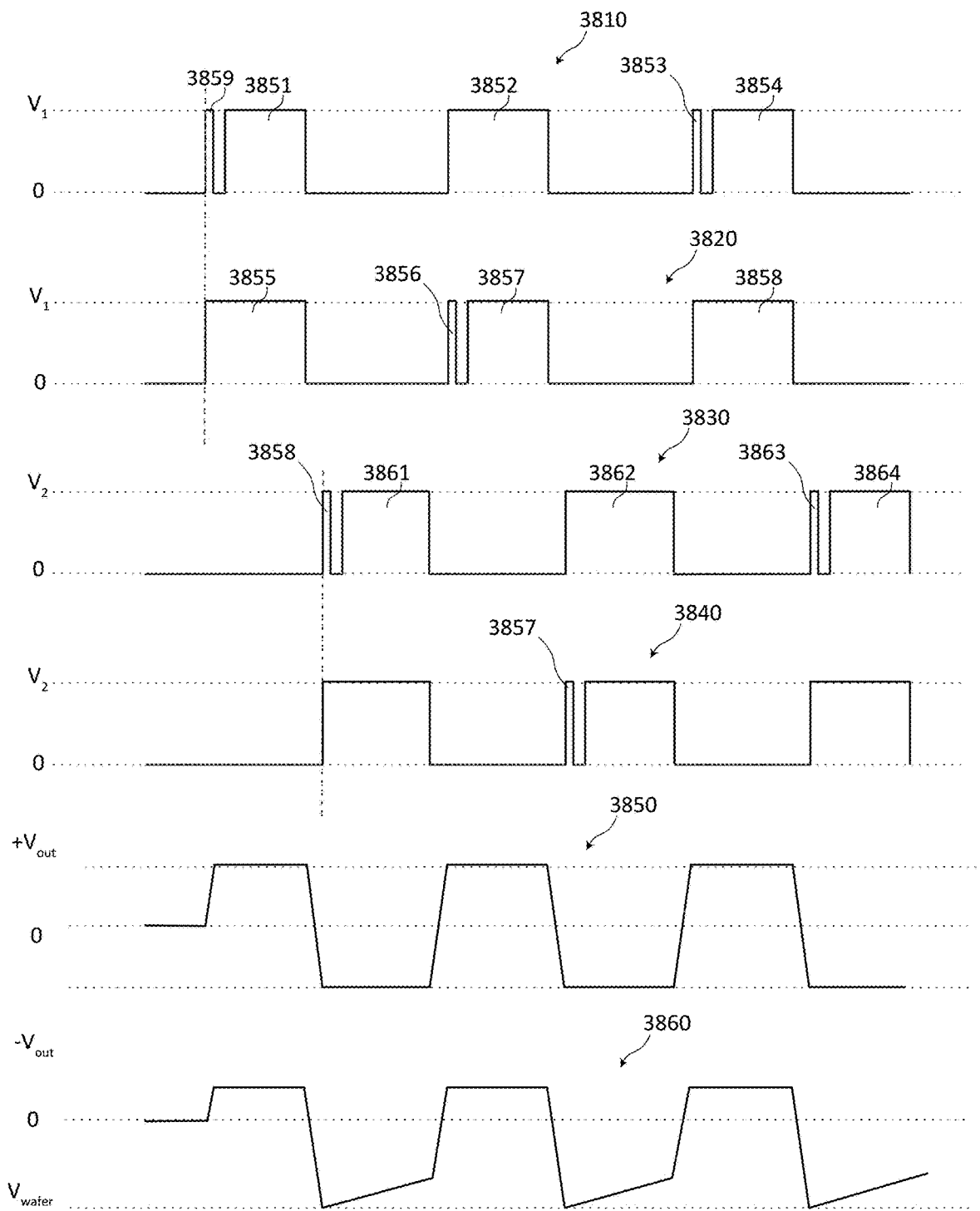
FIG. 38 shows six example waveforms that may, for example, be used or produced by a plasma generator according to some embodiments.

FIG. 38 shows six example waveforms that may, for example, be used or produced by a plasma generator such as, for example, plasma generator 2700, plasma generator 2800, plasma generator 2900, plasma generator 3000, plasma generator 3100, and/or plasma generator 3200. The first waveform 3810 shows the timing of opening and closing of the bridge switch 661. The second waveform 3820 shows the timing of opening and closing of the bridge switch 664. The third waveform 3830 shows the timing of opening and closing of the bridge switch 662. The fourth waveform 3840 shows the timing of opening and closing of the bridge switch 663.

A pre-pulse 3859 may occur on every other pulse on each of the first waveform 3810, the second waveform 3820, the third waveform 3830, and/or the fourth waveform 3840. For example, the first waveform 3810 includes a waveform having a first pulse 3851 with a pre-pulse 3859, a second pulse 3852 without a pre-pulse, a third pulse 3854 with a pre-pulse 3853, and so on. As another example, the second waveform 3820 includes a waveform having a first pulse 3855 without a pre-pulse, a second pulse 3857 with a pre-pulse 3856, a third pulse 3858 without a pre-pulse, and so on.

For example, the third waveform 3830 includes a waveform having a first pulse 3861 with a pre-pulse 3858, a second pulse 3862 without a pre-pulse, a third pulse 3864 with a pre-pulse 3863, and so on. As another example, the fourth waveform 3840 includes a waveform having a first pulse without a pre-pulse, a second pulse with a pre-pulse, a third pulse without a pre-pulse, and so on. The first waveform 3810 and the second waveform 3820 may have similar timing such as, for example, the pre-pulse of one waveform and the pulse of another waveform are aligned in time. For example, the rising edge of the pre-pulse 3859 of the first pulse 3851 may be aligned with the first pulse 3855. As another example, the falling edge of the first pulse 3851 may be aligned with the falling edge of the first pulse 3855.

For example, the leading edge or the rise of the first pulse 3855 of the second waveform 3820 produced by the bridge switch 662 may be aligned or substantially aligned with the leading edge or the rise of the pre-pulse 3859 of the first waveform 3810 produced by the bridge switch 661. As another example, the leading edge or the rise of the second pulse 3852 of the first waveform 3810 may be aligned or substantially aligned with the leading edge or the rise of the pre-pulse 3856 of the second waveform 3820.

In some embodiments, the switch 661, the switch 662, the switch 663, and/or the switch 664 may include a plurality of switches arranged in parallel (and/or series). The pre-pulse 3859, for example, may be produced by closing all or a subset of the plurality of switches of switch 661. The pre-pulse 3856, for example, may be produced by closing all or a subset of the plurality of switches of switch 664. The pre-pulse 3859, for example, may be produced by closing all or a subset of the plurality of switches of switch 662. The pre-pulse 3857, for example, may be produced by closing all or a subset of the plurality of switches of switch 663.

In some embodiments, the pre-pulses may mitigate ringing and/or voltage or current overshoots in that can be caused by stray inductance and/or stray capacitance (or the interaction between the two).

The fifth waveform 3850 shows the output voltage of the pulse driver and/or the dampening circuit such as, for example, the voltage at circuit point labeled 124. The flat top voltage $V_{out}$ may be ±1, 5, 10, 20, 30 kV. The sixth waveform 3860 shows the pulse on a wafer within the load stage 630 such as, for example, the voltage at circuit point 123. The wafer voltage of $V_{wafer}$ may be about −1 kV, −5 kV, −10 kV, −15 kV, −20 kV, −30 kV, etc.

In some embodiments, because of the pre-pulses, the effective pulse repetition frequency of the first waveform 3810, second waveform 3820, third waveform 3830, and/or fourth waveform 3840 may be 150% of the pulse repetition frequency of the fifth waveform 3850 and/or the sixth waveform 3860

Figure 39:
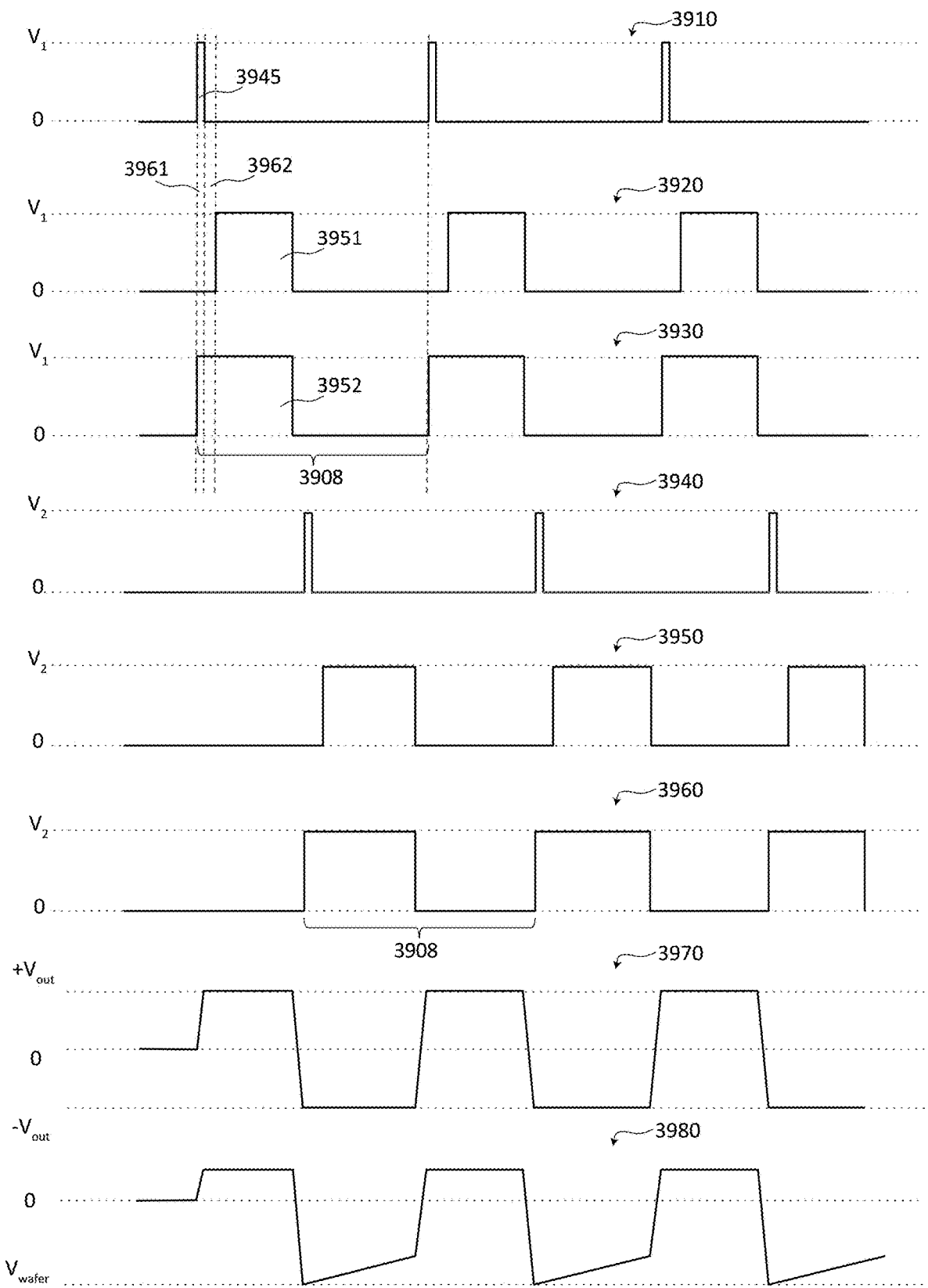
FIG. 39 shows six example waveform that may, for example, be used or produced by a plasma generator according to some embodiments.

FIG. 39 shows eight example waveforms that may, for example, be used or produced by a plasma generator 3100. The first waveform 3910 shows the timing of opening and closing of the pre-pulse switch 3110. The second waveform 3920 shows the timing of opening and closing of the bridge switch 3111. The third waveform 3930 shows the timing of opening and closing of the bridge switch 3112. The fourth waveform 3940 shows the timing of opening and closing of the pre-pulse switch 3113. The fifth waveform 3950 shows the timing of opening and closing of the bridge switch 3114. The sixth waveform 3960 shows the timing of opening and closing of the bridge switch 3115.

The seventh waveform 3970 shows the output voltage of the pulse driver and/or the dampening circuit such as, for example, the voltage at circuit point labeled 124. The flat top voltage $V_{out}$ may be ±1, 5, 10, 20, 30 kV. The eighth waveform 3980 shows the pulse on a wafer within the load stage 630 such as, for example, the voltage at circuit point 123. The wafer voltage of $V_{wafer}$ may be about −1 kV, −5 kV, −10 kV, −15 kV, −20 kV, −30 kV, etc.

For example, the leading edge or the rise of the pulse 3952 of the third waveform 3930 produced by the bridge switch 3112 may be aligned or substantially aligned with the leading edge or the rise of the pre-pulse 3945 of the first waveform 3910 produced by the pre-pulse switch 3110. As another example, the leading edge or the rise of every pulse of the third waveform 3930 produced by the bridge switch 3112 may be aligned or substantially aligned with the leading edge or the rise of each pre-pulse of the first waveform 3910 produced by the pre-pulse switch 3110.

For example, the pre-pulse 3945 may have a pulse width 3961 of about 5 ns to about 50 ns such as, for example, 1 ns, 10 ns, 20 ns, 40 ns 50 ns, etc. A pause 3962 between the pre-pulse 3945 of the first waveform 3910 and the main pulse 3951 of the second waveform 3920 may be about 5 ns to about 50 ns such as, for example, 1 ns, 10 ns, 20 ns, 40 ns 50 ns, etc. As another example, the pulse width 3961 of the pre-pulse 3945 may be about 0.5%, 1%, 2%, 5%, etc. of the pulse width of the main pulse 3951 of the second waveform or may be about 0.5%, 1%, 2%, 5%, etc. of the pulse width of the main pulse 3952 of the second waveform.

The transformer 645 shown in any embodiment discussed in this document may include any type of transformer. For example, transformer 645 may include a toroid core with primary and secondary windings where the toroid core comprising bulk FeMnZn. As another example, the transformer 645 may include a planar transformer such as, for example, comprising FeMnZn. As another example, the transformer 645 may include a toroid core comprising NiFe Alloy tape. As another example, the transformer 645 may include a toroid core comprising an iron powder, a NiFeMb alloy powder, or FeSiAl alloy powder. As another example, the toroid core may comprise a long cylindrical transformer having a length of about 100 mm to about 500 mm (e.g., about 300 mm), an outer diameter of about 50 mm to about 200 mm (e.g., about 102 mm), and an inner diameter of about 20 mm to about 100 mm (e.g., about 66 mm).

Figure 40:
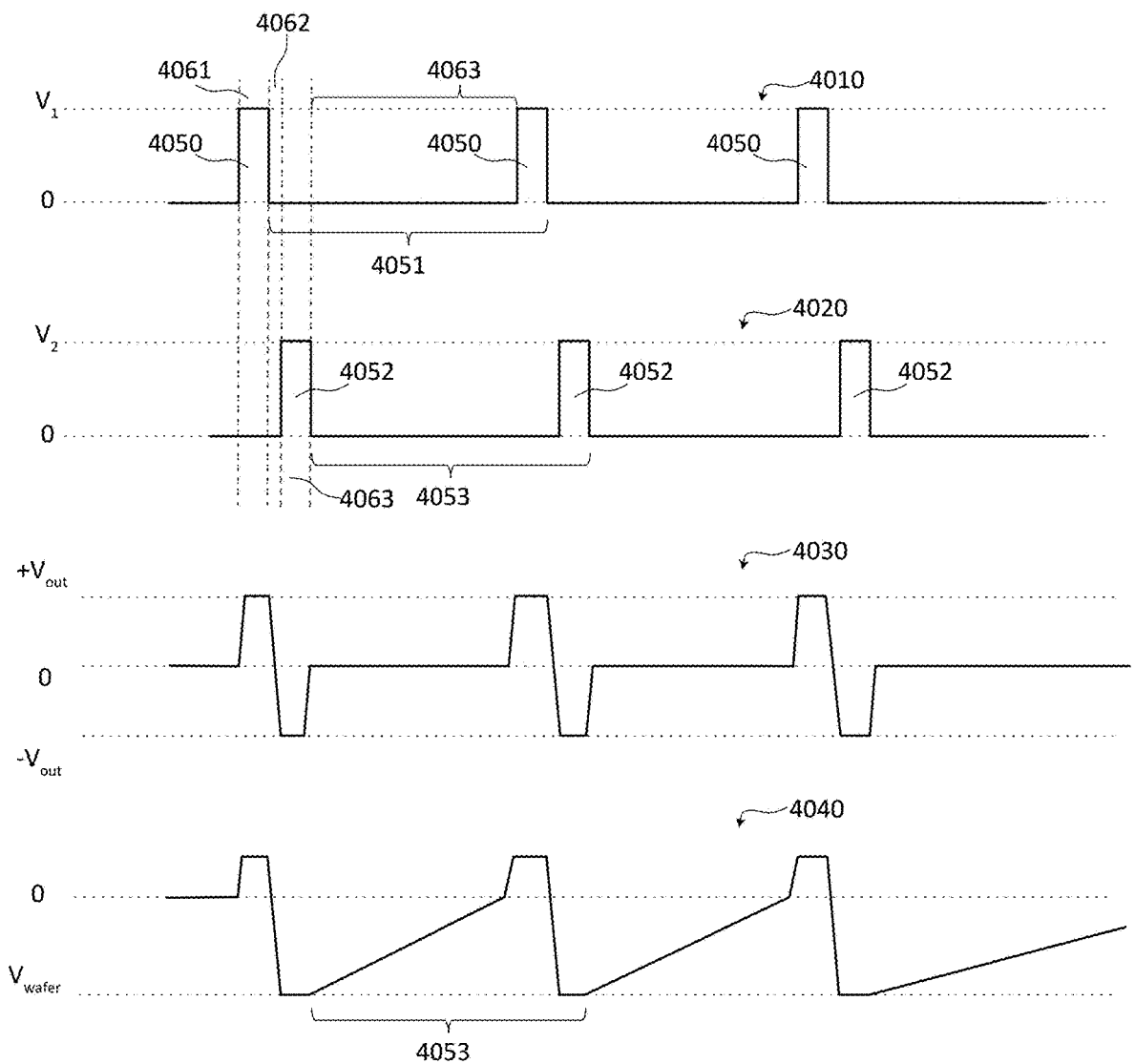
FIG. 40 shows four example waveforms that may, for example, be used or produced by a plasma generator according to some embodiments.

FIG. 40 shows four example waveforms that may, for example, be used or produced by a plasma generator such as, for example, plasma generator 2700, plasma generator 2800, plasma generator 2900, plasma generator 3000, plasma generator 3100, plasma generator 3200, plasma generator 3300, and/or plasma generator 3400.

The first waveform 4010 shows the timing of opening and closing bridge switches 661 and 663 (or bridge switch 3311 in plasma generator 3300 or plasma generator 3400). The first waveform 4010 includes first pulses 4050 with a short pulse width 4061 such as, for example, a pulse width less than about 100 ns to about 1,000 ns such as, for example, about 100 ns, 250 ns, 500 ns, 750 ns, or 1,000 ns, etc.

The second waveform 4020 shows the timing of opening and closing bridge switches 662 and 664 (or bridge switch 3312 in plasma generator 3300 or plasma generator 3400). The second waveform 4020 includes second pulses 4052 with a short pulse width 4063 such as, for example, a pulse width less than about 100 ns to about 1,000 ns such as, for example, about 100 ns, 250 ns, 500 ns, 750 ns, or 1,000 ns, etc. The pulse width 4061 and the pulse width 4063 may be substantially equal. The second pulse period 4053 and the first pulse period 4051 may be substantially the same. The second pulse period 4053 may be more than five (5) times the pulse width 4063. The first waveform 4010 and/or the second waveform 4020 may have a voltage $V_1$, which may be the voltage from energy storage capacitor 606, energy storage capacitor 3206, energy storage capacitor 3216, energy storage capacitor 3306, or energy storage capacitor 3316.

A dwell 4062 may occur between the fall of the first pulses 4050 and the rise of the second pulses 4052. The dwell 4062 may be set, for example, to ensure or reduce shoot through, which may occur when all the switches are closed and the load is shorted through the switches. The dwell 4062, for example, may be about 10 ns, 25 ns, 50 ns, 100 ns, etc.

The third waveform 4030 shows the output voltage of a pulse driver and/or a dampening circuit such as, for example, the voltage at circuit point labeled 124. The flat top voltage $V_{out}$ may be ±1, 5, 10, 20, 30 kV. The output voltage of the pulse driver may include short positive pulses and short negative pulses with a period 4054 substantially equal to period 4051 and/or period 4052.

The fourth waveform 4040 shows the pulse on a wafer within the load stage 630 such as, for example, the voltage at circuit point 123. The wafer voltage of $V_{wafer}$ may be about −1 kV, −5 kV, −10 kV, −15 kV, −20 kV, −30 kV, etc. Because the pulse width 4061 and/or the pulse width 4063 are shorter than in other examples, the output volte on the wafer, $V_{wafer}$, may be lower than in other examples.

In some embodiments, the bridge switches 662 and 664 (or bridge switch 3312 in plasma generator 3300 or plasma generator 3400) may be open while the bridge switches 661 and 663 (or bridge switch 3311 in plasma generator 3300 or plasma generator 3400) are producing pulses as shown in first waveform 4010. For example, the waveform 4020 may include no pulses and continuously be at zero volts.

In some embodiments, any of the first pulses 4050 and/or second pulses 4052 may include a pre-pulse.

Figure 41:
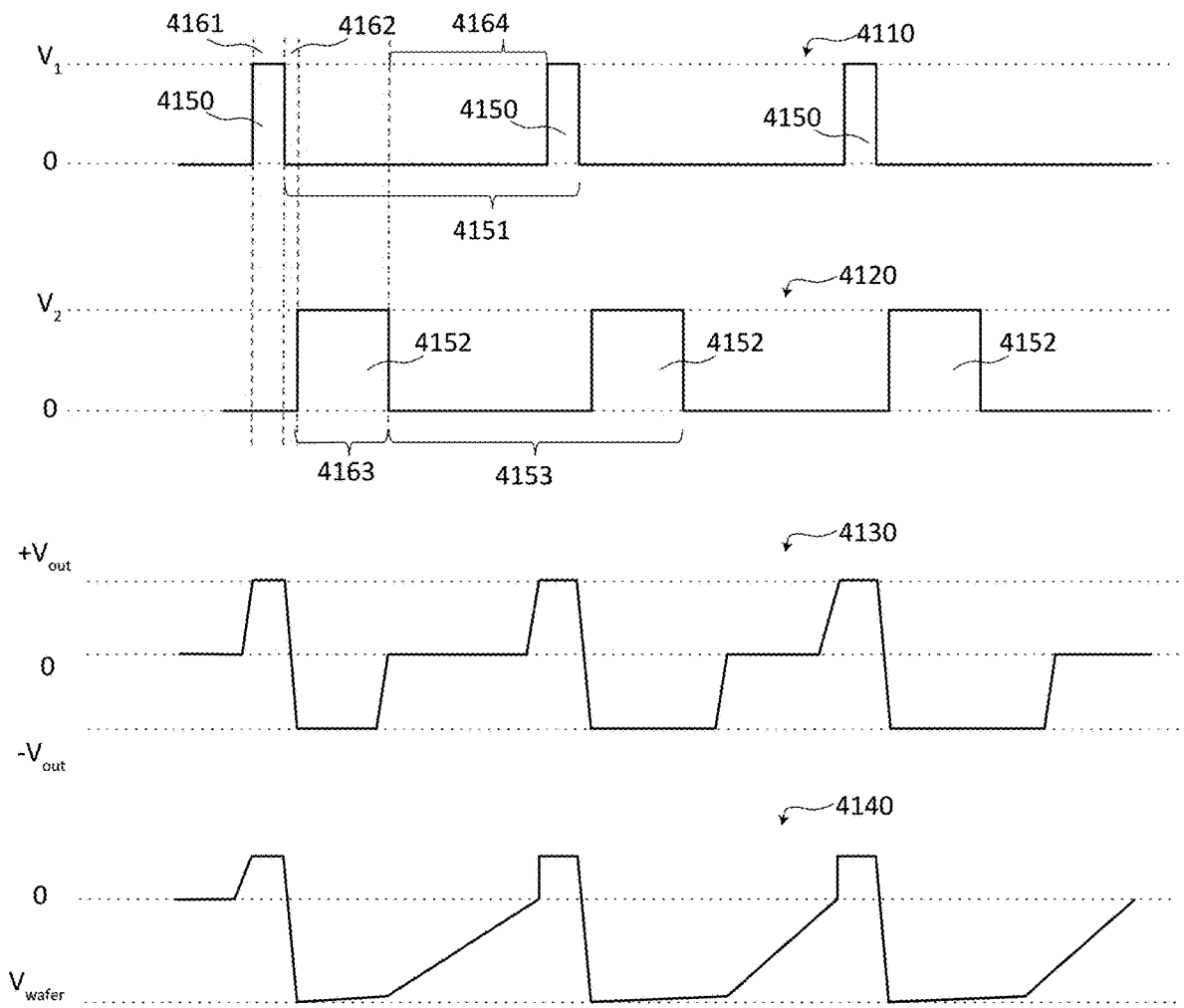
FIG. 41 shows four example waveforms that may, for example, be used or produced by a plasma generator according to some embodiments.

FIG. 41 shows four example waveforms that may, for example, be used or produced by a plasma generator such as, for example, plasma generator 2700, plasma generator 2800, plasma generator 2900, plasma generator 3000, plasma generator 3100, plasma generator 3200, plasma generator 3300, and/or plasma generator 3400.

The first waveform 4110 shows the timing of opening and closing bridge switches 661 and 663 (or bridge switch 3311 in plasma generator 3300 or plasma generator 3400). The first waveform 4110 includes first pulses 4150 with a short pulse width 4161 such as, for example, a pulse width less than about 100 ns to about 1,000 ns such as, for example, about 100 ns, 250 ns, 500 ns, 750 ns, or 1,000 ns, etc. The first pulse period 4151 may be more than five (5) times the pulse width 4161.

The second waveform 4120 shows the timing of opening and closing bridge switches 662 and 664 (or bridge switch 3312 in plasma generator 3300 or plasma generator 3400). The second waveform 4120 includes second pulses 4152 with a short pulse width 4163 such as, for example, a pulse width less than about 100 ns to about 2,000 ns such as, for example, about 100 ns, 250 ns, 500 ns, 750 ns, 1,000 ns, 1,500 ns, 2,000 ns, etc. The pulse width 4161 and the pulse width 4163 are not substantially equal. The second pulse period 4153 and the first pulse period 4151 may be substantially the same. The second pulse period 4153 may be more than two (2) times the pulse width 4163.

In some embodiments, the first waveform may have a first voltage $V_1$, which may be the voltage from energy storage capacitor 3216 or energy storage capacitor 3306; and the second waveform may have a second voltage $V_2$, which may be the voltage from energy storage capacitor 3206 or energy storage capacitor 3316. For example, the first voltage $V_1$ and the second voltage $V_2$ may be substantially different or substantially the same. As another example, the product of the first voltage $V_1$ and the pulse width 4161 may be substantially similar to the product of the second voltage $V_2$ and the pulse width 4153. As another example, the integral of the first waveform 4110 and the integral of the second waveform 4120 may be substantially the same.

A dwell 4162 may occur between the fall of the first pulses 4150 and the rise of the second pulses 4152. The dwell 4162 may be set, for example, to ensure or reduce shoot through, which may occur when all the switches are closed and the load is shorted through the switches. The dwell 4162, for example, may be about 10 ns, 25 ns, 50 ns, 100 ns, 250 ns, 500 ns, 750 ns, 1,000 ns, 10 μs, 25 μs, 50 μs, 100 μs, etc.

The third waveform 4130 shows the output voltage of a pulse driver and/or a dampening circuit such as, for example, the voltage at circuit point labeled 124. The flat top voltage $V_{out}$ may be ±1, 5, 10, 20, 30 kV. The output voltage of the pulse driver may include short positive pulses and short negative pulses with a period 4154 substantially equal to period 4151 and/or period 4052.

The fourth waveform 4140 shows the pulse on a wafer within the load stage 630 such as, for example, the voltage at circuit point 123. The wafer voltage of $V_{wafer}$ may be about −1 kV, −5 kV, −10 kV, −15 kV, −20 kV, −30 kV, etc. Because the pulse width 4161 is shorter than the pulse width 4163, the negative voltage on the wafer, $V_{wafer}$, as shown in waveform 4140, may be greater than the positive voltage on the wafer.

In some embodiments, any of the first pulses 4150 and/or second pulses 4152 may include a pre-pulse.

Figure 42:
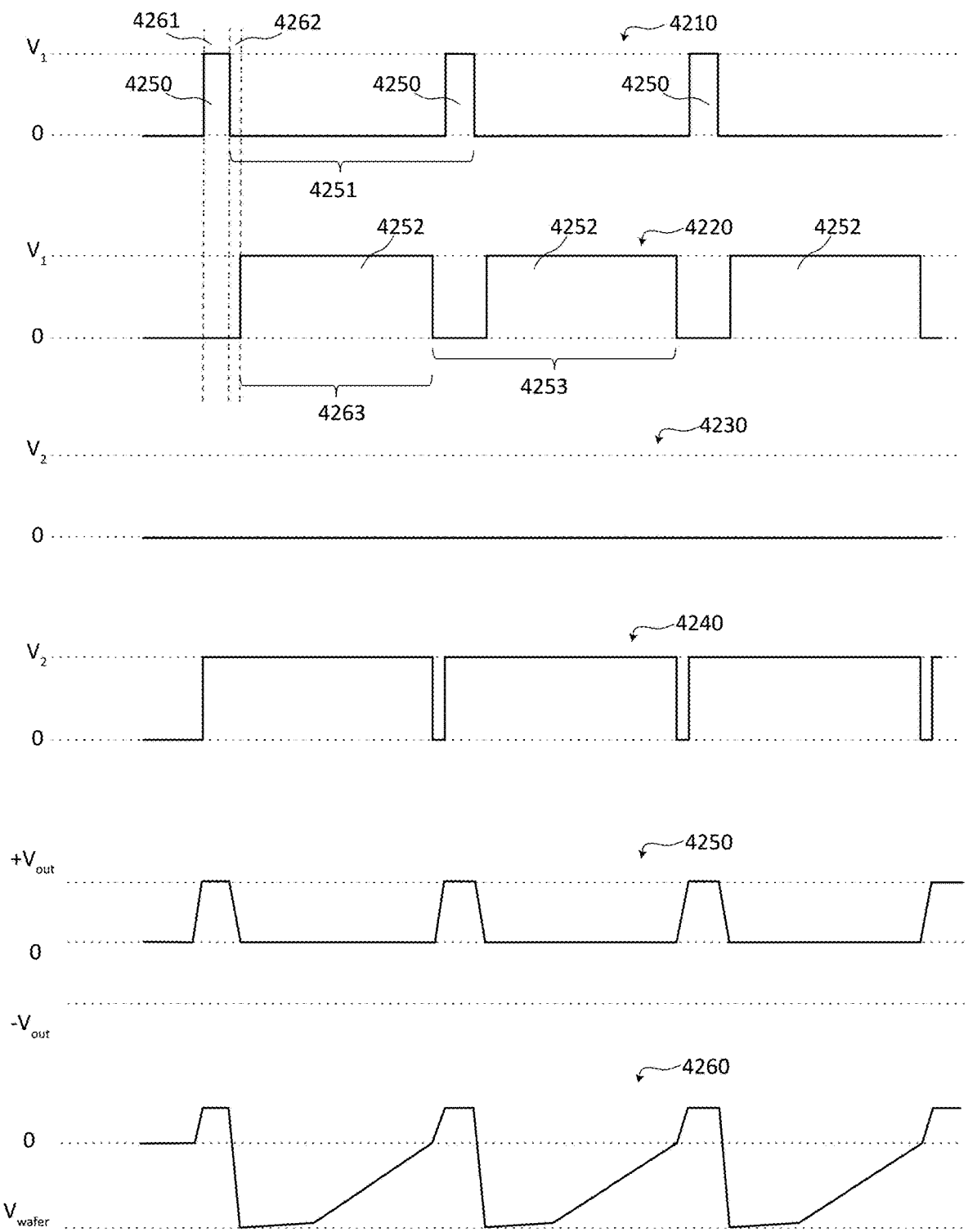
FIG. 42 shows six example waveform that may, for example, be used or produced by a plasma generator according to some embodiments.

FIG. 42 shows six example waveforms that may, for example, be used or produced by a plasma generator such as, for example, plasma generator 2700, plasma generator 2800, plasma generator 2900, plasma generator 3000, plasma generator 3100, and/or plasma generator 3200.

The first waveform 4210 shows the timing of opening and closing bridge switch 661. The first waveform 4210 includes first pulses 4250 with a short pulse width 4261 such as, for example, a pulse width less than about 100 ns to about 1,000 ns such as, for example, about 100 ns, 250 ns, 500 ns, 750 ns, or 1,000 ns, etc.

The second waveform 4220 shows the timing of opening and closing bridge switch 664. The second waveform 4220 includes second pulses 4252 with a pulse width 4263 such as, for example, a pulse width less than about 500 ns, 750 ns, 1 µs, 2 µs, 5 µs, etc. The pulse width 4263 may be 2 to 10 times the width of the pulse width 4263. The second pulse period 4253 and the first pulse period 4251 may be substantially the same. The second pulse period 4253 may be more than about 1.25, 1.5, or 2 times the pulse width 4263.

There may be a dwell 4262 between when the first pulse 4250 opens and the second pulse 4252 closes. The dwell 4262 may be set, for example, to ensure or reduce shoot through, which may occur when all the switches are closed and the load is shorted through the switches. The dwell 4262, for example, may be about 10 ns, 25 ns, 50 ns, 100 ns, etc.

The third waveform 4230 shows the bridge switch 662 open indefinitely or for a period of many multiple first pulse periods 4251. Alternatively, the bridge switch could be closed indefinitely or for a period of time or for a period of many multiple first pulse periods 4251.

The fourth waveform 4240 shows the timing of opening and closing bridge switch 663. In this example, the bridge switch 663 is closed at least about 80%, 85%, 90%, or 95% of the time. The bridge switch 663 may be open when the bridge switch 661 and the bridge switch 664 are simultaneously open and/or during the dwell 4262.

The dampening circuits discussed in any embodiment in this document may include one or more resistors disposed on the primary side of the transformer 645 or the negative side of the transformer 645.

The bridge switches 661, 662, 663, 664, 3310, 3311, 3312, 3313, 3314, 3315 may include one or more of any type of solid-state switch such as, for example, IGBTs, a MOSFETs, a SiC MOSFETs, SiC junction transistors, FETs, SiC switches, GaN switches, photoconductive switches, etc. These bridge switches 661, 662, 663, 664, 3310, 3311, 3312, 3313, 3314, 3315 may be switched at high frequencies and/or may produce a high voltage pulses. These frequencies may, for example, include frequencies of about 400 kHz, 0.5 MHz, 2.0 MHz, 4.0 MHz, 13.56 MHz, 27.12 MHz, 40.68 MHz, 50 MHz, etc.

Each switch of the bridge switches 661, 662, 663, 664, 3310, 3311, 3312, 3313, 3314, 3315 may be coupled in parallel with a bridge diode (e.g., bridge diode 71, 72, 73, 74, 75, 76) and may include bridge inductors (either stray inductance or an inductor) (e.g., bridge inductor 31, 32, 33, 34, 35, and/or 36). In some embodiments, the inductances of the stray inductors (e.g., bridge inductor 31, 32, 33, 34, 35, and/or 36) in a given circuit may be equal. In some embodiments, the inductances of the bridge inductor (e.g., bridge inductor 31, 32, 33, 34, 35, and/or 36) may be less than about 50 nH, 100 nH, 150 nH, 500 nH, 1,000 nH, etc. The combination of a bridge switch (e.g., bridge switch 661, 662, 663, 664, 3310, 3311, 3312, 3313, 3314, or 3315) and a bridge diode (e.g., bridge diode 71, 72, 73, 74, 75, or 76) may be coupled in series with a bridge inductor (e.g., bridge inductor 31, 32, 33, 34, 35, or 36).

Unless otherwise specified, the term "substantially" means within 5% or 10% of the value referred to or within manufacturing tolerances. Unless otherwise specified, the term "about" means within 5% or 10% of the value referred to or within manufacturing tolerances.

The term "or" is inclusive.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A pulsing power supply comprising:
    a power supply providing voltage of more than 2 kV;
    a transformer comprising:
        a transformer core;
        a primary winding wrapped around at least a portion of the transformer core, the primary winding having a first lead and a second lead; and
        a secondary winding wrapped around at least a portion of the transformer core;
    a first switch electrically connected with the first lead of the primary winding and the power supply;
    a second switch electrically connected with the second lead of the primary winding and the power supply, wherein the first switch and the second switch are opened and closed at different time intervals; and
    a pulsing output electrically coupled with the secondary winding of the transformer that outputs pulses having a voltage greater than about 2 kV and with pulse frequencies greater than 1 kHz.

2. The pulsing power supply according to claim 1, further comprising a dampening circuit electrically disposed between the first switch and/or the second switch and the transformer.

3. The pulsing power supply according to claim 2, wherein the dampening circuit comprises one or more resistors.

4. The pulsing power supply according to claim 3, wherein the one or more resistors have a resistance less than about 100 ohms.

5. The pulsing power supply according to claim 2, wherein the dampening circuit comprises one or more diodes electrically coupled with the one or more resistors.

6. A plasma system comprising:
    a plasma chamber; and
    the pulsing power supply of claim 1, the pulsing output is electrically coupled with the plasma chamber.

7. The pulsing power supply according to claim 1, wherein the transformer includes a material comprising FeMnZn.

8. The pulsing power supply according to claim 1, wherein the period of time between the first switch being opened and the second switch being closed is less than about 1,000 nanoseconds.

9. The pulsing power supply according to claim 1, wherein:
    the power supply comprises a first power supply and a second power supply;
    the first switch is electrically connected with the first power supply; and
    the second switch is electrically connected with the second power supply.

10. The pulsing power supply according to claim 9, wherein:
    the first power supply provides a first voltage and the second power supply provides a second voltage, the first voltage being different than the second voltage; and
    the time-integral of a voltage pulse measured between the first lead of the transformer and the second lead of the transformer over integral multiples of a period is zero, wherein the period comprises the time for the first switch to close and open and the second switch to close and open.

11. The pulsing power supply according to claim 9, wherein:
    the first power supply provides a first voltage and the second power supply provides a second voltage, the first voltage being different than the second voltage;
    a first pulse width is the period of time when the first switch is closed;
    a second pulse width is the period of time when the second switch is closed; and
    the product of the first voltage and the first pulse width is substantially equal to the product of the second voltage and the second pulse width.

12. The pulsing power supply according to claim 1, further comprising:
    a third switch electrically connected with the first lead of the primary winding and the power supply; and
    a fourth switch electrically connected with the second lead of the primary winding and the power supply.

13. The pulsing power supply according to claim 1, wherein the power supply provides voltage greater than 1 kV.

14. The pulsing power supply according to claim 1, wherein the power supply comprises an energy storage capacitor.

15. The pulsing power supply according to claim 1, wherein the first switch comprises a plurality of switches and the second switch comprises a plurality of switches.

16. A method comprising:
    closing a first switch for a first period of time for a pre-pulse, the first switch being electrically coupled with a power supply and a transformer;
    opening the first switch after the first period of time, wherein the first period of time is less than about 100 ns;
    closing the first switch for a second period of time, the second period of time being about 1,000% greater than the first period of time;
    opening the first switch after the second period of time;
    closing a second switch for a third period of time, the second switch being electrically coupled with the power supply and the transformer; and
    closing the second switch after the third period of time.

17. The method according to claim 16, wherein
    the power supply comprises a first power supply and a second power supply;
    the first switch is coupled with the first power supply producing a first voltage;
    the second switch is coupled with the second power supply producing a second voltage; and
    the product of the first voltage and the first period of time is substantially equal to the product of the second voltage and the second period of time.

18. The method according to claim 16, wherein the second switch is closed for less than about 60 nanoseconds after the first switch is opened.

19. A pulsing power supply comprising:
a DC power supply providing voltage greater than 2 kV;
a transformer comprising:
- a transformer core;
- a primary winding wrapped around at least a portion of the transformer core, the primary winding having a first lead and a second lead; and
- a secondary winding wrapped around at least a portion of the transformer core;

a plurality of switches arranged in a full-bridge arrangement, a first portion of the plurality of switches electrically connected with the first lead of the primary winding and the power supply; a second portion of the plurality of switches electrically connected with the second lead of the primary winding and the power supply, wherein the first portion of the plurality of switches and the second portion of the plurality of switches are opened and closed at different time intervals;

a dampening circuit electrically disposed between the first portion of the plurality of switches and/or the second portion of the plurality of switches and the transformer;

a pulsing output electrically coupled with the secondary winding of the transformer that outputs pulses having a voltage greater than about 2 kV and with pulse frequencies greater than 1 kHz.

20. The pulsing power supply according to claim 19, wherein the one or more resistors have a resistance less than about 100 ohms.

21. The pulsing power supply according to claim 19, wherein the dampening circuit comprises one or more diodes electrically coupled with the one or more resistors.

22. A plasma system comprising:
a plasma chamber; and
the pulsing power supply of claim 19, the pulsing output is electrically coupled with the plasma chamber.

23. The pulsing power supply according to claim 19, wherein the transformer includes a material comprising FeMnZn.

* * * * *